United States Patent
Danesh et al.

(10) Patent No.: US 11,430,830 B2
(45) Date of Patent: Aug. 30, 2022

(54) WHITE LIGHT EMITTING DIODE (LED) AND METHOD OF REPAIRING LIGHT EMITTING DEVICE USING SAME

(71) Applicant: GLO AB, Lund (SE)

(72) Inventors: Fariba Danesh, Los Altos Hills, CA (US); Zhen Chen, Dublin, CA (US)

(73) Assignee: NANOSYS, INC., Milpitas, CA (US)

( * ) Notice: Subject to any disclaimer, the term of this patent is extended or adjusted under 35 U.S.C. 154(b) by 13 days.

(21) Appl. No.: 16/837,350

(22) Filed: Apr. 1, 2020

(65) Prior Publication Data

US 2020/0321391 A1 Oct. 8, 2020

Related U.S. Application Data

(60) Provisional application No. 62/829,893, filed on Apr. 5, 2019.

(51) Int. Cl.
| | |
|---|---|
| *H01L 27/00* | (2006.01) |
| *H01L 33/06* | (2010.01) |
| *H05B 45/28* | (2020.01) |
| *H01L 27/15* | (2006.01) |
| *H05B 45/58* | (2020.01) |

(52) U.S. Cl.
CPC ............ *H01L 27/156* (2013.01); *H01L 33/06* (2013.01); *H05B 45/58* (2020.01)

(58) Field of Classification Search
CPC ... H01L 27/156; H01L 27/3211; H01L 27/15; H01L 27/3218; H01L 33/06; H01L 33/08; H01L 33/62; H01L 33/007; H01L 33/00; H01L 33/04; H01L 27/1214; H01L 27/3244; H01L 27/285; H01L 33/504; H01L 33/30; H01L 33/483; H05B 45/58;
(Continued)

(56) References Cited

U.S. PATENT DOCUMENTS

| | | | |
|---|---|---|---|
| 6,410,940 B1 * | 6/2002 | Jiang | B82Y 20/00 257/79 |
| 7,005,667 B2 * | 2/2006 | Chen | B82Y 20/00 257/103 |

(Continued)

FOREIGN PATENT DOCUMENTS

| | | |
|---|---|---|
| JP | 2006-140398 A | 6/2006 |
| JP | 2003-332633 A | 11/2013 |

(Continued)

OTHER PUBLICATIONS

Park et al., "Fundamental Limitations of Wide-Bandgap Semiconductors for Light-Emitting Diodes", 2018, vol. 3, pp. 655-662, Dec. 2018 (Year: 2018).*

(Continued)

*Primary Examiner* — Nikolay K Yushin
(74) *Attorney, Agent, or Firm* — The Marbury Law Group PLLC

(57) ABSTRACT

A white LED and a method of repairing a light emitting device including, the method including colored light emitting diodes (LEDs) configured to emit different colors of light and arranged in pixels on a backplane of the device, the method including: determining whether each pixel is a functional pixel or a defective pixel; and repairing the defective pixels by transferring white LEDs to the backplane in each defective pixel.

9 Claims, 49 Drawing Sheets

(58) Field of Classification Search
CPC ........ H05B 45/20; H05B 45/52; H05B 45/54; H05B 45/10
See application file for complete search history.

(56) References Cited

U.S. PATENT DOCUMENTS

| | | | |
|---|---|---|---|
| 7,436,870 B2* | 10/2008 | Ono | B82Y 20/00 372/43.01 |
| 8,058,663 B2* | 11/2011 | Fan | H01L 27/15 257/98 |
| 8,421,058 B2* | 4/2013 | Liu | H01L 33/04 257/15 |
| 9,831,228 B2* | 11/2017 | Yen | H01L 25/167 |
| 9,893,041 B2 | 2/2018 | Pokhriyal et al. | |
| 9,941,262 B2 | 4/2018 | Thompson | |
| 9,978,808 B2 | 5/2018 | Schneider, Jr. et al. | |
| 10,193,038 B2* | 1/2019 | Farrens | H01L 33/30 |
| 10,236,447 B2 | 3/2019 | Danesh et al. | |
| 10,530,125 B1* | 1/2020 | Venkatesan | G09G 3/3208 |
| 10,978,429 B2* | 4/2021 | Henley | H01L 21/67288 |
| 2005/0092980 A1* | 5/2005 | Chen | H01L 33/08 257/14 |
| 2005/0271104 A1* | 12/2005 | Ono | H01S 5/2231 372/43.01 |
| 2009/0078955 A1* | 3/2009 | Fan | H01L 27/15 257/98 |
| 2009/0278142 A1 | 11/2009 | Watanabe et al. | |
| 2010/0186883 A1 | 7/2010 | Tomoda | |
| 2011/0284824 A1* | 11/2011 | Liu | H01L 33/04 257/13 |
| 2013/0285086 A1 | 10/2013 | Hu et al. | |
| 2014/0267683 A1 | 9/2014 | Bibl et al. | |
| 2015/0111329 A1 | 4/2015 | Wu et al. | |
| 2016/0064363 A1 | 3/2016 | Bower et al. | |
| 2016/0093600 A1 | 3/2016 | Bower et al. | |
| 2016/0093665 A1 | 3/2016 | Schubert et al. | |
| 2017/0162552 A1 | 6/2017 | Thompson | |
| 2017/0170160 A1* | 6/2017 | Yen | H01L 25/167 |
| 2017/0227816 A1 | 8/2017 | Jansen et al. | |
| 2017/0236811 A1 | 8/2017 | Pokhriyal et al. | |
| 2017/0288102 A1* | 10/2017 | Farrens | H01L 33/0093 |
| 2017/0301660 A1 | 10/2017 | Pokhriyal et al. | |
| 2017/0323925 A1 | 11/2017 | Schneider, Jr. et al. | |
| 2017/0346011 A1 | 11/2017 | Danesh et al. | |
| 2018/0069149 A1 | 3/2018 | Zou et al. | |
| 2018/0374829 A1* | 12/2018 | Henley | H01L 21/67288 |

FOREIGN PATENT DOCUMENTS

| | | |
|---|---|---|
| KR | 10-0862543 | 10/2008 |
| WO | WO2014-149864 A1 | 9/2014 |
| WO | WO2016-022824 A1 | 2/2016 |
| WO | WO2016-100657 A2 | 6/2016 |
| WO | WO2016-100662 A1 | 6/2016 |

OTHER PUBLICATIONS

Nakamura, III-V Nitride Based Light-Emitting Devices, 1997, Solid State Communications, vol. 102, No. 2-3, pp. 231-248, 1997 (Year: 1997).*
International Search Report and Written Opinion of the International Searching Authority for International Patent Application No. PCT/US2017/017830, dated May 23, 2017, 12 pages.
International Search Report and Written Opinion of the International Searching Authority for International Patent Application No. PCT/US2017/033032, dated Aug. 31, 2017, 11 pages.
International Preliminary Report on Patentability and Written Opinion of the International Searching Authority for International Patent Application No. PCT/US2017/033032, dated Dec. 6, 2018, 8 pages.
U.S. Appl. No. 16/252,905, filed Jan. 21, 2019, GLO AB.

* cited by examiner

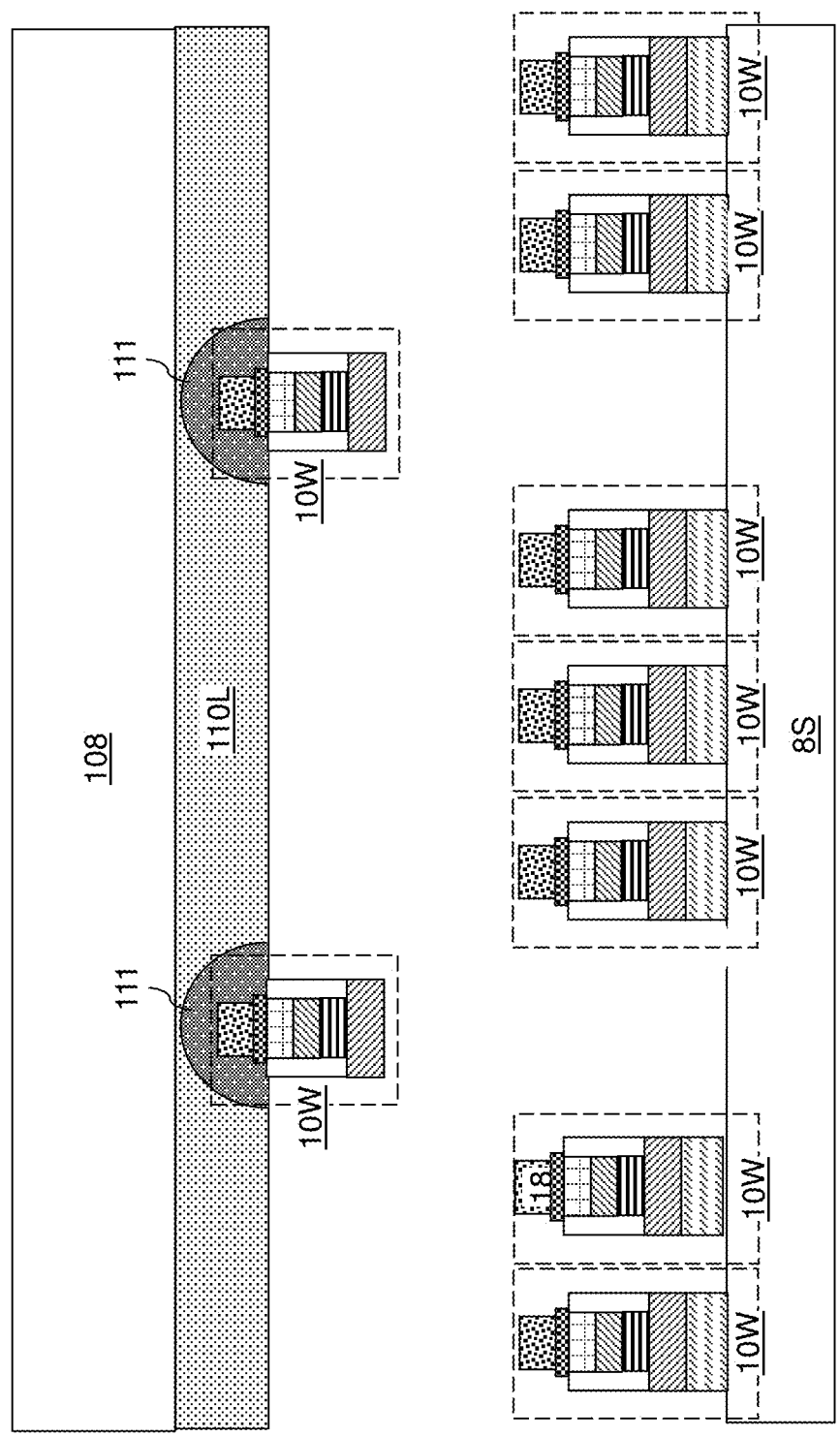

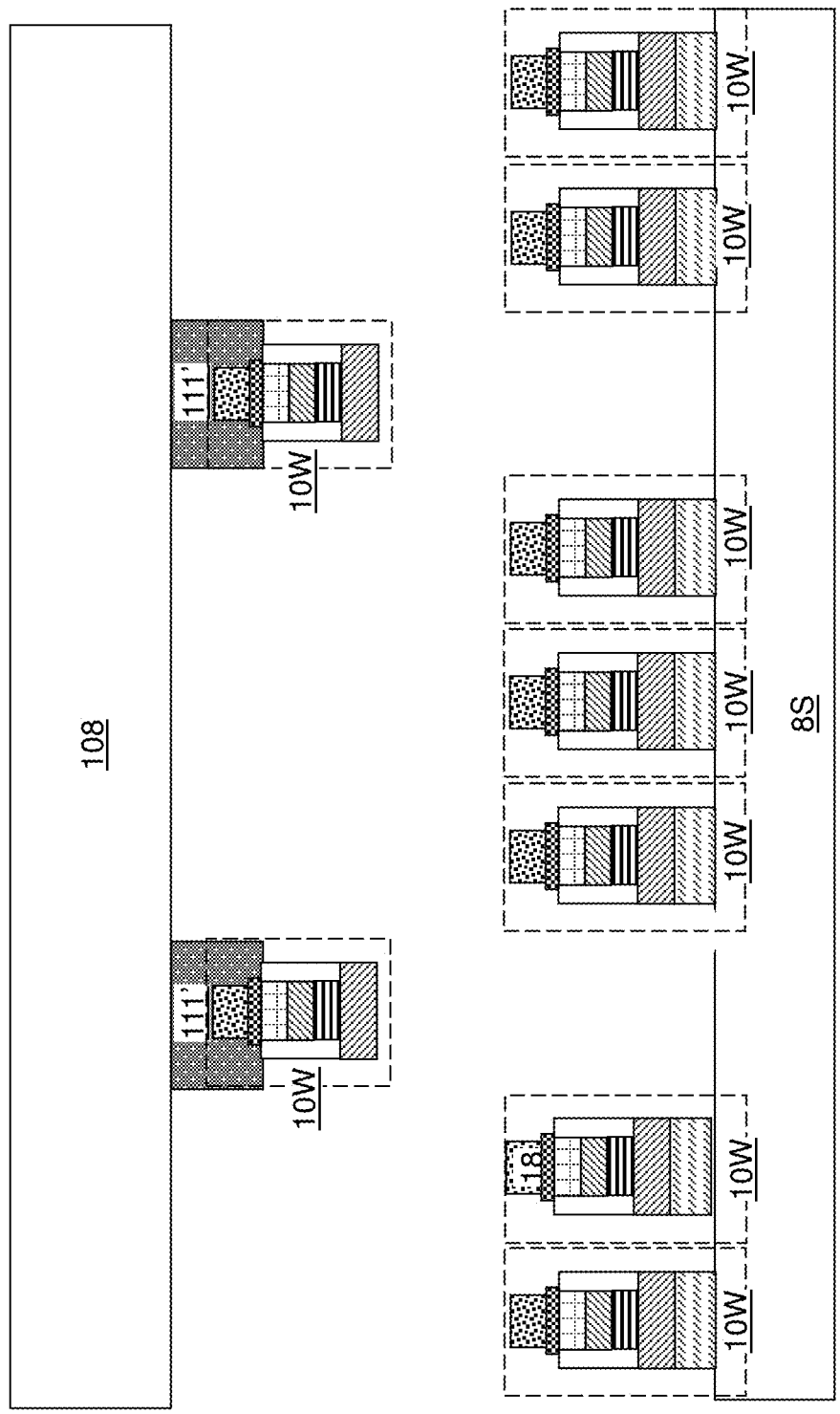

WHITE LIGHT EMITTING DIODE (LED) AND METHOD OF REPAIRING LIGHT EMITTING DEVICE USING SAME

FIELD

The embodiments of the invention are directed generally to white LEDs and methods of repairing light emitting devices using white LEDs.

BACKGROUND

Light emitting devices are used in electronic displays, such as liquid crystal displays in laptops or LED televisions. Light emitting devices, such as LEDs (LEDs) and various other types of electronic devices configured to emit light. A microLED refers to a LED having lateral dimensions that do not exceed 1 mm. A microLED has a typical lateral dimension in a range from 1 microns to 100 microns. An array of microLEDs can form an individual pixels. A direct view display device can include an array of pixels, each of which includes at least one microLED, which is typically an array of microLEDs.

A functional direct view display device requires functionality of all pixels therein. In case the direct view display device includes an array of microLED's, each of the microLED's needs to be functional in order for the direct view display device to be fully functional. A challenge for manufacture of a direct view display device employing microLED's is successful transfer of all microLED's required for the direct view display device. While progress is being made in increasing the yield of the microLED transfer process to a backplane, a high fraction of microLED transfer processes generate imperfect direct view display devices in which at least one microLED failed to transfer to the backplane. In view of the above, a process is desired to for repairing an imperfect direct view display device in which at least one microLED failed to transfer to the backplane during a preceding manufacturing process.

SUMMARY

According to various embodiments of the present disclosure, provided is method of repairing a light emitting device comprising colored light emitting diodes (LEDs) configured to emit different colors of light and arranged in pixels on a backplane, the method comprising: determining whether each pixel is a functional pixel or a defective pixel; and repairing the defective pixels by transferring a white LED to the backplane in each defective pixel.

According to various embodiments of the present disclosure, provided is a white light emitting diode (LED) comprising: a substrate; n-doped compounds semiconductor material layer disposed on the substrate, a p-doped compound semiconductor material layer disposed on the substrate; and an active region disposed between the n-doped and p-doped compound semiconductor layers, the active region comprising quantum wells configured to respectively emit at least one of red, green, or blue light, wherein the white LED does not comprise a color conversion material.

BRIEF DESCRIPTION OF THE DRAWINGS

FIG. 18B illustrates the assembly of the first carrier substrate, the selectively laser-bonded temporary adhesive portions embedded in the temporary adhesive layer, and the repair LEDs after detachment from the first repair source substrate according to an embodiment of the present disclosure.

FIG. 18C illustrates the assembly of the first carrier substrate, the discrete thermally-cured temporary adhesive portions, and the repair LEDs after detachment from the first repair source substrate according to an embodiment of the present disclosure.

DETAILED DESCRIPTION

Figure 1:
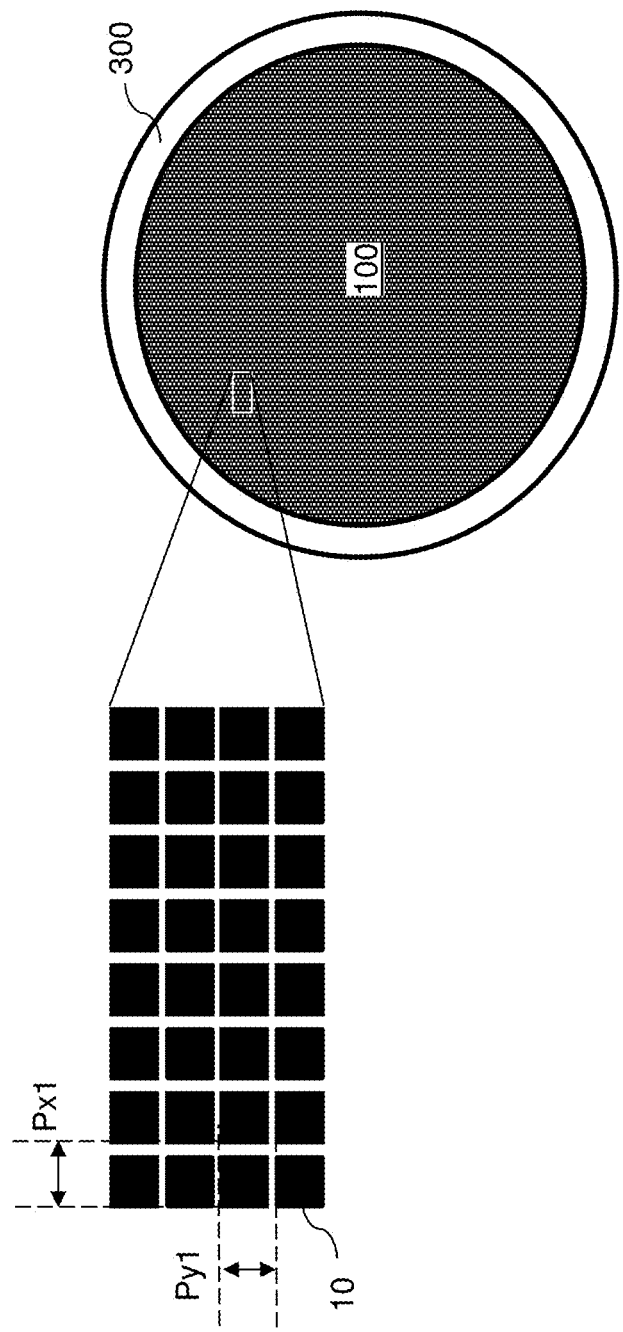
FIG. 1 schematically illustrates a substrate including dies of light emitting devices according to an embodiment of the present disclosure.

As stated above, the present disclosure is directed to a pixel repair method for a direct view display device, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting device (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a carrier structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate can be any substrate on which formation of multiple types of devices in any configuration is desired. In an illustrative example, the target substrate can be a backplane substrate such as an active or passive matrix backplane substrate for driving light emitting devices. As used herein, a "backplane" or a "backplane substrate" refers to any substrate configured to affix multiple devices thereupon. In one embodiment, the center-to-center spacing of neighboring light emitting devices on the backplane substrate can be is an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Devices of a same type can be fabricated on respective initial growth substrates. As used herein, an "initial growth substrate" refers to a substrate that is processed to form devices thereupon or therein. The devices can include light emitting devices and/or sensor devices (e.g., photodetectors) and/or any other electronic devices. The light emitting devices can be any type of light emitting devices, i.e., vertical LEDs, lateral LEDs, or any combination thereof. Devices of the same type can be formed on each initial growth substrate, the types being different from one initial growth substrate to another. The devices can be formed as an array on the respective initial growth substrates.

Utilization of a high percentage of light emitting devices as manufactured on an initial growth substrate for incorporation into backplanes is an essential component of economically manufacturing a direct view light emitting device assembly. Generally, a light emitting device assembly provides a rectangular viewing area, while initial growth substrates typically have circular device areas. After transfer of light emitting devices from a rectangular region of an initial growth substrate to a backplane, a circular substrate can have unutilized region from which devices are not transferred. Methods of the present disclosure provide methods for utilizing the complement of a rectangular center area of an initial growth substrate, or in case devices are transferred to a transfer substrate, for utilizing the complement of a rectangular center area of a transfer substrate.

The methods of the present disclosure employ one of more of the following methods. In some embodiments, dies (i.e., instances of a light emitting device) can be transferred to a temporary support system and placed on a backplane one by one. In some embodiments, defect maps can be supplied to a temporary repair template substrate, and can be attached to a backplane in parallel. In some embodiment, local area replacement or patterned pixel transfer can be employed.

Referring to FIG. 1, a substrate including dies of LEDs 10 is illustrated. The substrate may include an edge exclusion region 300 at a periphery, in which devices are not formed. The substrate can include light emitting devices of a same type (which is herein referred to as first type) arranged in a first array configuration. The light emitting devices of the first type are multiple instances of the same device, which may be, for example, light emitting devices that emit light at a same peak wavelength. For example, the light emitting devices of the first type may be red light emitting devices, green light emitting devices, or blue light emitting devices.

The first array configuration has a primary-direction pitch Px1 along a respective primary direction (i.e., the primary direction of the first array configuration) and has a secondary-direction pitch Py1 along a respective secondary direction (i.e., the secondary direction of the first array configuration). As used herein, a primary direction and a second direction of an array configuration refer to two directions along which a unit cell of the array configuration is repeated. In a rectangular array configuration, the primary direction and the second direction may be perpendicular to each other, and are referred to as an x-direction and a y-direction.

The LEDs 10 on the substrate can be transferred to multiple backplanes having bonding sites in the second array configuration. A predetermined transfer pattern and a predetermined transfer sequence can be employed for transfer of the LEDs 10. Light emitting devices of different types provided from additional substrates can be employed in conjunction with the LEDs 10 from the substrate to provide a functional direct view light emitting device assembly.

Referring to FIGS. 2A-2E, an exemplary transfer pattern and an exemplary transfer sequence are illustrated for transferring three different types of devices (10B, 10G, 10R) (e.g., blue, green and red emitting LEDs, respectively) to four backplanes (BP1, BP2, BP3, BP4). The three different types of devices (10B, 10G, 10R) can be provided on three source substrates (B, G, R), which can comprise three transfer substrates, or three growth substrates, or combinations thereof. The first LEDs 10B can be provided on the first source substrate B, the second LEDs 10G can be provided on the second source substrate G, and the third LEDs 10R can be provided on the third source substrate R.

Figure 2A:
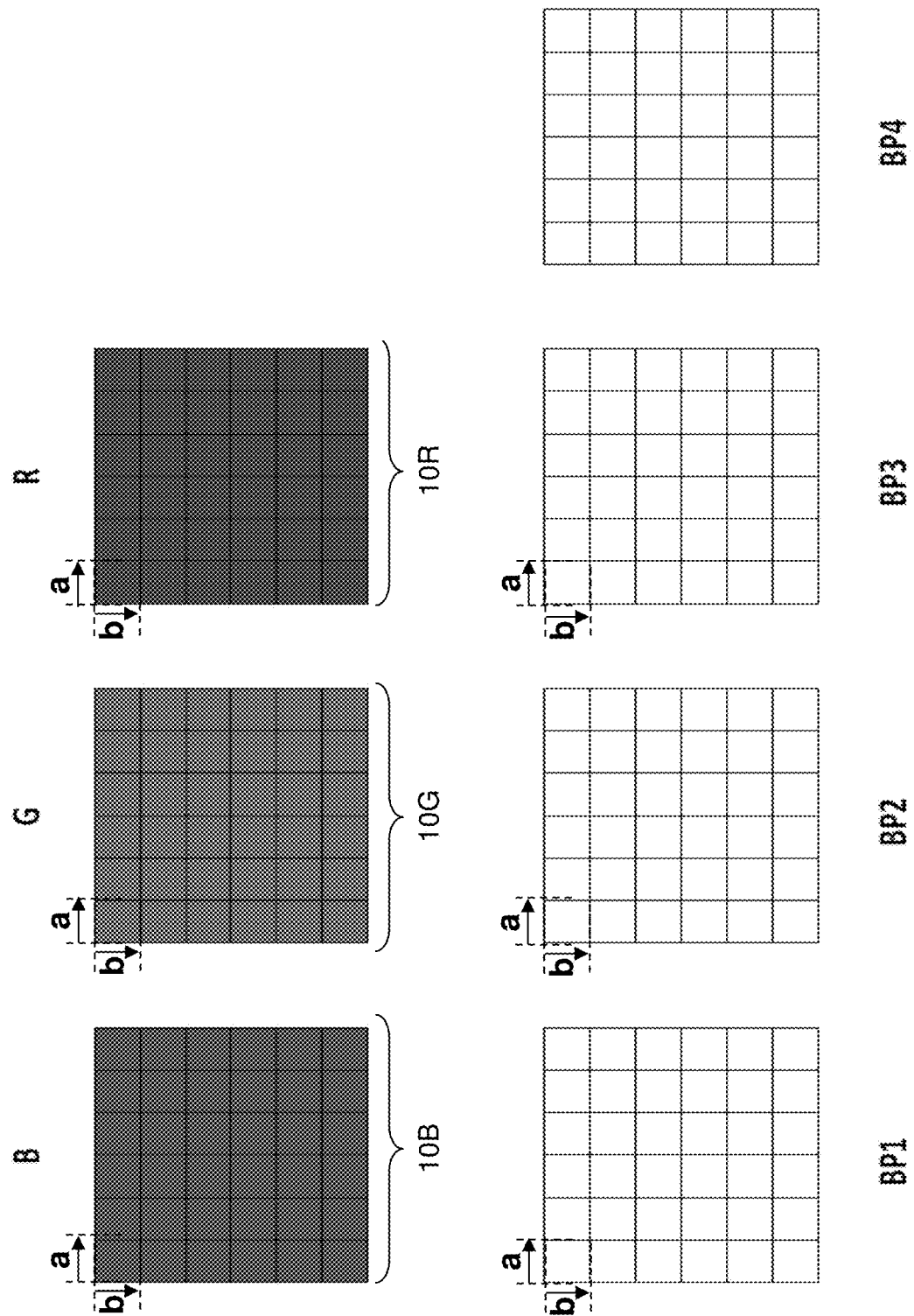
FIGS. 2A-2E are a schematic sequence for transfer of light emitting devices according to the exemplary transfer pattern illustrated in FIG. 1.
Figure 2B:
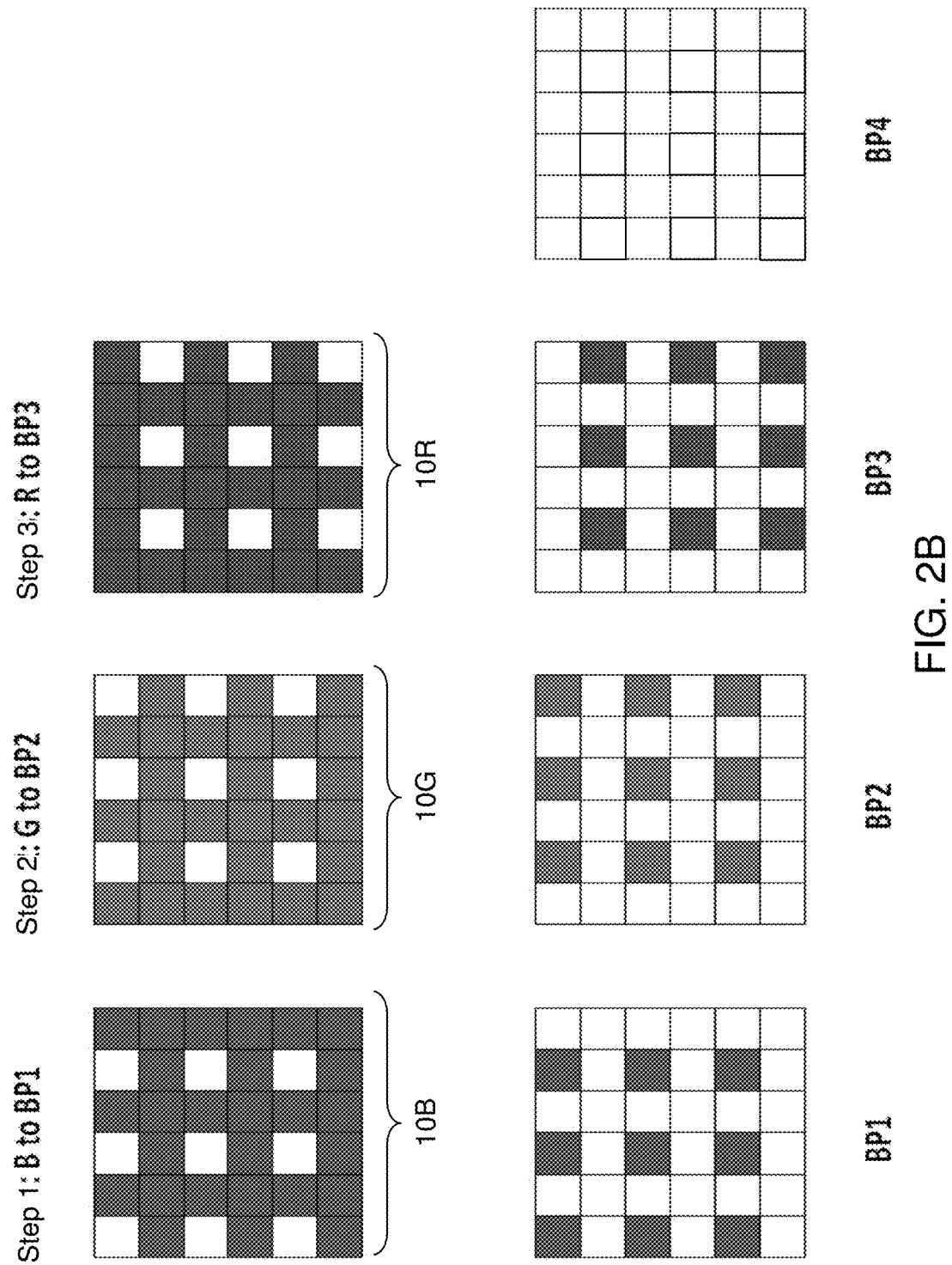
Figure 2C:
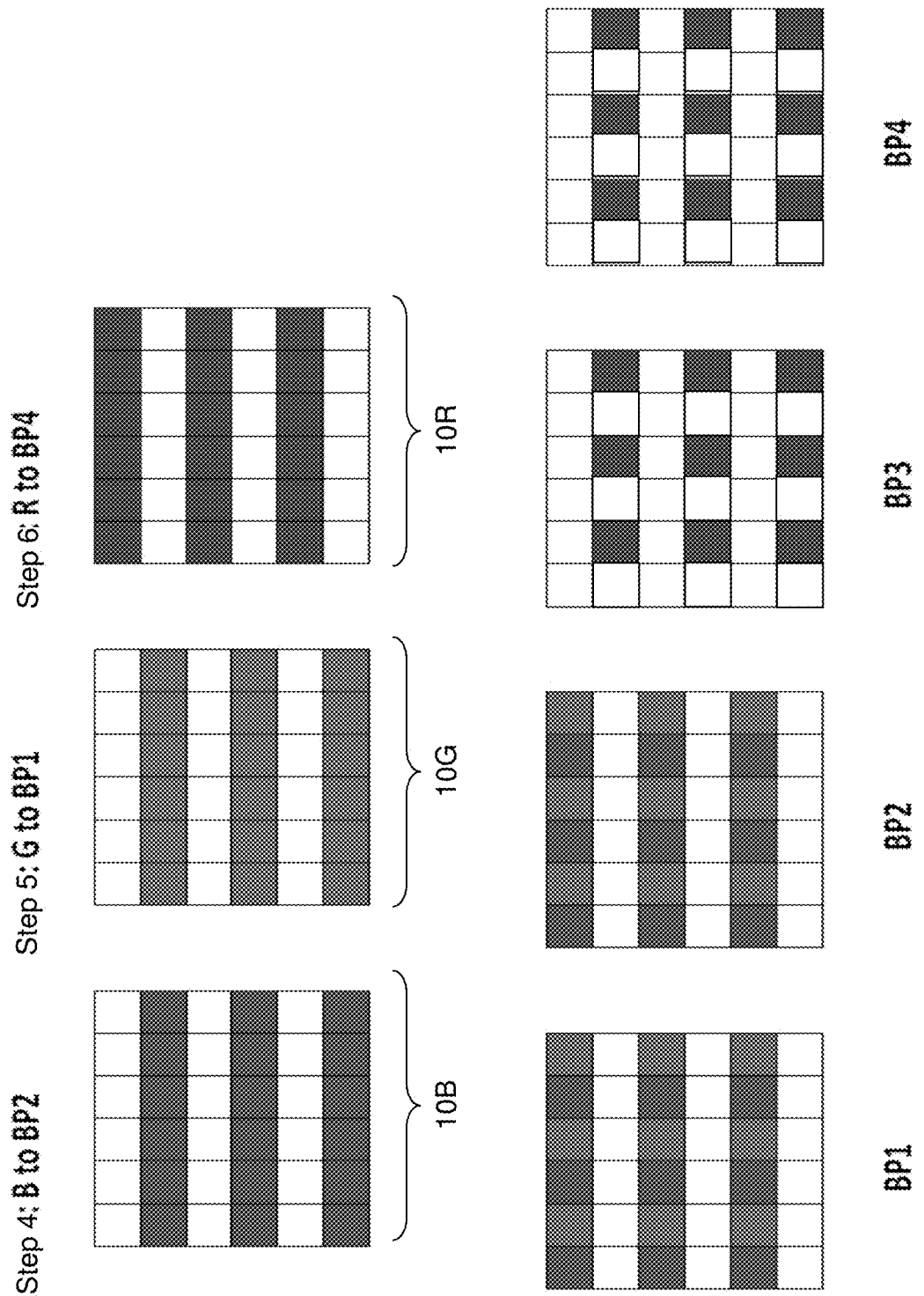
Figure 2D:
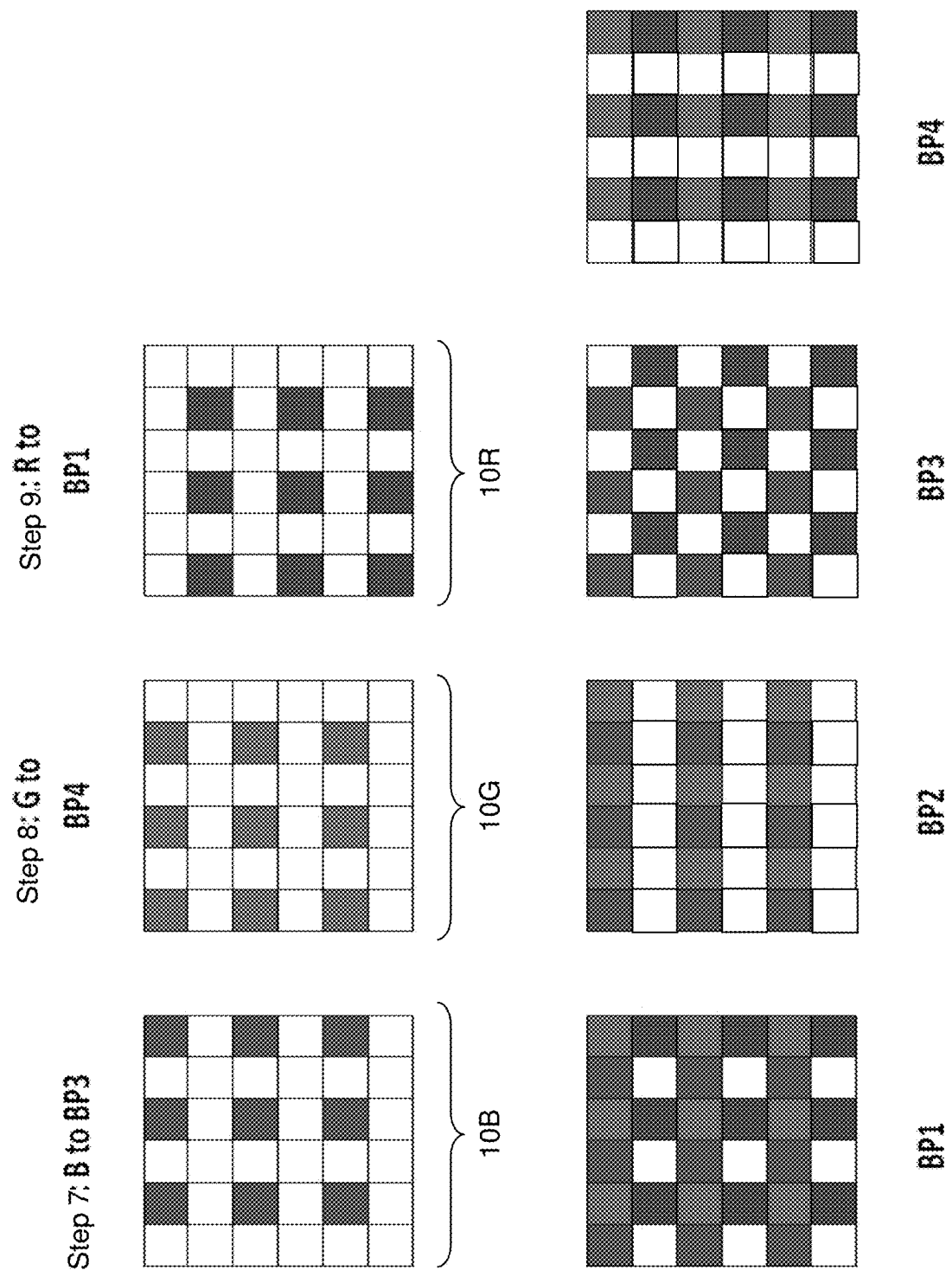
Figure 2E:
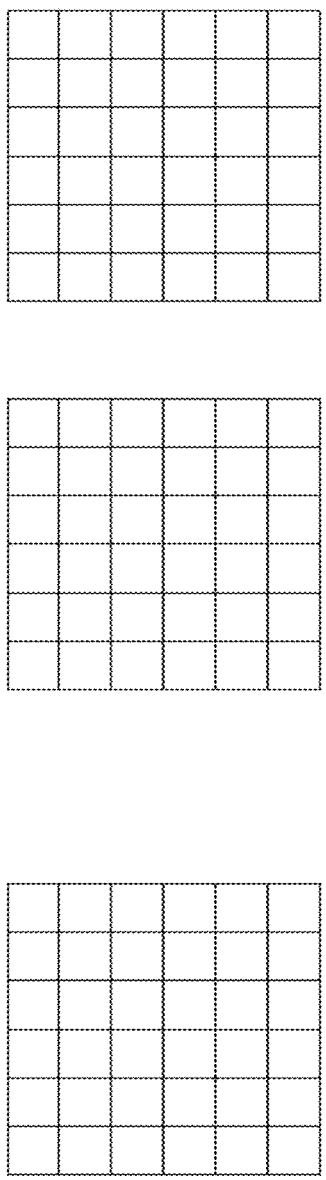
Figure 2E:
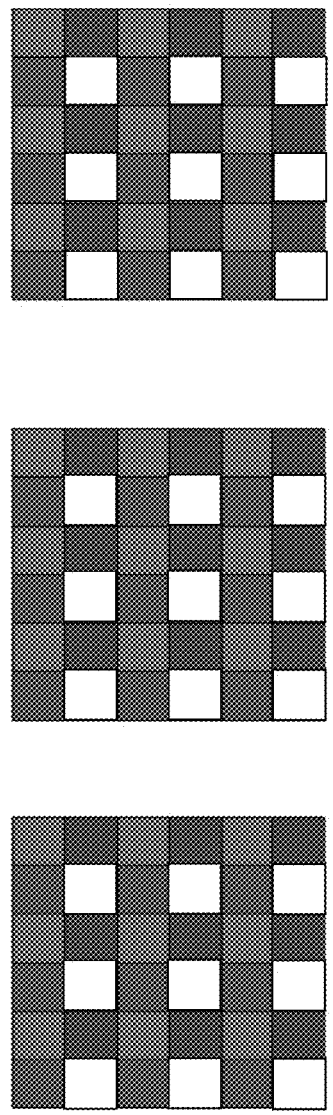

Changes in the presence or absence of the various devices (10B, 10G, 10R) on the source substrates (B, G, R) and the backplanes (BP1, BP2, BP3, BP4) at each step of the transfer sequence are illustrated in FIGS. 2A-2E. FIG. 2A corresponds to a configuration prior to any transfer of the devices (10B, 10G, 10R), FIG. 2B corresponds to the configuration after performing transfer steps 1-3, FIG. 2C corresponds to the configuration after performing steps 4-6, FIG. 2D corresponds to the configuration after performing steps 7-9, and FIG. 2E corresponds to the configuration after performing steps 10-12. It should be noted that steps 1-3 as illustrated in FIG. 2B may be shuffled in any order because steps 1-3 are independent of one another, steps 4-6 as illustrated in FIG. 2C may be shuffled in any order because steps 4-6 are independent of one another, steps 7-9 as illustrated in FIG. 2D may be shuffled in any order because steps 7-9 are independent of one another, and steps 10-12 as illustrated in FIG. 2E may be shuffled in any order because steps 10-12 are independent of one another.

While the exemplary transfer pattern and the exemplary transfer sequence is illustrated for cases in which four source substrates (B, G, R) and four backplanes (BP1, BP2, BP3, BP4) are employed, the method of the present disclosure can be applied to any case in which m transfer assemblies and n backplanes are employed, in which m is an integer greater than 1, n is an integer greater than 1, and n is not less than m. The n backplanes bond with devices from the m transfer assemblies to form n integrated light emitting device assemblies. In one embodiment, n can be the same as, or greater than, m.

A plurality of transfer assemblies, e.g., m transfer assemblies, is provided. Each of the m transfer assemblies comprises a respective source substrate (R, G, B) and respective devices (10B, 10G, 10R) within a two-dimensional array having a same two-dimensional periodicity. As used herein, a same two-dimensional periodicity for multiple structures refers to a configuration in which each of the multiple structures has a respective unit structure and instances of the respective unit structure are repeated along two independent directions of periodicity (e.g., a first periodicity direction and a second periodicity direction), and the unit structures are repeated along the respective first periodicity direction with a same first pitch and are repeated along the respective second periodicity direction with a same second pitch for all of the multiple structures, and the angle between the first periodicity direction and the second periodicity direction is the same for all of the multiple structures. Each of the n backplanes has a periodic repetition of respective unit conductive bonding structures pattern configured to mount m types of devices.

Each of the m types of devices can be one of the devices within a respective transfer assembly among the m transfer assemblies. The pitches of each unit conductive bonding structures pattern along two independent directions within each of the n backplanes can be multiples of a respective pitch of the two-dimensional periodicity of the devices within each of the m transfer assemblies. In an illustrative example, each of the devices (10B, 10G, 10R) can be periodic within a respective transfer assembly with the first periodicity of a along a first direction, and with the second periodicity of b along a second direction (which may be perpendicular to the first direction). The unit conductive bond pad pattern within each of the backplanes can have the first periodicity of 2a (which is an integer multiple of a) along a first direction, and with the second periodicity of 2b (which is an integer multiple of b) along a second direction (which may be perpendicular to the first direction).

Subsets of devices (10B, 10G, 10R) from each of the m transfer assemblies can be sequentially transferred to a respective backplane (BP1, BP2, BP3, BP4) among the n backplanes by disposing each respective transfer assembly over the respective backplane (BP1, BP2, BP3, BP4) at locations that preclude collision of existing devices on the respective transfer assembly with any devices (10B, 10G, 10R), if any, that are previously bonded to the respective backplane (BP1, BP2, BP3, BP4).

In one embodiment, a unit cell U1 or pixel of the second array configuration of the light emitting device assembly can be defined by a rectangle having a first pair of sides having a first length of the second primary-direction pitch Px2 along a respective primary direction and having a second pair of sides having a second length of the second secondary-direction pitch Py2 along a respective secondary direction. In one embodiment, the unit cell U1 can include a first-type LED 10R (which may be a red light emitting device), a second-type LED 10G (which may be a green light emitting device), a third-type LED 10B (which may be a blue light emitting device), and a respective empty site 10E configured to accommodate a respective repair light emitting device.

If each of the first, second, and third-type light emitting devices (10R, 10G, 10B) of a pixel is functional, such a pixel is a functional pixel, and attachment of any repair light emitting device to the pixel is not necessary. If any of the first, second, and third-type light emitting devices (10R, 10G, 10B) of a pixel is defective, i.e., non-functional, such a pixel is a defective, i.e., non-functional pixel, and attachment of a repair light emitting device to the pixel is necessary to repair the pixel. In this case, the empty site 10E of such a defective pixel is employed to attach a repair light emitting device. Each empty site 10E of the defective pixels is a repair site to which a repair light emitting device may be attached.

In general, the light emitting device assembly includes a backplane and instances of light emitting devices of the first type at bonding sites in the second array configuration. Repair sites can be identified for any given light emitting device assembly, which may be formed employing the light emitting devices from the substrate including the base pitch region 100, and/or employing light emitting devices from additional substrates. In one embodiment, a first set of repair sites can be defined based on the functionality of one type of light emitting devices, e.g., light emitting devices of the first type. Each of the first set of repair sites can be an empty site 10E configured to accommodate a respective repair light emitting device. Each of the first set of repair sites can be located within a pixel including a defective instance of the light emitting device of the first type.

Figure 3A:
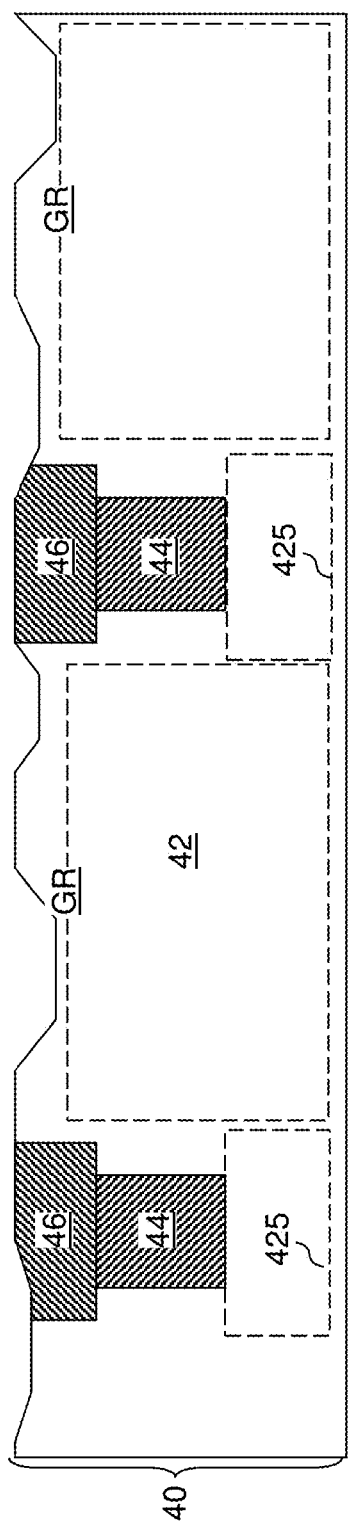
FIG. 3A is a vertical cross-sectional view of an exemplary structure for formation of a light emitting device that includes a backplane according to an embodiment of the present disclosure.
Figure 3B:
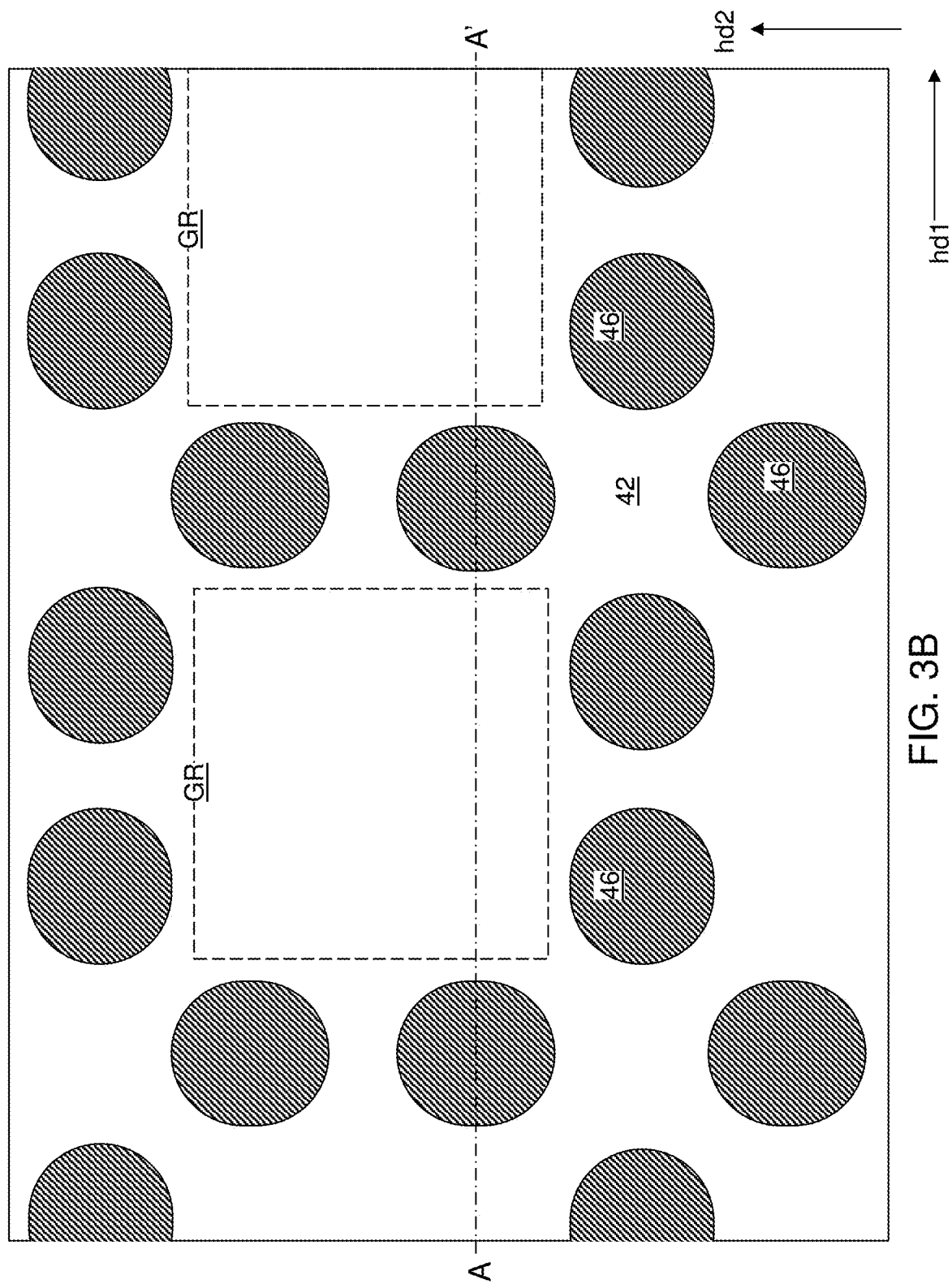
FIG. 3B is a top-down view of the exemplary structure of FIG. 3A.

Referring to FIGS. 3A and 3B, a backplane 40 is provided, which can be employed as any of the four backplanes (BP1, BP2, BP3, BP4) described above. The backplane 40 includes the substrate 42 containing metal interconnect structures (46, 44, 425) located on the substrate 42 and/or embedded within the substrate 42. The substrate 42 can be optically transparent or optically opaque. As used herein, an "optically transparent" element or a "transparent" element refers to an element that transmits at least 50% of light over more than 90% of the visible spectrum range, i.e., the wavelength range from 400 nm to 800 nm. If the substrate 42 is optically transparent then it may transmit more than 50% of light at the wavelength of an optional laser beam to be subsequently employed to induce reflow of solder materials in a bonding process, if a laser reflow process is used.

In one embodiment, the substrate 42 can include a first dielectric material having a first elastic modulus, i.e., a first Young's modulus. In one embodiment, the substrate 42 can include any dielectric material that can be employed to provide a printed circuit board (PCB) as known in the art. In one embodiment, the metal interconnect structures (46, 44, 425) can be laid out on and/or within the substrate 42 to provide gap regions GR in which the metal interconnect structures (46, 44, 425) are not present. In one embodiment, the gap regions GR can be arranged as a periodic two-dimensional array. The pitch of the gap regions GR along a first horizontal direction hd1 can be an integer M times the primary-direction pitch Px1 of the LEDs 10 described above, and the pitch of gap regions GR along a second horizontal direction hd2 can be an integer M times the secondary-direction pitch Py1 of the LEDs 10 described above.

The metal interconnect structures (46, 44, 425) are arranged to provide electrically conductive paths to the light emitting devices to be subsequently attached to the front side of the backplane 40. In an illustrative example, the metal interconnect structures (46, 44, 425) can include an array of conductive via structures 46 having physically exposed surfaces on the front side of the backplane 40. Further, the metal interconnect structures (46, 44, 425) can include metal lines 44 that extend horizontally to provide lateral electrical connection between a respective conductive via structures 46 and additional metal interconnect structures 425, which may include additional metal via structures, additional metal line structures, and/or conductive traces. In one embodiment, physically exposed components of the metal interconnect structures (46, 44, 425), such as the conductive via structures 46, can be arranged as a two-dimensional periodic array having the same two-dimensional periodicity as the two-dimensional array of gap regions GR.

The backplane 40 can have a non-planar top surface that can be caused by intentionally formed local dimples and/or protrusions and/or caused by unintentional distortion such as bowing, bending, and/or arching of the substrate 42. Such a non-planar top surface causes physically exposed surfaces of the conductive via structures 46 to be located at different levels and/or to have tilted top surfaces. Bonding light emitting devices on vertically offset surfaces and/or tilted physically exposed surfaces of the conductive via structures 46 can result in degradation of quality of bonding, and may induce electrical opens and/or other structural defects. According to an embodiment of the present disclosure, additional structures are formed over the backplane 40 prior to bonding the light emitting devices to provide horizontal bonding surfaces located within a same two-dimensional, substantially horizontal plane. As used herein, a "two-dimensional" plane refers to a Euclidean plane and excludes Riemannian (curved) planes.

Figure 4:
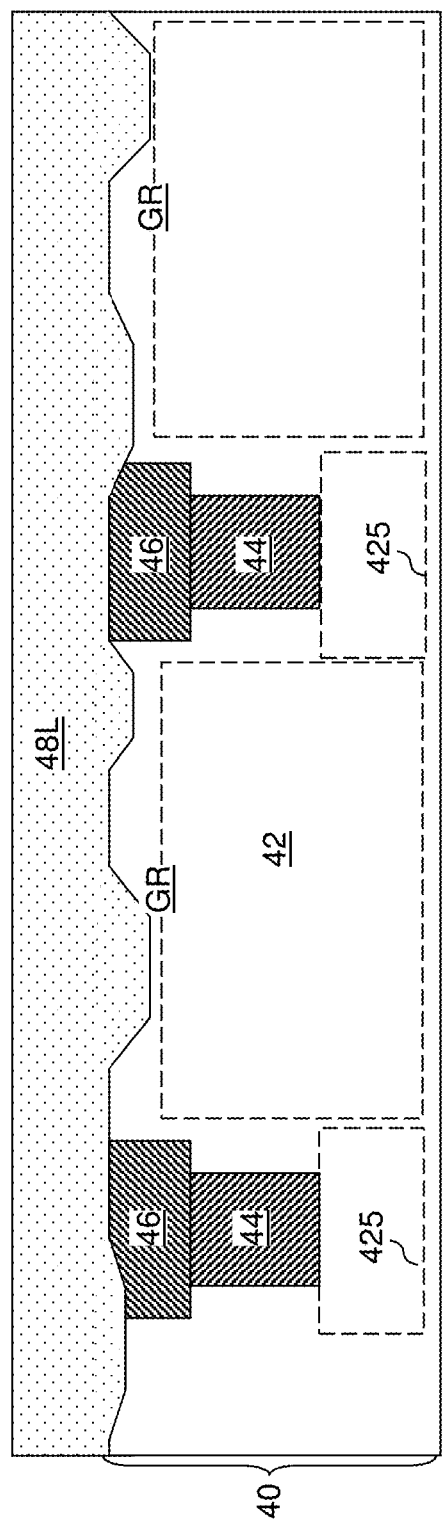
FIG. 4 is a vertical cross-sectional view of the exemplary structure after formation of a continuous insulating material layer over the backplane according to an embodiment of the present disclosure.

Referring to FIG. 4, a second dielectric material having a second elastic modulus is formed over the backplane 40 as a continuous insulating material layer 48L. The second dielectric material can be an optically transparent or opaque material, and can have an elastic modulus that is less than the first elastic modulus. For example, the second elastic modulus can be less than 80% of the first elastic modulus, and may be in a range from 1% to 60% of the first elastic modulus to provide an increased level of elasticity to bonding pads during a subsequent bonding process. For example, the second insulating material layer 48L can include, and/or can consist essentially of, an epoxy based polymer, such as SU-8 negative photoresist material, a silicone-based polymer material, a benzocyclobutene-based (BCB) polymer, or other organic polymer materials. In one embodiment, the second insulating material layer 48L can include a self-planarizing polymer material that can be applied and cured to provide a planar top surface that extends over the entirety of the non-planar top surface of the backplane 40. The thickness of the continuous insulating material layer 48L can be in a range from 200 nm to 20 microns, although lesser and greater thicknesses can also be employed.

Figure 5A:
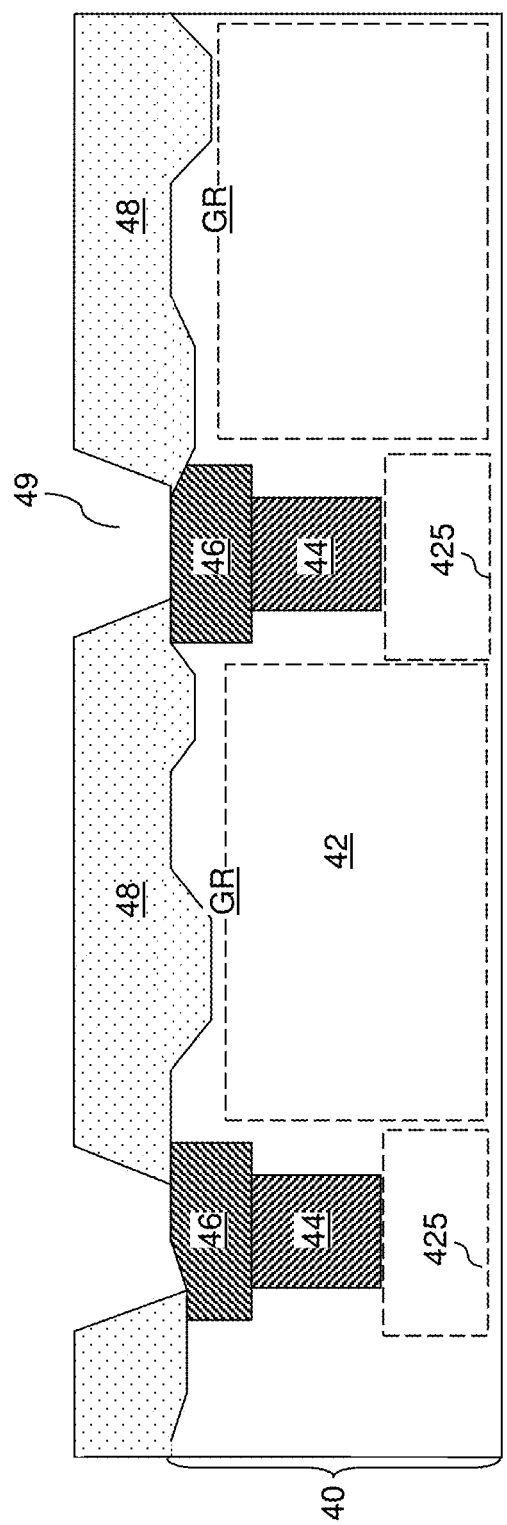
FIG. 5A is a vertical cross-sectional view of the exemplary structure after formation of insulating material portions by patterning the continuous insulating material layer according to first and second embodiments of the present disclosure.
Figure 5B:
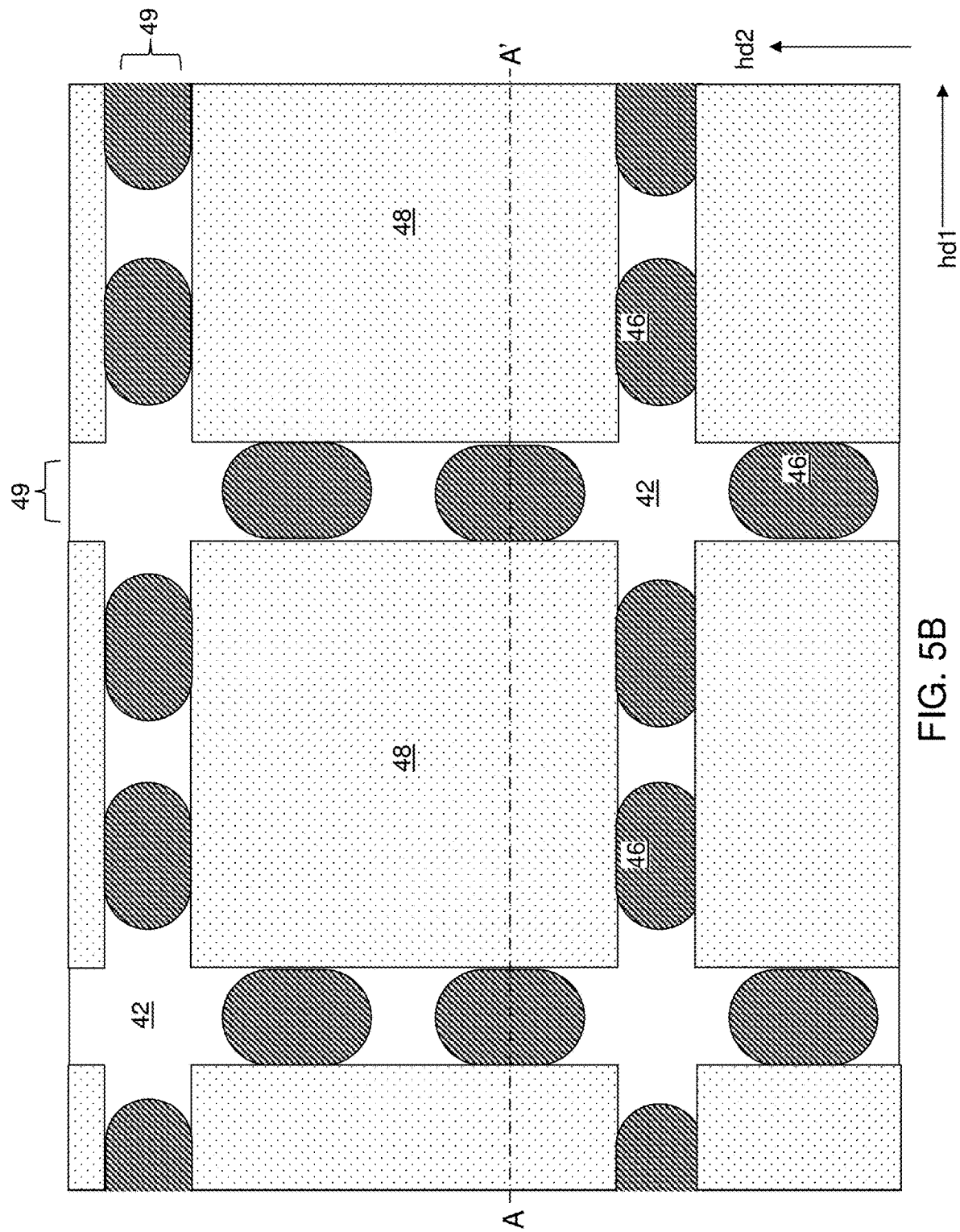
FIG. 5B is a top-down view of the exemplary structure of FIG. 5A according to the first embodiment of the present disclosure.
Figure 5C:
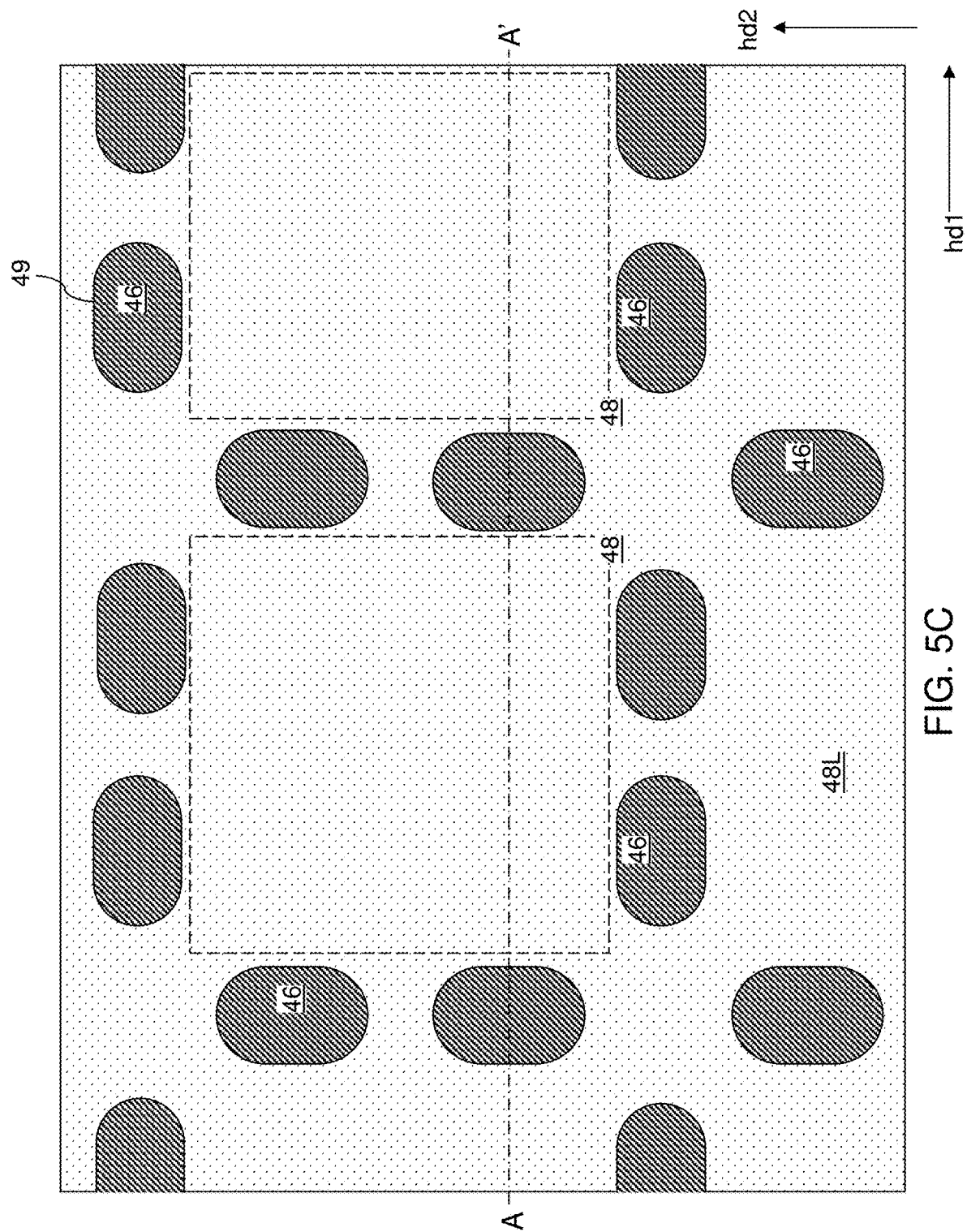
FIG. 5C is a top-down view of the exemplary structure of FIG. 5A according to the second embodiment of the present disclosure.

Referring to FIGS. 5A-5C, the continuous insulating material layer 48L can be patterned to form at least one opening therethrough. FIG. 5A is a vertical cross-sectional view that is the same for a first embodiment and a second embodiment, FIG. 5B is a top-down view for the first embodiment, and FIG. 5C is a top-down view for a second embodiment. For example, a photoresist layer (not shown) can be applied over the continuous insulating material layer 48L, and can be lithographically patterned to form at least one opening therein. The pattern of the openings is selected such that each area of the gap region GR is completely covered by the patterned photoresist layer. An etch process can be performed to remove portions of the continuous insulating material layer 48L that are not covered by the patterned photoresist layer. The etch process can be an isotropic etch process (such as a wet etch process), or can be an anisotropic etch process (such as a reactive ion etch process). The continuous insulating material layer 48L is patterned by the etch process to provide insulating material portions 48. Each insulating material portion 48 overlies a respective gap region GR, and may laterally extend further to cover peripheral areas that laterally surround the respective gap region GR. The photoresist layer can be subsequently removed, for example, by ashing.

In the first embodiment illustrated in FIGS. 5A and 5B, the at least one opening through the photoresist layer, and consequently, the at least one opening 49 that is formed through the continuous insulating material layer 48L may include a first set of line trenches laterally extending along the first horizontal direction hd1 and a second set of line trenches laterally extending along the second horizontal direction hd2. The second horizontal direction hd2 can be perpendicular to the first horizontal direction hd1, and the areas of the first set of line trenches and the second set of line trenches can be selected not to include any of the areas of the gap regions GR. In this case, the insulating material portions 48 may be formed as a two-dimensional array of insulating mesa structures each having a horizontal top surface such that all the horizontal top surfaces of the insulating material portions 48 are within a same horizontal plane. Top surfaces of the underlying metal interconnect structures (46, 44, 425) can be physically exposed between neighboring pairs of the insulating material portions 48. The insulating material portions 48 are arranged as a two-dimensional array of insulating mesa structures not directly contacting one another and having a same two-dimensional periodicity as the two-dimensional array of gap regions GR. The insulating material portions 48 may have tapered sidewalls or vertical sidewalls.

In the second embodiment illustrated in FIGS. 5A and 5C, the at least one opening through the photoresist layer, and consequently, the at least one opening 49 that is formed through the continuous insulating material layer 48L may include discrete openings 49 that overlie a respective one of the conductive via structures 46. A center portion of the top surface of each conductive via structure 46 can be physically exposed underneath each discrete opening through the continuous insulating material layer 48L. In this case, the insulating material portions 48 may be formed portions of the continuous insulating material layer 48L that overlie the gap regions GR. In other words, the areas of the gap regions GR can define the areas of the insulating material portions 48, which can be continuously connected to other insulating material portions 48 within the continuous insulating material layer 48L. The planar horizontal surface regions of the insulating material portions 48 are within the same horizontal plane. Top surfaces of the underlying metal interconnect structures (46, 44, 425) can be physically exposed between neighboring pairs of the insulating material portions 48. Each opening in the continuous insulating metal layer 48L may have tapered sidewalls or vertical sidewalls.

Figure 6A:
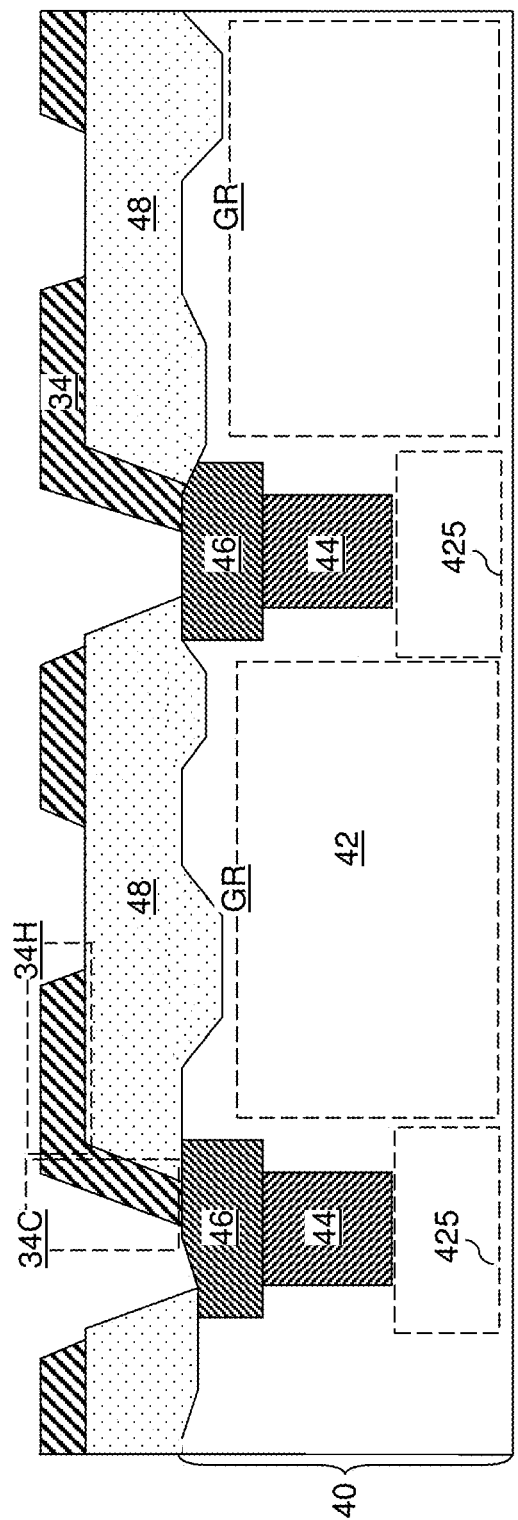
FIG. 6A is a vertical cross-sectional view of the exemplary structure after formation of a two-dimensional array of metal plate clusters according to the first and second embodiments of the present disclosure.
Figure 6B:
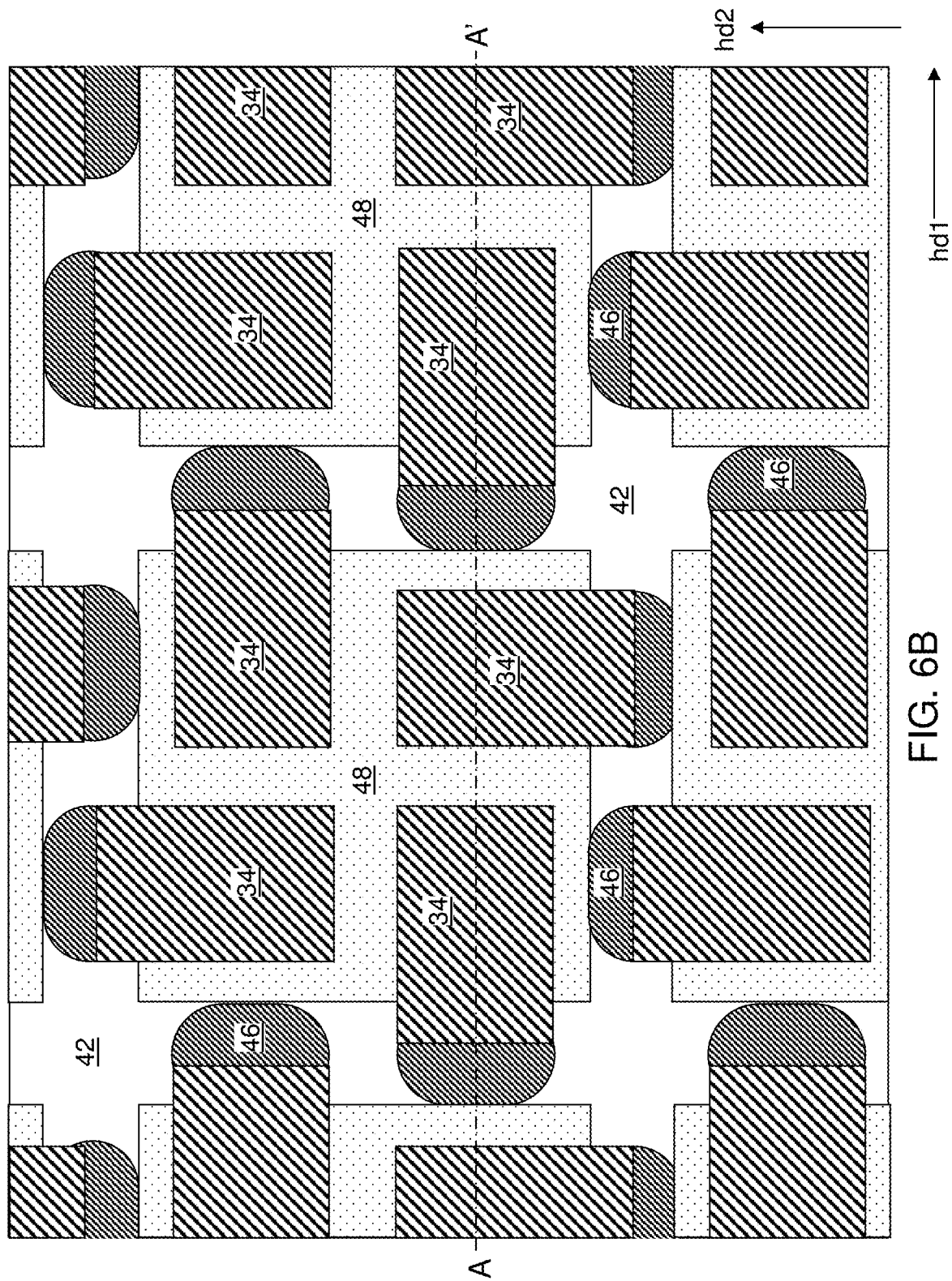
FIG. 6B is a top-down view of the exemplary structure of FIG. 6A according to the first embodiment of the present disclosure.
Figure 6C:
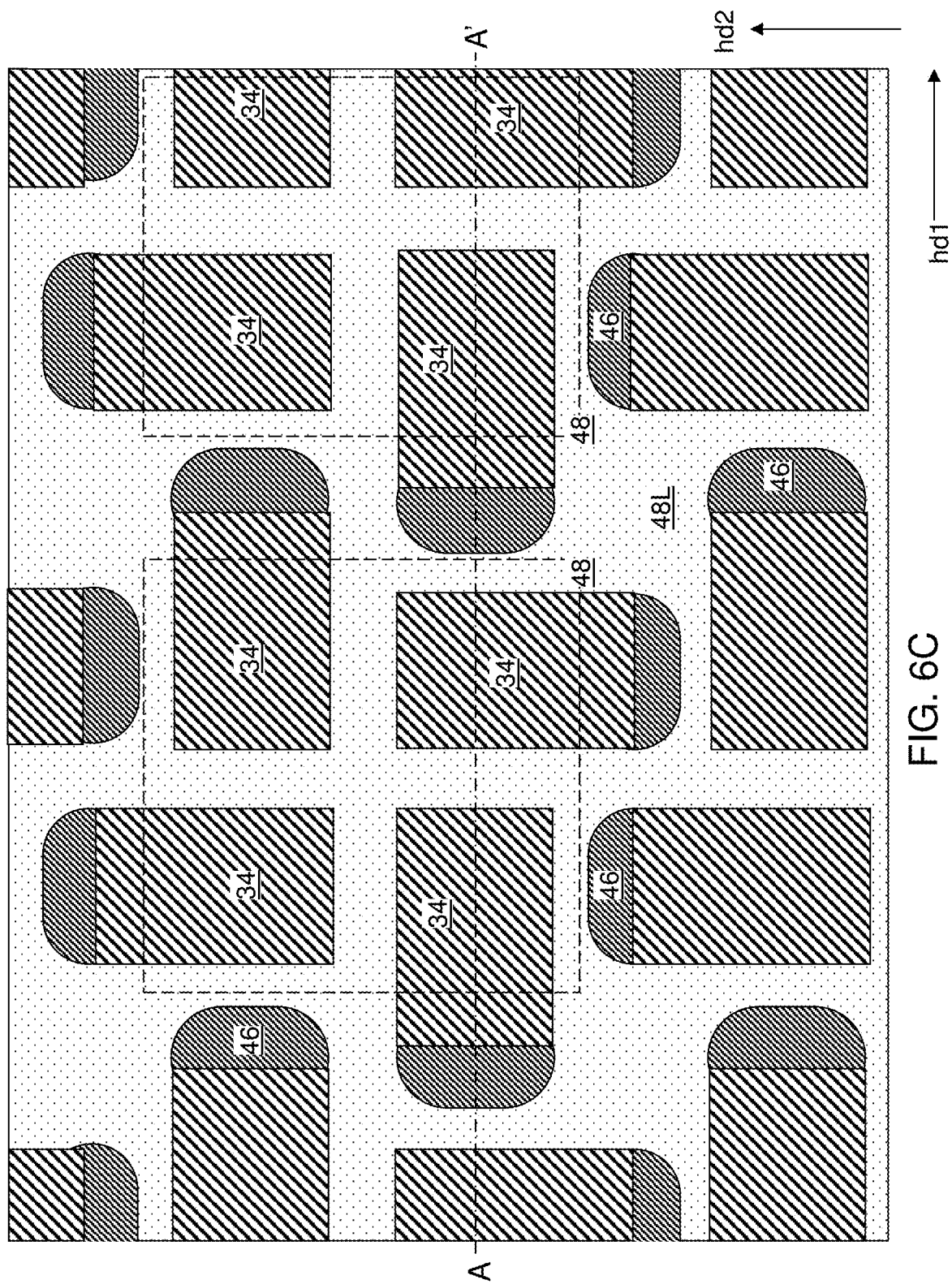
FIG. 6C is a top-down view of the exemplary structure of FIG. 6A according to the second embodiment of the present disclosure.

Referring to FIGS. 6A-6C, a two-dimensional array of metal plate clusters can be formed over the two-dimensional array of insulating material portions 48. In one embodiment, a continuous metal layer can be deposited over the insulating material portions 48 and on top surfaces of the metal interconnect structures (46, 44, 425) that are physically exposed in the openings 49, such as the physically exposed top surfaces of the conductive via structures 46. The continuous metal layer can be subsequently patterned to form a two-dimensional array of metal plate clusters. Alternatively, the two-dimensional array of metal plate clusters can be formed by forming a patterned photoresist layer, depositing a metal layer employing a non-conformal deposition process (such as physical vapor deposition or vacuum evaporation), and by lifting off the patterned photoresist layer.

Each patterned portion of the continuous metal layer constitutes a metal plate 34. A cluster of metal plates 34 overlies each insulating material portion 48, which overlies a respective gap region GR. Each set of patterned portions of the continuous metal layer overlying a same insulating material portion 48 constitutes a metal plate cluster. The two-dimensional array of metal plate clusters includes a first metallic material, which may be a barrier metallic material having a relatively high melting point to prevent damage during a subsequent bonding process that reflows a solder material. For example, the first metallic material can include, or consist essentially of, tungsten, titanium, tantalum, tungsten nitride, tantalum nitride, titanium nitride, or a combination thereof. The thickness of each metal plate 34 can be selected to provide sufficiently low electrical resistance without excessively increasing thermal mass (which can reduce effectiveness during a subsequent bonding process). For example, the thickness of each metal plate 34 can be in a range from 300 nm to 12 microns, although lesser and greater thicknesses can also be employed.

Generally, a two-dimensional array of metal plate clusters is formed over the two-dimensional array of insulating material portions 48 with the same two-dimensional periodicity. Each of the metal plate clusters comprises a plurality of metal plates 34. Each metal plate 34 includes a horizontal metal plate portion 34H overlying a planar top surface region of a respective insulating material portion 48 and a connection metal portion 34C extending between the horizontal metal plate portion 34H and a respective one of the metal interconnect structures (46, 44, 425). Each of the connection metal portions 34C can be formed directly on a tapered sidewall or a vertical sidewall of a respective one of the insulating material portions 48 and a top surface of a respective metal interconnect structure (46, 44, 425), such as a top surface of a conductive via structure 46.

In the first configuration illustrated in FIGS. 6A and 6B, the insulating material portions 48 are arranged as a two-dimensional array of insulating mesa structures not directly contacting one another and having the same two-dimensional periodicity as the two-dimensional array of metal plate clusters. In the second configuration illustrated in FIGS. 6A and 6C, each connection metal portion 34C extends through a respective opening 49 through the continuous insulating material layer that includes the two-dimensional array of insulating material portions 48, which overlies, and has the same two-dimensional periodicity as, the two-dimensional array of gap regions GR.

Figure 7A:
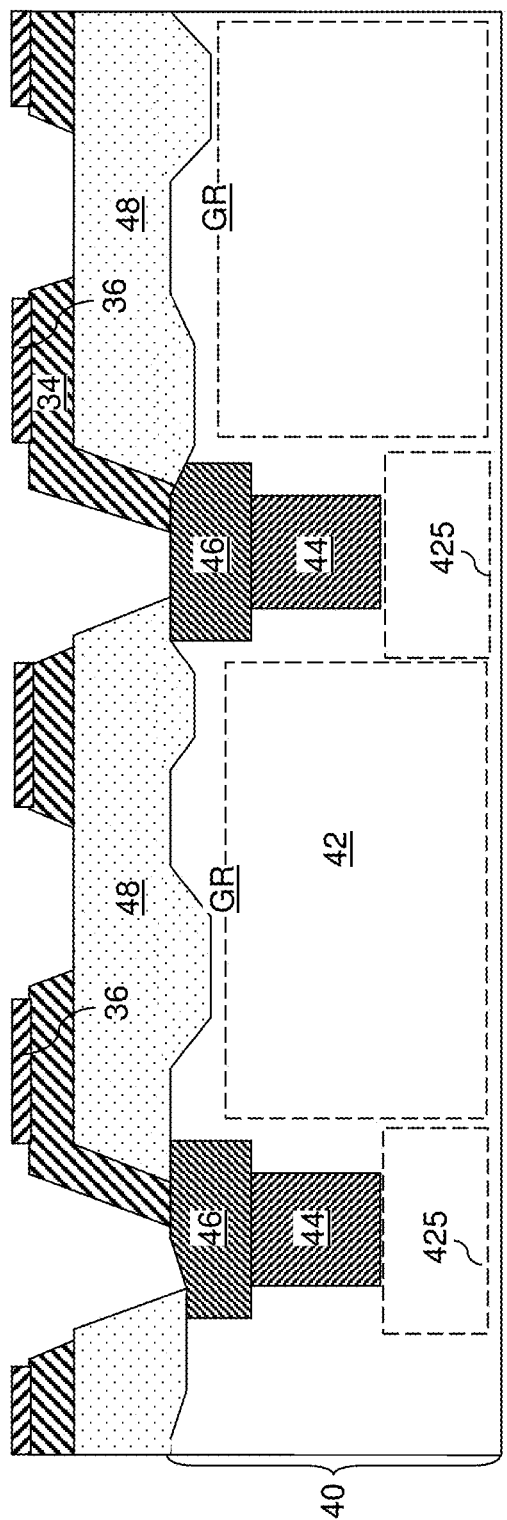
FIG. 7A is a vertical cross-sectional view of the exemplary structure after formation of a two-dimensional array of backplane-side bonding pads according to the first and second embodiments of the present disclosure.
Figure 7B:
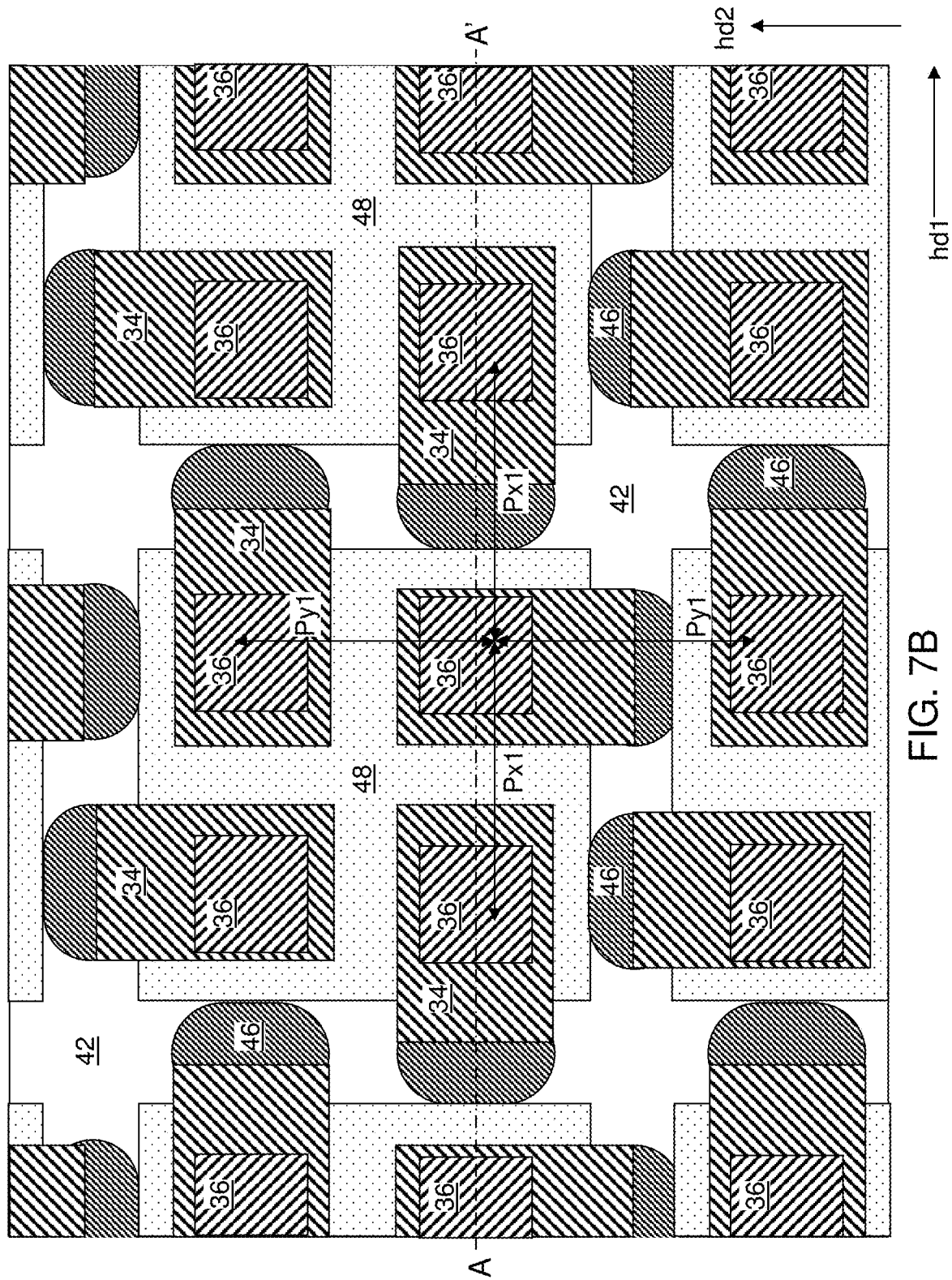
FIG. 7B is a top-down view of the exemplary structure of FIG. 7A according to the first embodiment of the present disclosure.
Figure 7C:
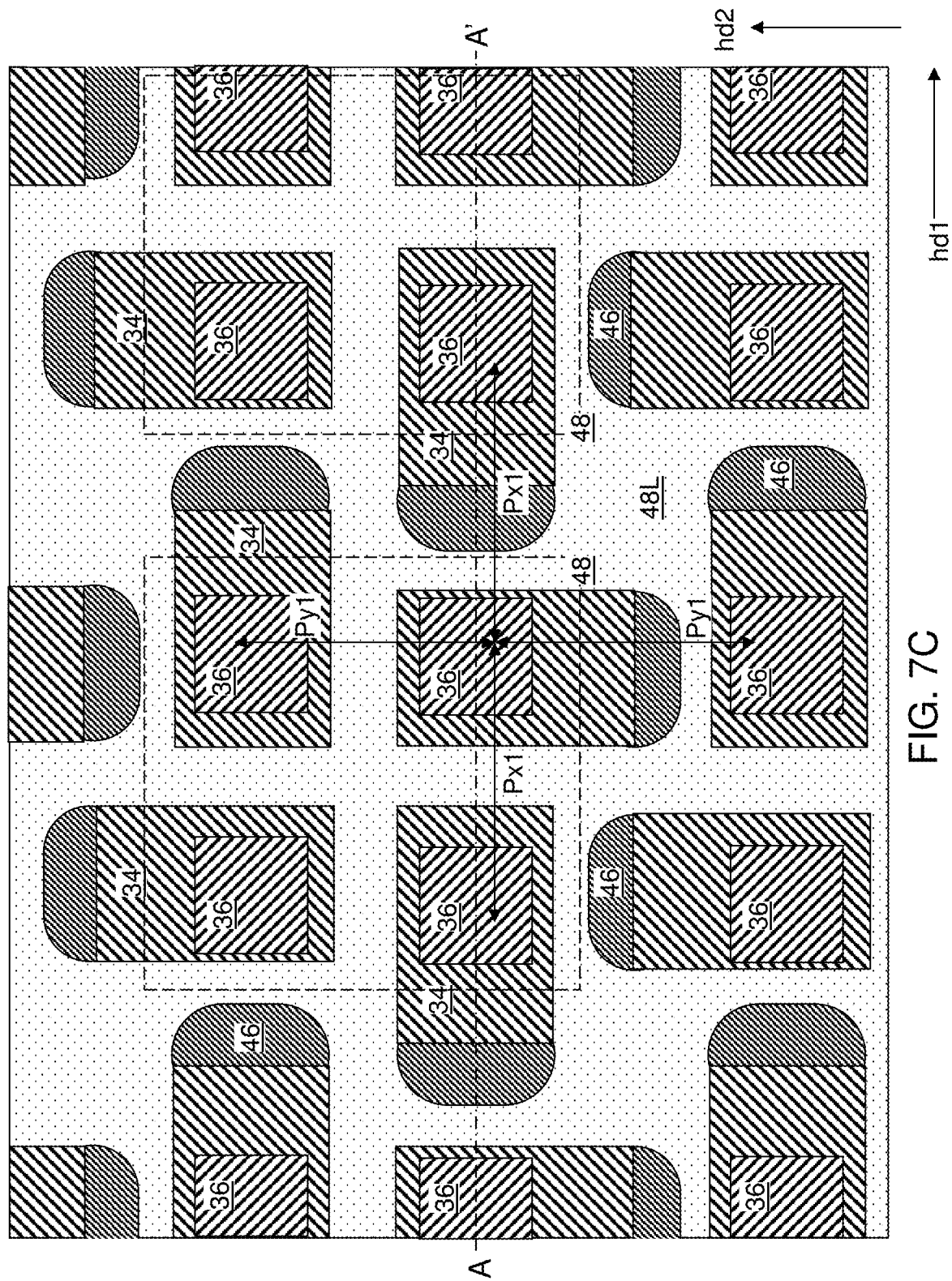
FIG. 7C is a top-down view of the exemplary structure of FIG. 7A according to the second embodiment of the present disclosure.

Referring to FIGS. 7A-7C, a two-dimensional array of backplane-side bonding pads 36 can be formed by deposition and patterning of at least one second metallic material. In one embodiment, the second material layer can be deposited as a continuous metallic material layer, and a photoresist layer can be applied and patterned over the continuous metallic material layer. An etch process can be performed to remove the second metallic material selective to the first metallic material, thereby patterning the continuous metallic material layer into the two-dimensional array of backplane-side bonding pads 36. Alternatively, a patterned photoresist layer can be employed as a mask layer, and the second metallic material can be anisotropically deposited on physically exposed surfaces of the metal plates 34 and over the patterned photoresist layer. A lift-off process can be employed to remove the patterned photoresist layer and portions of the second metallic material layer thereupon. Remaining portions of the second metallic material constitute the two-dimensional array of backplane-side bonding pads 36. The two-dimensional array of backplane-side bonding pads 36 is formed on top of the two-dimensional array of metal plate clusters. The second metallic material of the backplane-side bonding pads 36 can have a higher thermal conductivity than the first metallic material, and can have a lower melting point than the first metallic material. For example, the second metallic material can include copper or a copper-containing metal alloy.

In one embodiment, each of the backplane-side bonding pads 36 can be formed on a respective one of the horizontal metal plate portions 34H. A set of M×N backplane-side bonding pads 36 can be formed as an M×N rectangular periodic array over a respective insulating material portion 48. In one embodiment, the pitch of the two-dimensional array of metal plate clusters along the first horizontal direction hd1 can be M times the primary-direction pitch Px1, and the pitch of the two-dimensional array of metal plate clusters along the second horizontal direction hd2 can be N times the secondary-direction pitch Py1. In this case, the entire set of backplane-side bonding pads 36 can be formed as a two-dimensional periodic array having the periodicity of the primary-direction pitch Px1 along the first horizontal direction hd1 and having the periodicity of the secondary-direction pitch Py1 along the second horizontal direction hd2.

Figure 8:
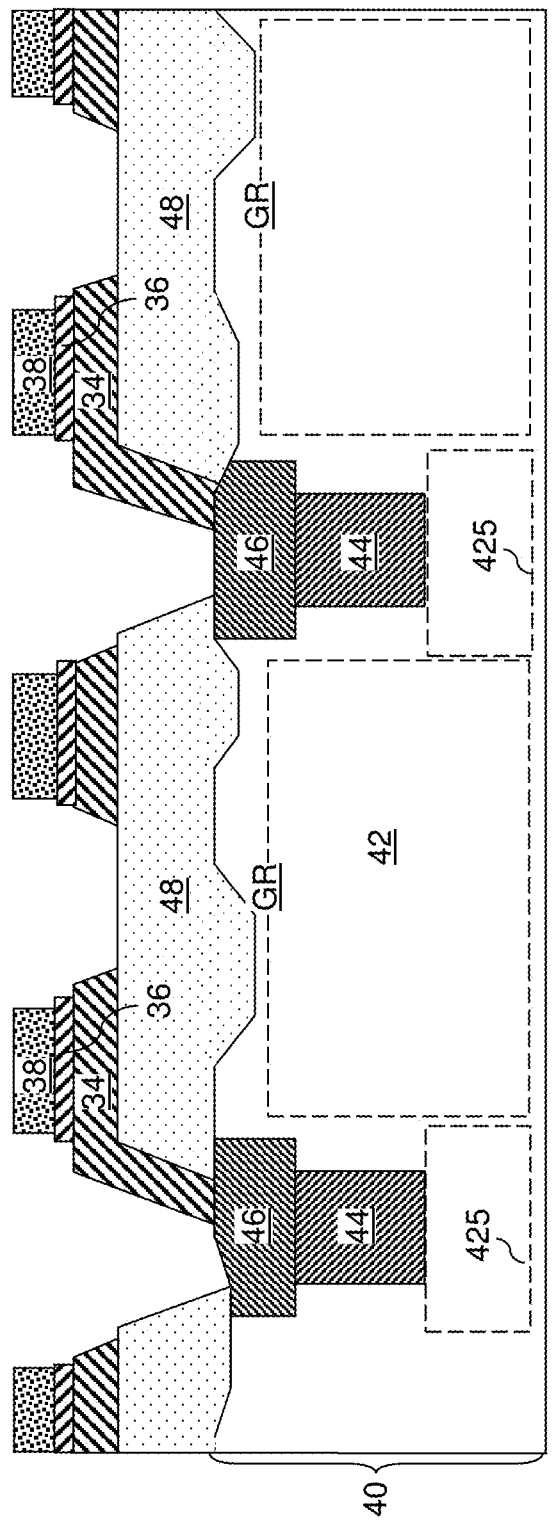
FIG. 8 is a vertical cross-sectional view of the exemplary structure after formation of backplane-side solder material portions on the two-dimensional array of backplane-side bonding pads according to the first and second embodiments of the present disclosure.

Referring to FIG. 8, optional backplane-side solder material portions 38 can be formed on the two-dimensional array of backplane-side bonding pads 36. Alternatively, the backplane-side bonding pads 36 can be formed of a solder material and the backplane-side solder material portions 38 can be omitted.

Figure 9:
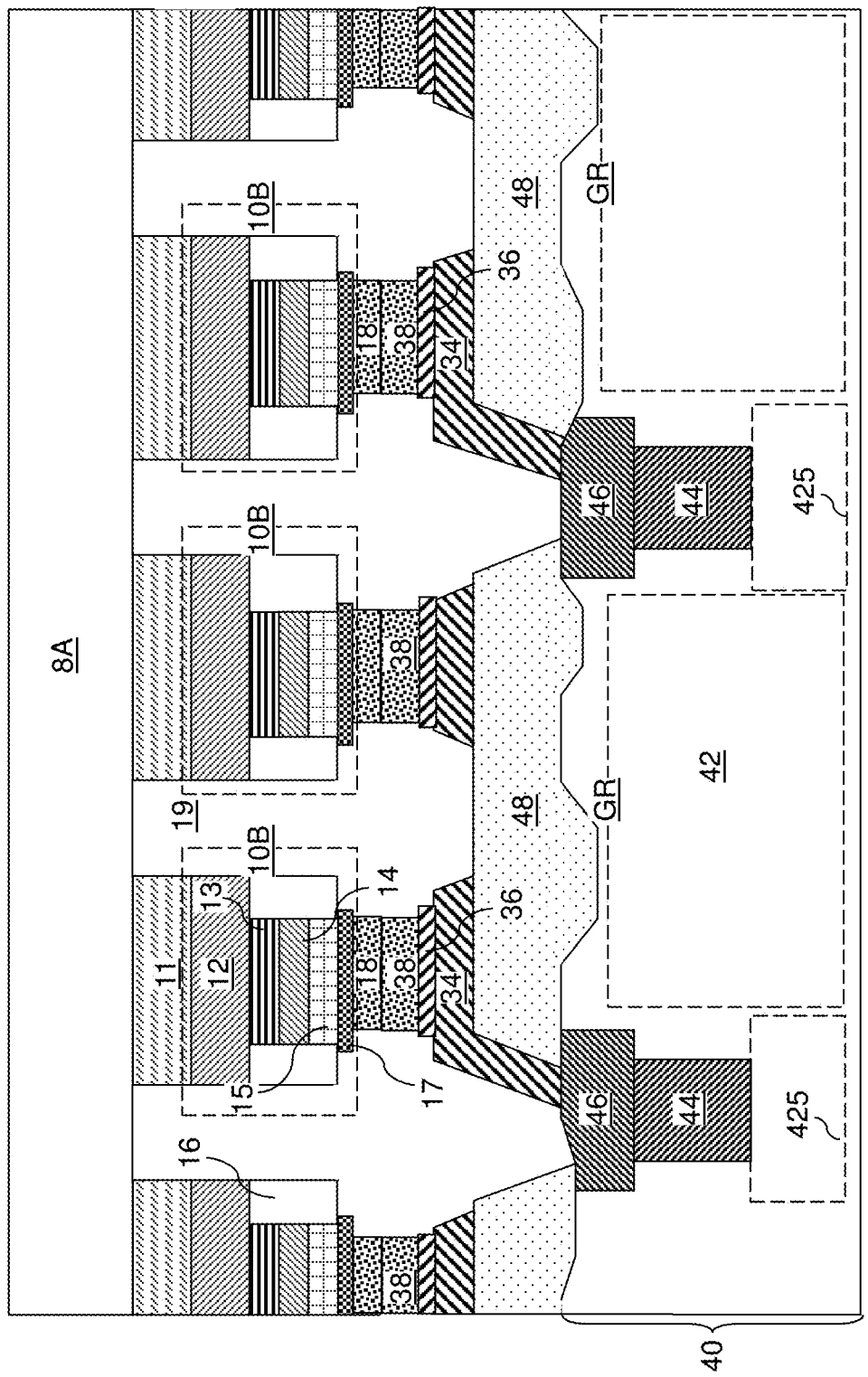
FIG. 9 is a vertical cross-sectional view of the exemplary structure after disposing a first source substrate over the backplane such that the first light emitting devices face the backplane according to the first and second embodiments of the present disclosure.

Referring to FIG. 9, a first source substrate 8A with first LEDs 10B is provided. The first source substrate 8A includes an optically transparent material such as sapphire. A layer stack including an undoped III-V compound material layer, an n-doped III-V compound material layer, a multi-quantum-well layer, a p-doped compound semiconductor layer, and a transparent conductive layer can be sequentially formed on the first source substrate 8A during manufacture of first LEDs 10B.

Insulating material portions 16 including a dielectric material (such as silicon oxide, silicon nitride, aluminum oxide, etc.) can be formed to delineate the lateral extent of each first LED 10B. Dicing channels 19 can be formed through the layer stack to divide the layer stack into stacks of an undoped III-V compound material layer 11 and a first LED 10B. Each first LED 10B can include a vertical stack of an n-doped III-V compound material layer 12, an active region, such as a multi-quantum-well 13, a p-doped III-V compound semiconductor layer 14, and a transparent conductive layer 15. In a non-limiting illustrative example, each undoped III-V compound material layer 11 can include undoped gallium nitride, each n-doped III-V compound material layer 12 can include n-doped gallium nitride or indium gallium nitride, each multi-quantum-well 13 can include a periodic repetition of gallium nitride layers and indium gallium nitride layers, each p-doped III-V compound semiconductor layer 14 can include p-doped gallium nitride or aluminum gallium nitride, and/or each transparent conductive layer 15 can include a transparent conductive oxide, such as indium tin oxide. Layer 12 can be a bulk layer or a plurality of nanowires. The active region 13 and the layer 14 can be planar layers or nanowire shells. The first LEDs 10B emit light at a first peak wavelength (e.g., in the blue wavelength range).

A device-side bonding pad 17 can be formed on each first LED 10B. Each device-side bonding pad 17 can include bonding pad material such as Ni, Au, and/or Cu. Optionally, a device-side solder material portion 18 can be formed on each device-side bonding pad 17. The device-side solder material portions 18 can include, for example, a lead-free solder material.

The first source substrate 8A can be disposed over the backplane 40 with first solder material portions (18, 38) therebetween such that the device-side bonding pads 17 of the first LEDs 10B face the backplane-side bonding pads 36 through the first solder material portions (18, 38). The first source substrate 8A and the first LEDs 10B can be aligned such that pairs of a source-side solder material portion 18 and a device-side solder material portion 38 make direct contact, or are placed in sufficient proximity to induce merging therebetween upon reflow.

Figure 10:
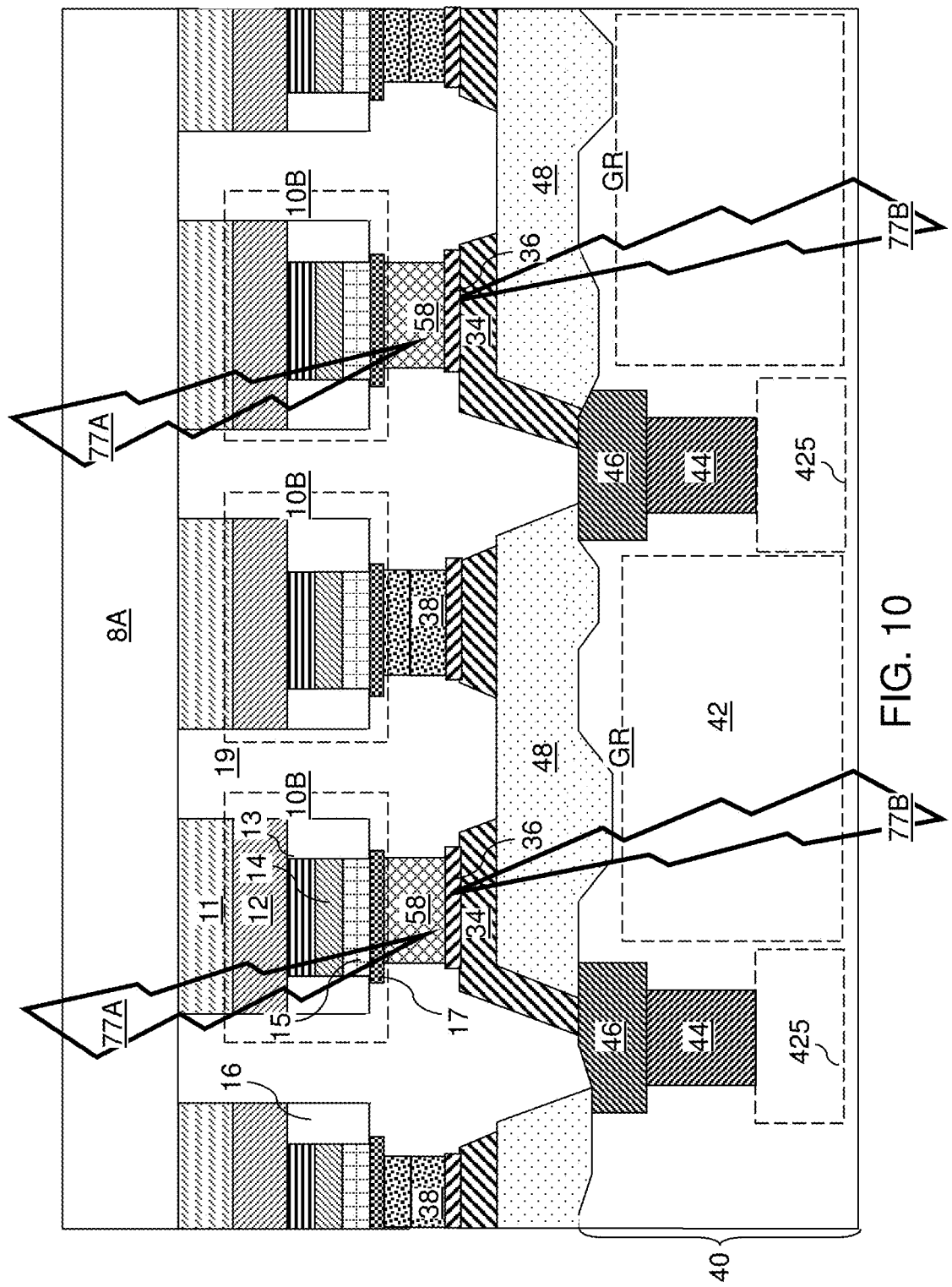
FIG. 10 is a vertical cross-sectional view of the exemplary structure after selective bonding a subset of the first light emitting devices to the backplane employing a laser irradiation reflow process according to the first and second embodiments of the present disclosure.

Referring to FIG. 10, a subset of the first LEDs 10B is selectively bonded to the backplane 40. Any suitable selective bonding process may be used. For example, selective laser bonding or thermal (e.g., furnace) bonding process may be used to reflow the solder material portions (18, 38).

For example, as shown in FIG. 10, in one embodiment, the bonding process comprises laser bonding employing a laser irradiation reflow process. A heating laser can be employed to bond a selected subset of the first LEDs 10B to the backplane 40. The pattern of selection for the selected subset of the first LEDs 10B can be, for example, the pattern illustrated in FIG. 2B. Specifically, bonding of the selected subset of the first LEDs 10B to the backplane 40 can be performed by irradiating a first laser beam (77A or 77B) to at least one solder material portion (18, 38) to reflow the at least one solder material portion (18, 38).

In one embodiment, the first laser beam 77A can pass through the first substrate 8A and through the selected subset of first LEDs 10B to the at least one solder material portion (18, 38) to reflow the at least one solder material portion (18, 38).

In another embodiment, if the backplane substrate 42 is optically transparent, then the first laser beam 77B can pass through the backplane to heat the at least one solder material portion (18, 38). The first laser beam 77B of the heating laser can pass through the gap region GR of the substrate 42 to avoid collateral heating of metal interconnect structures (46, 44, 425) other than the irradiated metal plate 34, the irradiated backplane-side bonding pad 36, and the irradiated solder material portions (18, 38). In one embodiment, the heating laser may employ infrared wavelength. For example, the heating laser can be a visible or infra-red laser having a wavelength in a range from 0.4 micron to 20 microns, such as 1 to 2 microns, to avoid heating of the backplane 40, while heating the at least one solder material portion (18, 38). In another embodiment, both laser beams (77A, 77B) can be used to irradiate the at least one solder material portion (18, 38) either simultaneously or sequentially.

In another alternative embodiment, a thermal (e.g., furnace) bonding process rather than a laser process may be used to reflow the solder material portions (18, 38). In this embodiment, the solder material portions 18 have a different composition and a different melting point, as described in U.S. Pat. No. 9,893,041 B2, incorporated herein by reference in its entirety. In the thermal bonding process, the lowest melting point solder material portions (18, 38) are reflowed and bonded first at a temperature above their respective melting point but below the respective melting point of the other solder material portions which are not bonded. Subsequently, the next lowest melting point solder material portions (18, 38) are reflowed and bonded second at a temperature above their respective melting point but below the respective melting point of the remaining higher melting point solder material portions which are not bonded. This process is repeated as many times as needed to sequentially bond all the pairs of solder material portions.

The heated and reflowed at least one solder material portion (18, 38) solidifies into a bonded solder material portion 58, which provides bonding between the backplane 40 and a respective first LEDs 10B through a backplane-side bonding pad 36, a metal plate 34, and a device-side bonding pad 17. A subset, but not all, of the first LEDs 10B can be bonded to the backplane 40 by selectively reflowing a subset of the first solder material portions (18, 38).

Figure 11:
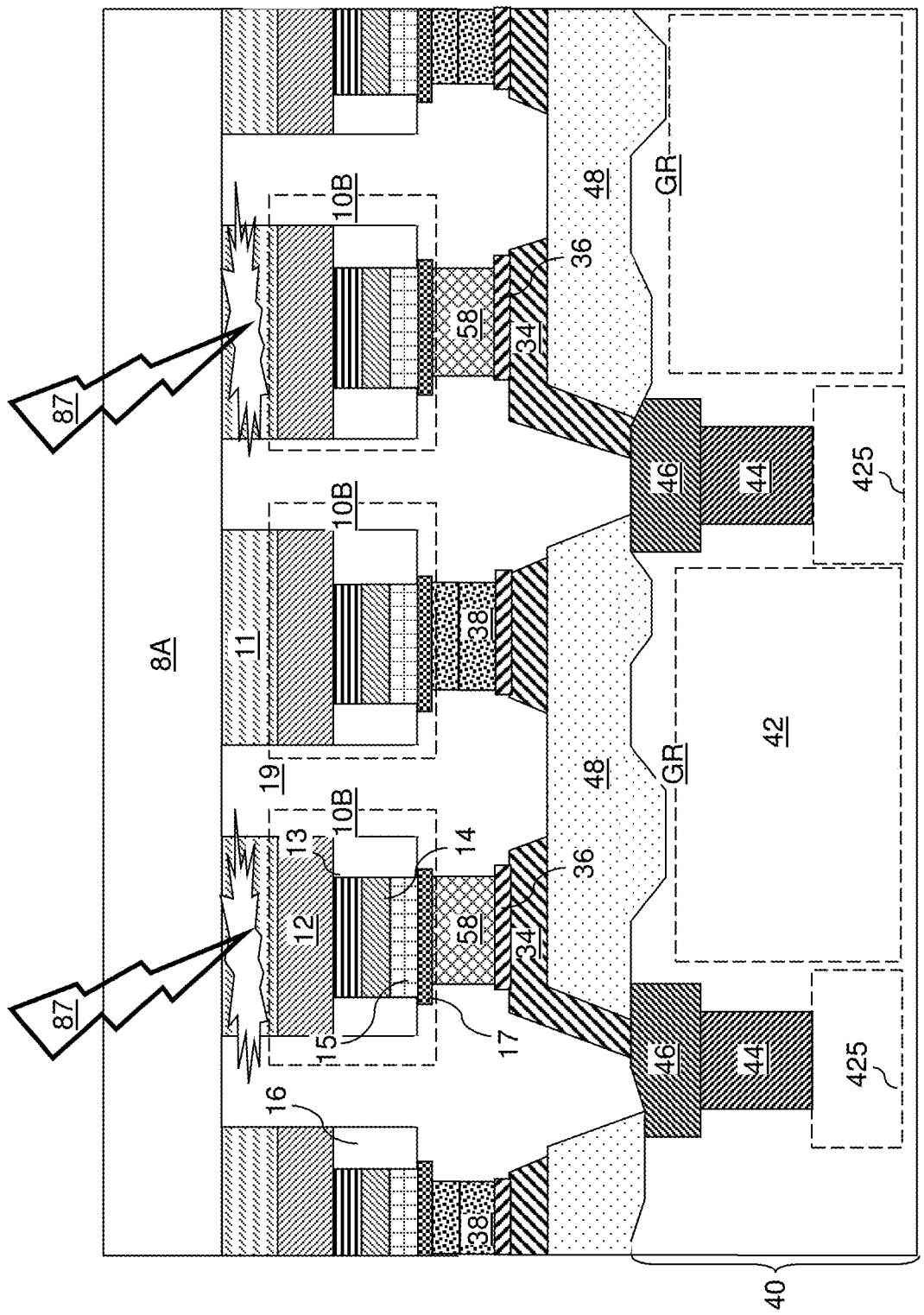
FIG. 11 is a vertical cross-sectional view of the exemplary structure after selective dissociation of the subset of the first light emitting devices from the first source substrate employing a selective laser ablation process according to the first and second embodiments of the present disclosure.

Referring to FIG. 11, the subset of the first LEDs 10B that are bonded to the backplane 40 can be selectively dissociated from the first source substrate 8A employing a selective laser ablation process. Each bonded LED 10 can be dissociated from the first source substrate 8A by irradiating a second laser beam 87 through the first source substrate 8A and onto each III-V compound material layer 11 in contact with the bonded first LEDs 10B. In one embodiment, the first source substrate 8A comprises sapphire, and each III-V compound material layer 11 comprises a compound semiconductor material (such as an undoped III-V compound semiconductor material). In this case, the second laser beam 87 ablates each III-V compound material layer 11 in contact with the bonded first LEDs 10B. The wavelength of the laser (which is herein referred to an "ablation laser") employed to provide the second laser beam 87 can be different (e.g., shorter) from the wavelength of the heating laser. The wavelength of the ablation laser can be, for example between 0.1 and 0.75 micron, such as 0.25 to 0.5 micron. In one embodiment, the wavelength of the ablation laser can be within an ultraviolet range, i.e., within a range from 10 nm to 400 nm. Each first LED 10B that is bonded to the backplane 40 through a respective reflowed and re-solidified solder material portion 58 can be dissociated employing laser ablation of the compound semiconductor material (i.e., the material of the III-V compound material layer 11) located between the first source substrate 8A and each first LED 10B that is bonded to the backplane 40.

Figure 12:
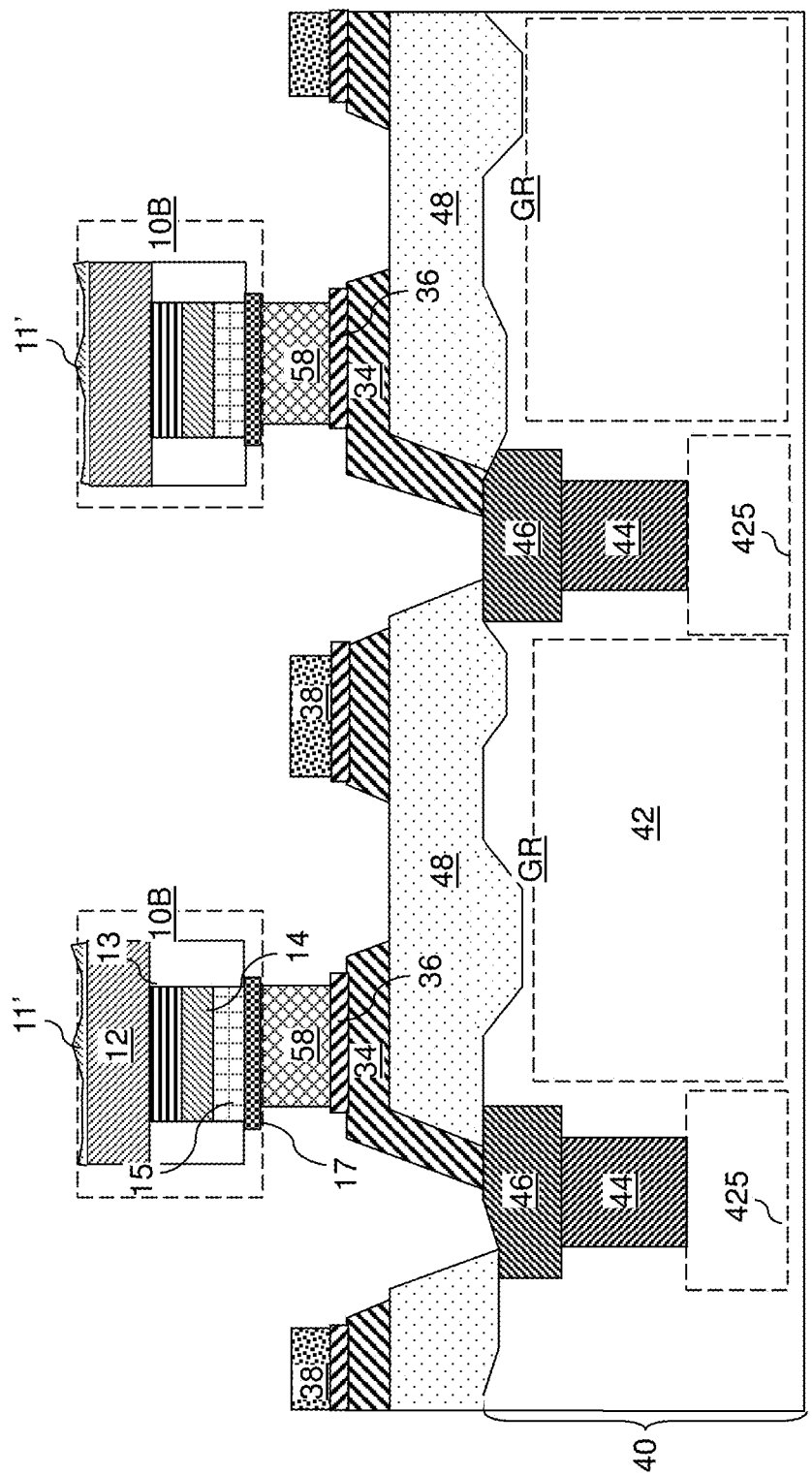
FIG. 12 is a vertical cross-sectional view of the exemplary structure after separating the assembly of the backplane and the subset of the first light emitting devices an assembly of the first source substrate and remaining first light emitting devices according to the first and second embodiments of the present disclosure.

Referring to FIG. 12, an assembly of the backplane 40 and the set of all first LEDs 10B bonded thereto can be separated from an assembly of the first source substrate 8A and the set of all first LEDs 10B that are not bonded to the backplane 40. Residual portions of the III-V compound material layer 11 can be present on the distal surfaces of the first LEDs 10B that are attached to the backplane 40. Specifically, compound semiconductor material portions 11' having irregular surface height variations can be located on the distal surfaces of the first LEDs 10B. The distal surfaces are surfaces of the first LEDs 10B facing away from the backplane 40.

Figure 13:
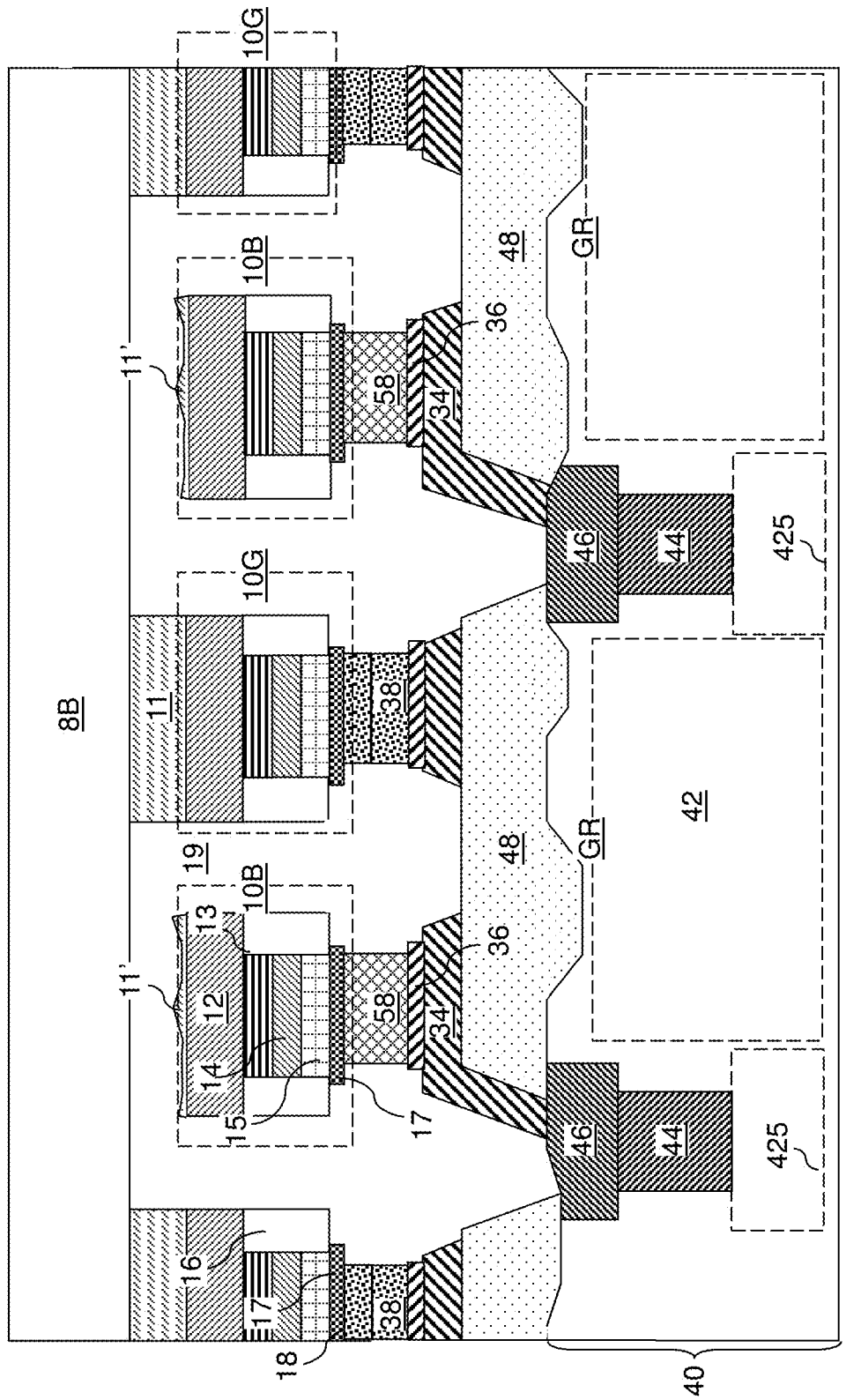
FIG. 13 is a vertical cross-sectional view of the exemplary structure after disposing a second source substrate over the backplane such that the second light emitting devices face the backplane according to the first and second embodiments of the present disclosure.

Referring to FIG. 13, second LEDs 10G can be transferred as illustrated in FIG. 2C. A second source substrate 8B with second LEDs 10G thereupon can be provided. The second LEDs 10G emit light at a second peak wavelength (e.g., in the green visible range) that is different from the first wavelength (e.g., in the blue visible range). The second source substrate 8B can have the same structural and compositional characteristics as the first source substrate 8A. The second LEDs 10G can be formed in the same manner as the first LEDs 10B with modifications in material compositions to shift the second wavelength from the first wavelength. The second source substrate 8B can be disposed over the backplane 40 with second solder material portions (38, 18) therebetween such that the device-side bonding pads 17 of the second LEDs 10G face a subset of the backplane-side bonding pads 36 through the second solder material portions (18, 38). A subset, but not all, of the second LEDs 10G can be bonded to the backplane 40 by selectively reflowing a subset of the second solder material portions (18, 38). The pattern of selection for the bonded set of second LEDs 10G can be the pattern illustrated in FIG. 2C. The processing steps of FIG. 10 can be employed mutandis mutatis for the bonding process that selectively bonds a subset of the second LEDs 10G to the backplane 40.

Subsequently, the processing steps of FIG. 11 can be performed mutandis mutatis to dissociate all second LEDs 10G that are bonded to the backplane 40 from the second transparent substrate 8B.

Figure 14A:
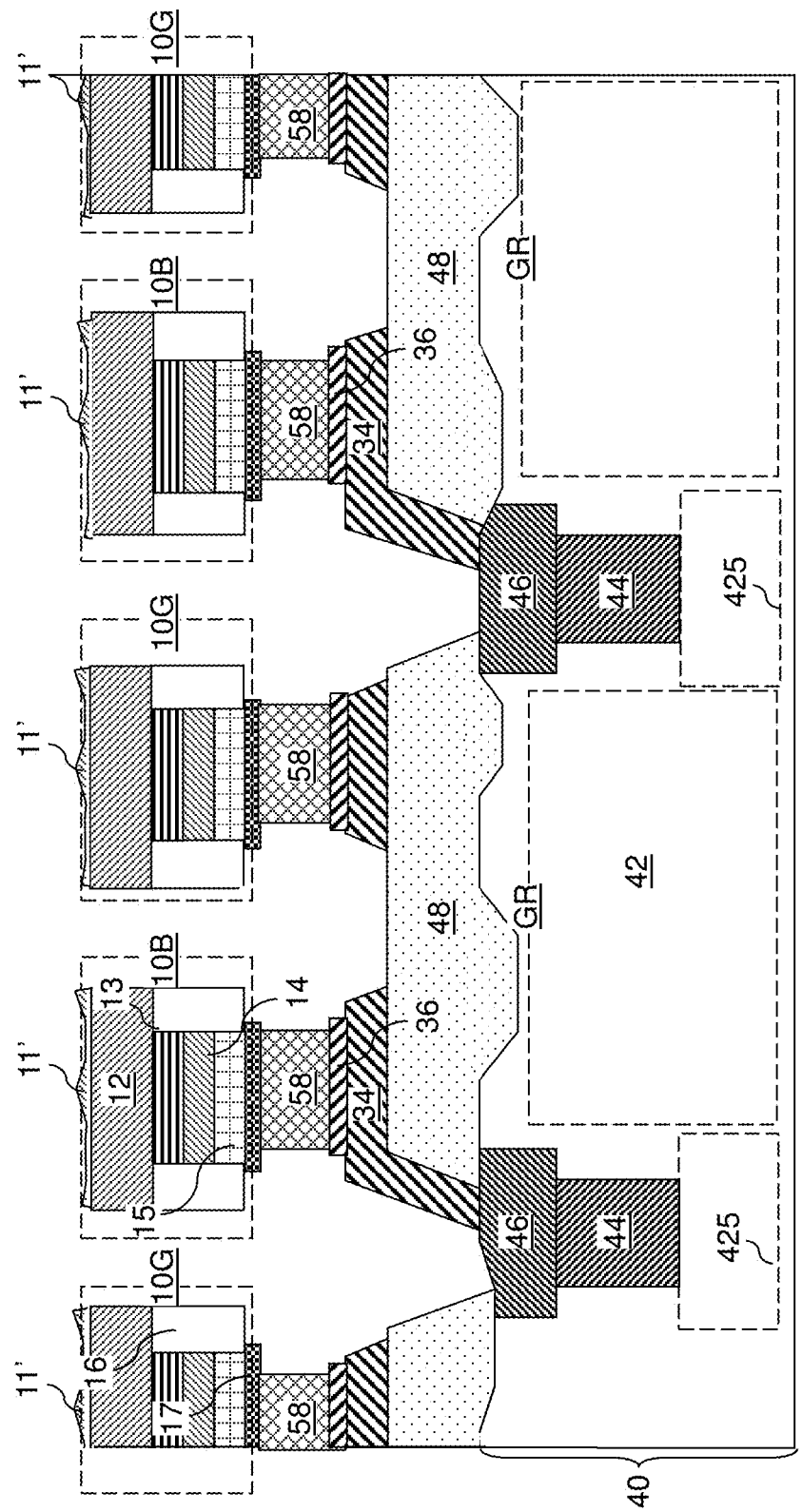
FIG. 14A is a vertical cross-sectional view of the exemplary structure transfer of a set of a first light emitting device, a second light emitting device, and a third light emitting device to each metal plate cluster according to the first and second embodiments of the present disclosure.
Figure 14B:
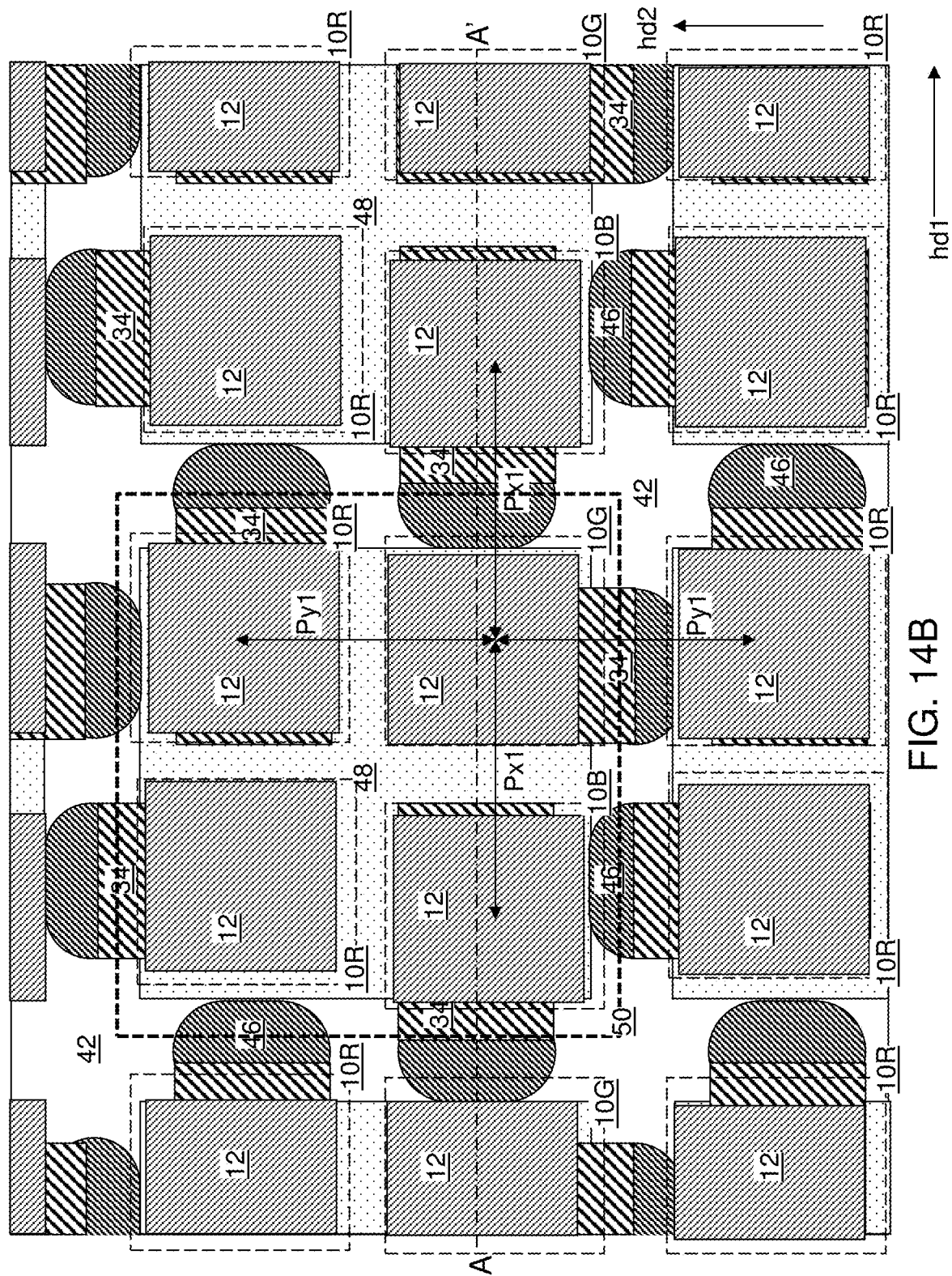
FIG. 14B is a top-down view of the exemplary structure of FIG. 14A according to the first embodiment of the present disclosure.
Figure 14C:
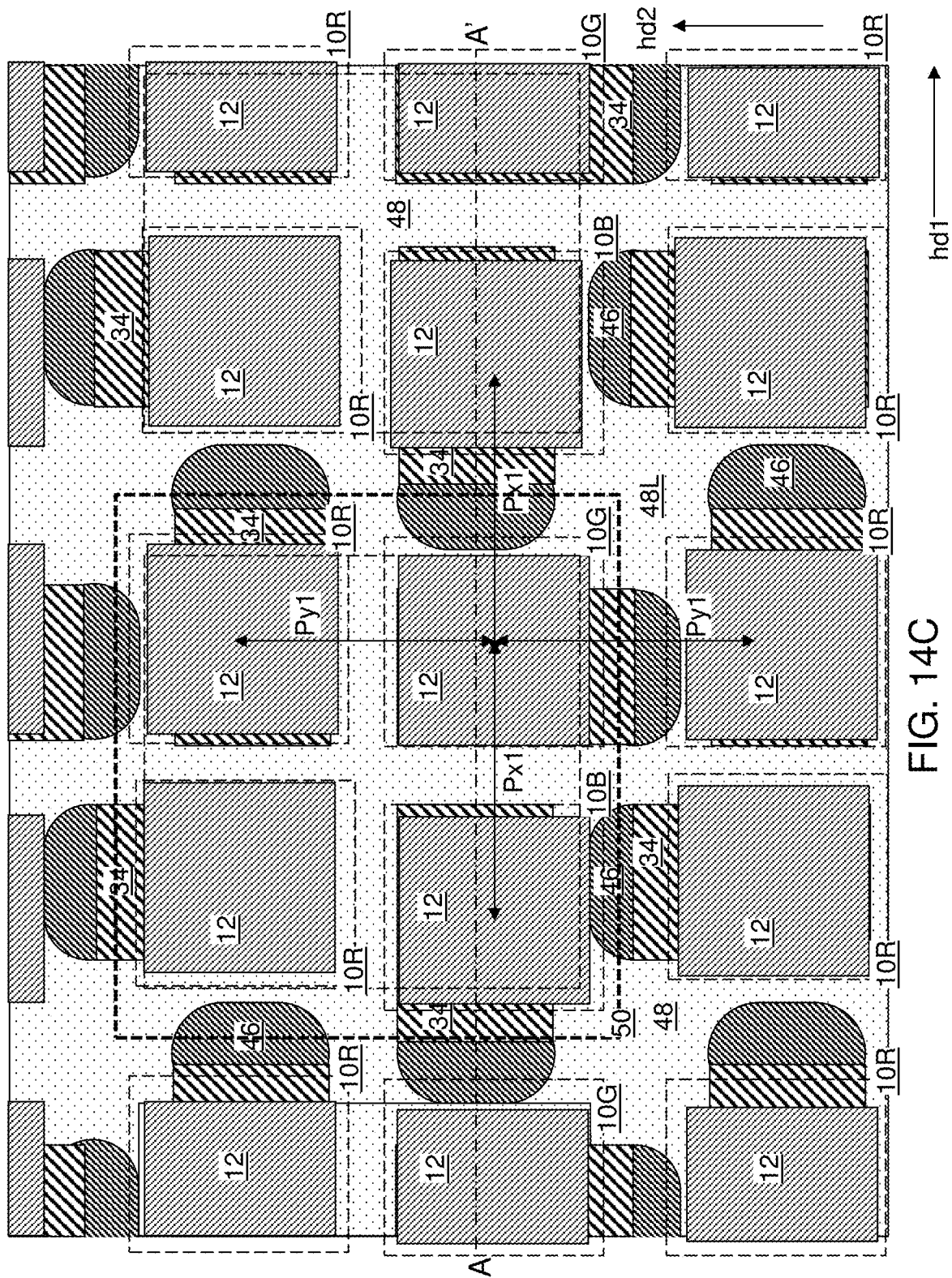
FIG. 14C is a top-down view of the exemplary structure of FIG. 14A according to the second embodiment of the present disclosure.

Referring to FIGS. 14A-14C, the processing steps of FIGS. 9-11 can be repeatedly performed with necessary changes to bond multiple types of LEDs (10B, 10G, 10R) to the two-dimensional array of metal plate clusters. For example, red LEDs 10R can be bonded to the backplane 40. Each set of LEDs (10B, 10G, 10R) attached to a metal plate cluster constitutes a light emitting device cluster 50 which can constitute a pixel of a direct view display device, and each of the LEDs can be a subpixel of the direct view display device. The light emitting luster 50 is configured to provide an arbitrary color that can be generated by combination of light of multiple peak wavelengths with different intensities. The light emitting luster 50 can have any suitable shape and configuration and can have any suitable number of light emitting devices (i.e., any suitable number of LEDs) (10B, 10G, 10R). For example, each light emitting luster 50 can include two red light emitting LEDs 10R, one blue light emitting LED 10B and one greed light emitting LED 10G. The red light emitting LEDs 10R can be located next to each other or diagonally from each other in each light emitting luster 50. Thus, a two-dimensional array of light emitting device clusters 50 can be bonded to the backplane 40 through respective bonding structures (36, 48, 17). Each light emitting device cluster 50 comprises a plurality of light emitting devices (10B, 10G, 10R) overlying a respective metal plate cluster.

Referring to all drawings and according to various embodiments of the present disclosure, a light emitting device assembly is provided, which comprises: a backplane 40 comprising the substrate 42 and embedding metal interconnect structures (46, 44, 425) therein; insulating material portions 48 including a respective planar top surface region and located over the backplane 40, wherein all planar top surface regions of the insulating material portions are within a same horizontal plane; a two-dimensional array of metal plate clusters, wherein each of the metal plate clusters comprises a plurality of metal plates 34, each metal plate 34 including a horizontal metal plate portion 34H overlying a planar top surface region of a respective insulating material portion 48 and a connection metal portion 34C extending between the horizontal metal plate portion 34H and a respective one of the metal interconnect structures (46, 44, 425); and a two-dimensional array of light emitting device clusters bonded to the backplane 40 through respective bonding structures (36, 48, 18), wherein each light emitting device cluster comprises a plurality of light emitting devices (10B, 10G, 10R) overlying a respective metal plate cluster.

In one embodiment, the light emitting device comprises compound semiconductor material portions 11 having irregular surface height variations and located on distal surfaces of the light emitting devices (10B, 10G, 10R), the distal surfaces being surfaces of the light emitting devices facing away from the backplane 40. In one embodiment, the bonding structures (36, 48, 18) comprise a two-dimensional array of backplane-side bonding pads 36 located on top of the two-dimensional array of metal plate clusters, wherein each of the backplane-side bonding pads 36 is located on a respective one of the horizontal metal plate portions 34H. In one embodiment, each of the light emitting devices (10B, 10G, 10R) within the two-dimensional array of light emitting device clusters includes a device-side bonding pad 17 that is bonded to a respective one of the backplane-side bonding pads 36 through a solder material portion 58.

In one embodiment, the metal interconnect structures (46, 44, 425) are arranged to provide a rectangular two-dimensional array of gap regions GR in which the metal interconnect structures (46, 44, 425) are not present; the insulating material portions 48 are located over each of the gap regions GR; and the plurality of metal plates 34 overlies a respective one of the gap regions GR. In one embodiment, the two-dimensional array of light emitting device clusters has a same two-dimensional periodicity as the two-dimensional array of metal plate clusters, i.e., a first periodicity of M times Px1 along the first horizontal direction hd1 and a second periodicity of N times Py1 along the second horizontal direction hd2 in which M is an integer greater than 1 and N is an integer greater than 1.

In one embodiment, each of the connection metal portions 34C contacts a tapered sidewall or a vertical sidewall of a respective one of the insulating material portions 48 and a top surface of a respective metal interconnect structure (46, 44, 425). In a first embodiment, the insulating material portions 48 are arranged as a two-dimensional array of insulating mesa structures not directly contacting one another and having a same two-dimensional periodicity as the two-dimensional array of metal plate clusters. In a second embodiment, the insulating material portions 48 are portions of a continuous insulating material layer 48L that covers a top surface of the backplane 40; and each connection metal portion 34C extends through a respective opening through the continuous insulating material layer 48L.

The embodiments of the present disclosure provide the following non-limiting advantages. The planar top surface regions facilitate uniform bonding of LEDs by providing coplanar surfaces for LED bonding to the backplane. The insulating material portions may be pliable (i.e., have a lower elastic module than the backplane substrate) to improve alignment of multiple light emitting devices during bonding.

According to an aspect of the present disclosure, a method of repairing a light emitting device assembly is provided.

Specifically, the light emitting device assembly formed by the processing steps of FIGS. 9-14C can have failed transfer sites at which a LED (10B, 10G, 10R) failed to transfer for various reasons, which may include failure to form bonded solder material portions 58 and/or failure to detach a LED from a source substrate and/or any other reason.

Generally, a light emitting device comprising an imperfect array of LEDs (10B, 10G, 10R) bonded to a backplane 401 is characterized by the absence of at least one LED (10B, 10G, 10R) at a respective vacancy location. As used herein, a "vacancy location" refers to a site at which a LED would be present in a light emitting device in which all LEDs are transferred as intended, but is not occupied by the actual LED. In one embodiment, the light emitting device can comprise multiple arrays of LEDs (10B, 10G, 10R). In one embodiment, each of the multiple arrays comprises LEDs (10B, 10G, 10R) that emit light at a respective peak wavelength that differs among the multiple arrays. For example, the multiple arrays of LEDs (10B, 10G, 10R) can include a first array of blue-light-emitting diodes 10B (blue LEDs), a second array of green-light-emitting diodes 10G (green LEDs), and a third array of red-light-emitting diodes 10R (red LEDs). A multi-color pixel includes at least one of each type of LED (10B, 10G, 10R). At least one of the multiple arrays can comprise an imperfect array of LEDs. Each array can have the same two-dimensional periodicity except at locations at which a LED (10B, 10G, 10R) is missing, i.e., at vacancy locations. In one embodiment, the imperfect array of LEDs (10B, 10G, 10R) can comprise a plurality of vacancy locations at which a plurality of LEDs are not present with a vacancy pattern. In one embodiment, each of the multiple array of LEDs (10B, 10G, 10R) can comprise a respective vacancy pattern. The multi-color pixels are also arranged in an array of multi-color pixels which overlaps the multiple arrays of LEDs (10B, 10G, 10R).

Figure 15:
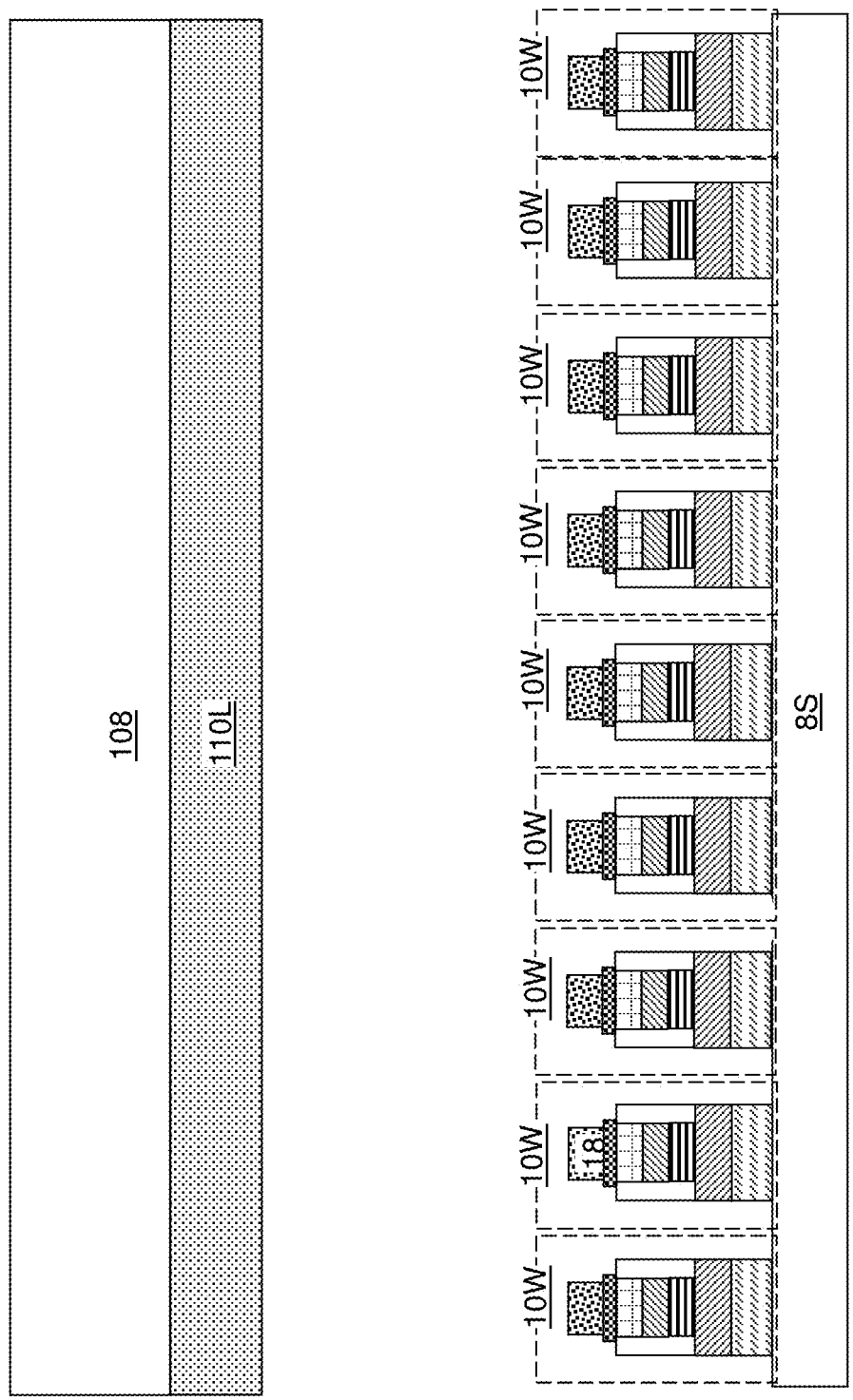
FIG. 15 illustrates a first repair source substrate within an array of first LEDs and a first carrier substrate with a temporary adhesive layer according to an embodiment of the present disclosure.

Referring to FIG. 15, a repair source substrate 8S within an array of repair LEDs 10W is illustrated. The array of repair LEDs 10W on the first repair source substrate 8S can have the same periodicity as the array of first LEDs 10B on the first source substrate 8A. However, in other embodiments, the repair LEDs 10W can have the same periodicity as any of the first, second or third LEDs (10B, 10G, 10R).

A first carrier substrate 108 with a temporary adhesive layer 110L thereupon can be provided. The first carrier substrate 108 can be any substrate with a planar surface, and can include an insulating material, a conductive material, a semiconducting material, or a combination thereof. Preferably, the first carrier substrate 108 is transparent (e.g., at least 80% transparent) to laser radiation, such as infrared, visible or ultraviolet radiation, and can comprise a material such as glass or sapphire. A temporary adhesive layer 110L is applied over the planar surface of the first carrier substrate 108. The temporary adhesive layer 110L can be formed by spin-coating, and can have a thickness in a range from 20 microns to 160 microns, although lesser and greater thicknesses can also be employed. Alignment marks can be formed on the first carrier substrate 108 and/or in the temporary adhesive layer 110L that correspond to the locations of the LEDs to be transferred to the first carrier substrate 108.

The temporary adhesive layer 110L includes an adhesive material that can be cured upon heating to a temperature within a first bonding temperature range (which is also referred to as a first curing temperature range), and debonds upon heating to a temperature within a first debonding temperature range. The temporary adhesive layer 110L is thermally stable throughout the first bonding temperature range, and thermally decomposes only at a decomposition temperature that is above the first debonding temperature range. In one embodiment, the temporary adhesive layer 110L is thermally stable at least up to 200 degrees Celsius, and decomposes at, or above, a decomposition temperature that is above 200 degrees Celsius.

In an illustrative example, the temporary adhesive layer 110L can include a commercially available adhesive material, such as BrewerBOND® 220. BrewerBOND® 220 material enables backside temperature processing up to 250° C. with minimal device wafer bowing. The bonding temperature range of BrewerBOND® 220 is from 130° C. to 170° C., and the debonding temperature range of BrewerBOND® 220 is from 150° C. to 240° C. Within the temperature range from 150° C. to 170° C., BrewerBOND® 220 initially undergoes a bonding process and a debonding process gradually sets in as the anneal process is prolonged. BrewerBOND® 220 is thermally stable up to 250° C. Upon debonding in a subsequent processing step, the first carrier substrate 108 can slide out with a small force.

Figure 16A:
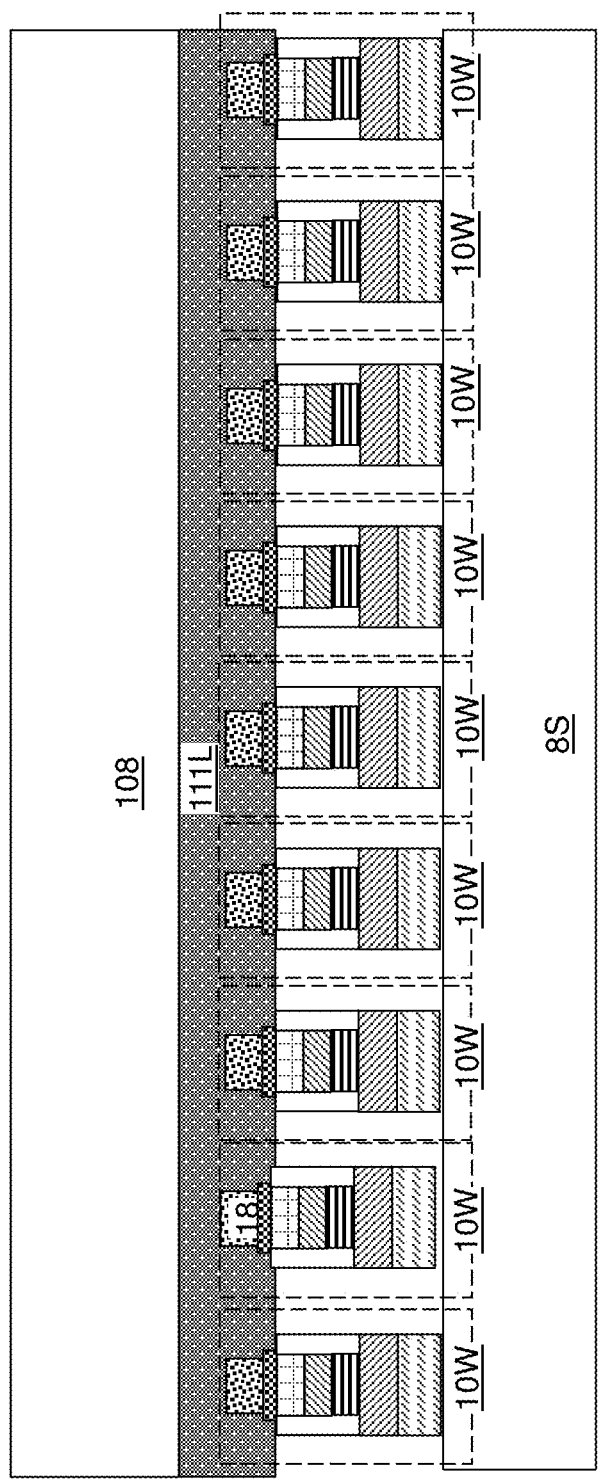
FIG. 16A illustrates an assembly of the first repair source substrate, the array of first LEDs, a thermally-cured temporary adhesive layer, and the first carrier substrate according to an embodiment of the present disclosure.
Figure 16B:
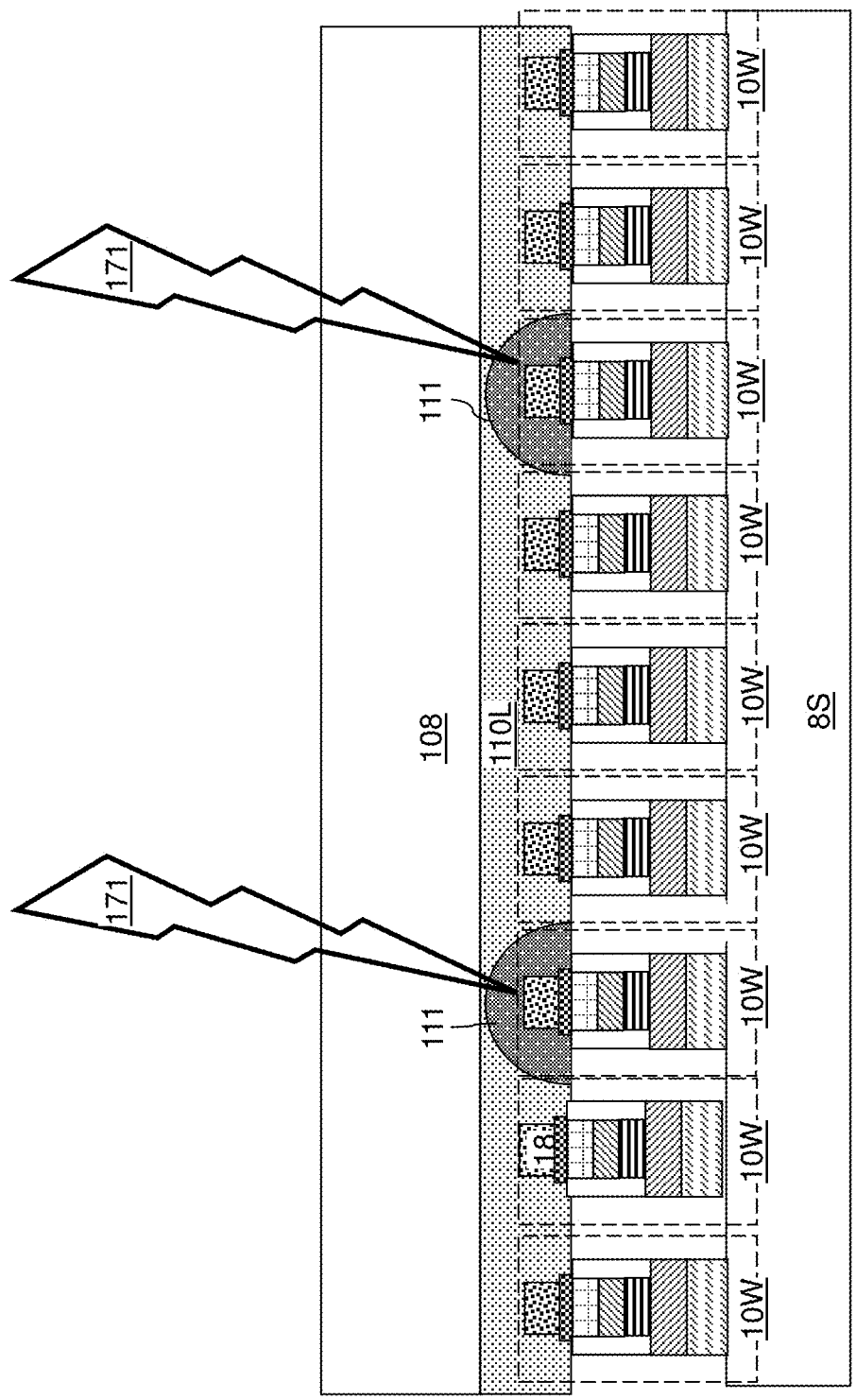
FIG. 16B illustrates an assembly of the first repair source substrate, the array of first LEDs, selectively laser-bonded temporary adhesive portions embedded in the temporary adhesive layer, and the first carrier substrate according to an embodiment of the present disclosure.
Figure 16C:
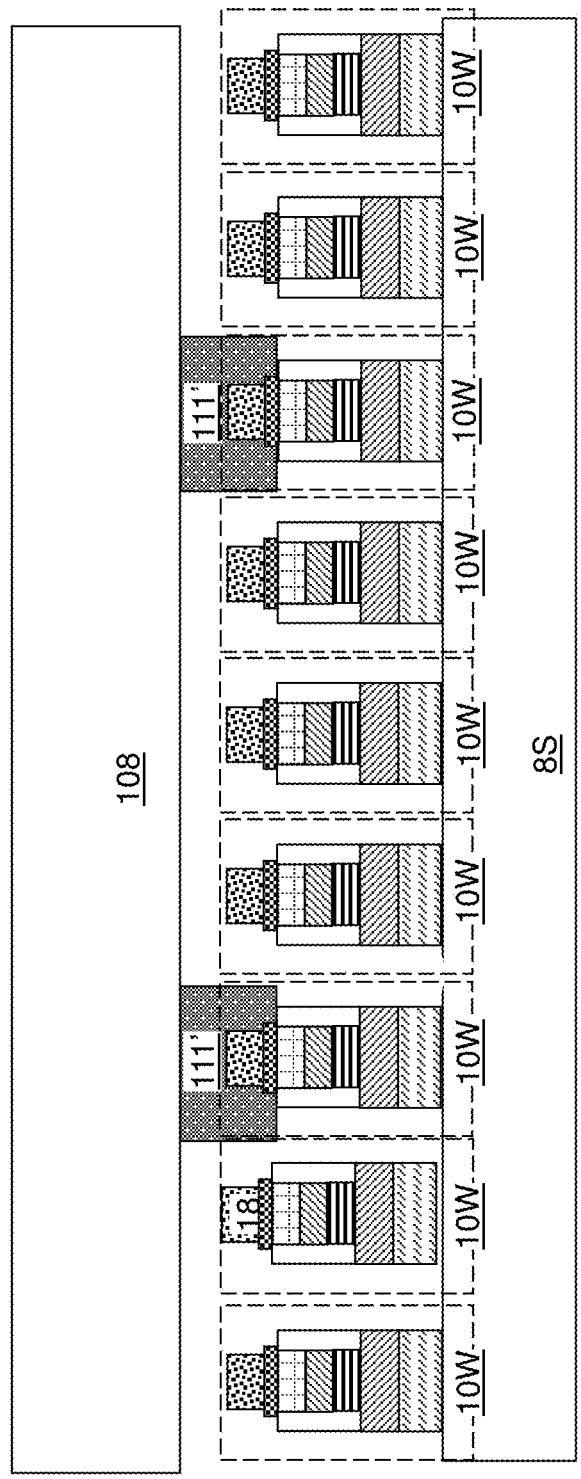
FIG. 16C illustrates an assembly of the first repair source substrate, the array of first LEDs, discrete thermally-cured temporary adhesive portions, and the first carrier substrate according to an embodiment of the present disclosure.

Referring to FIGS. 16A-16C, a selected subset of the repair LEDs 10W is attached to a respective cured portion of the temporary adhesive layer 110L. The pattern of the selected subset of the repair LEDs 10W on the first repair source substrate 8S (as seen from the direction of the repair LEDs 10W toward the first repair source substrate 8S) can be the mirror image of the pattern of the vacancy locations on the light emitting device under repair (as seen from the direction of the LEDs toward a backplane 401), i.e., the light emitting device including at least one missing LED 10R, 10G, and/or 10B. An assembly of the first repair source substrate 8S, the array of repair LEDs 10W thereupon, at least one thermally cured portion of the temporary adhesive layer 110L, and the first carrier substrate 108 is formed.

Generally, a light emitting device in which all subpixels emit light (i.e., are not defective in the sense that they emit light when they are turned on) and in which the light emitted by the subpixels is provided in a target range (e.g., desired peak wavelength range, luminescence intensity range, etc.) is an adequately functioning light emitting device which does not require any repair. Repair of a light emitting device is needed only where the light emitting device includes at least one subpixel that does not emit light when it is turned on (e.g., because an LED is missing or non-functioning in a given subpixel) or emits light outside the target range. Each light emitting device can be tested using an optical testing device to determine if each subpixel within the light emitting device emits light within a respective target range. If any one subpixel is defective, for example, either by not emitting light when it is turned on (e.g., because the LED in the subpixel is missing or not properly bonded) or by emitting light outside the respective target range, then the defective pixel or pixels in the tested light emitting device is flagged for repair, and a set of maps for defective subpixels is generated, such as by using image processing software.

Each set of maps can include a first defect map that marks the coordinates of defective first-type subpixels (due to defective first (e.g., blue) LEDs 10B), a second defect map that marks the coordinates of defective second-type subpixels (due to defective second (e.g., green) LEDs 10G), a third defect map that marks the coordinates of defective third-type subpixels (due to defective third (e.g., red) LEDs 10R). Vacancy (e.g., vacant) LED mounting sites in the tested light emitting device may be provided by design in the form of extra spaces in some or all subpixels for bonding a repair LED 10W, may be provided when a LED is unintentionally or intentionally omitted at a bonding site in a subpixel and/or may be formed by removal of a defective LEDs based on the set of maps generated from the testing. The pattern of the selected subset of the repair LEDs 10W on the first repair source substrate 8S can be the mirror image of the pattern of defective subpixels. The defective subpixels may include any of the LEDs 10B, 10G and/or 10R.

Referring to FIG. 16A, a first configuration of the assembly is shown, in which the at least one thermally cured portion of the temporary adhesive layer 110L comprises the entire thermally-cured temporary adhesive layer 111L. The thermally cured temporary adhesive layer 111L is derived from the temporary adhesive layer 110L of FIG. 15 by pressing the first carrier substrate 108 toward the array of repair LEDs 10W, such that the array of repair LEDs 10W is pushed within a bottom portion of the temporary adhesive layer 110L, and subsequently annealing the temporary adhesive layer 110L at a bonding temperature, i.e., a temperature within the bonding temperature range, of the temporary adhesive layer 110L. The alignment marks can be used to position the repair LEDs 10W at the desired location. In one embodiment, top portions of the repair LEDs 10W can be embedded within bottom portions of the temporary adhesive layer 110L. The protrusion depth of the top portions of the repair LEDs 10W into the temporary adhesive layer 110L, and thus, into the thermally-cured temporary adhesive layer 111L, can be within a range from 10% to 100% of the thickness of the thermally-cured temporary adhesive layer 111L (which can be, for example, in a range from 20 microns to 160 microns). The entirety of the temporary adhesive layer 110L can be cured at a curing temperature, i.e., the bonding temperature, in a furnace. Thus, each cured portion of the temporary adhesive layer 110L comprises a portion of the thermally-cured temporary adhesive layer 111L. The entire set of cured portions of the temporary adhesive layer 110L constitutes the thermally-cured temporary adhesive layer 111L.

Referring to FIG. 16B, a second configuration of the assembly is shown, in which the at least one thermally cured portion of the temporary adhesive layer 110L comprises selectively laser-bonded temporary adhesive portions 111 embedded in the temporary adhesive layer 110L. The first carrier substrate 108 is pressed toward the array of repair LEDs 10W such that the array of repair LEDs 10W is pushed within a bottom portion of the temporary adhesive layer 110L. In one embodiment, top portions of the repair LEDs 10W can be embedded within bottom portions of the temporary adhesive layer 110L. The protrusion depth of the top portions of the repair LEDs 10W into the temporary adhesive layer 110L, and thus, into the thermally-cured temporary adhesive layer 111L, can be within a range from 10% to 100% of the thickness of the thermally-cured temporary adhesive layer 111L (which can be, for example, in a range from 20 microns to 160 microns). A laser beam 171 is employed to irradiate the device-side solder material portions 18 and/or the temporary adhesive layer 110L on top of the selected subset of the repair LEDs 10W through the transparent first carrier substrate 108 using alignment marks for position of the irradiation. In one embodiment, the laser beam 171 can be provided by a heating laser generating a laser beam having an infrared wavelength. For example, the heating laser can be a visible or infra-red laser having a wavelength in a range from 0.4 micron to 20 microns, such as 1 to 2 microns. The power of the laser beam 171 and the duration of laser irradiation at each selected repair LEDs 10W can be selected such that the irradiated portions of the temporary adhesive layer 110L are cured at a curing temperature, i.e., at a bonding temperature, if the temporary adhesive layer 110L is a thermoset adhesive layer or to melt the solder material portion 18 to bond it to the temporary adhesive layer 110L. Thus, each irradiated portion of the temporary adhesive layer 110L becomes a laser-bonded temporary adhesive portion 111. Generally, at least one portion of the temporary adhesive layer 110L can be selectively laser-heated, and each cured portion of the temporary adhesive layer 110L comprises a respective laser-heated portion of the temporary adhesive layer 110L. The pattern of the selectively laser-bonded temporary adhesive portions 111 can be the mirror image of the vacancy locations within the array of repair LEDs 10W in the light emitting device under repair. The laser-bonded temporary adhesive portions 111 are embedded within uncured portions of the temporary adhesive layer 110L.

Referring to FIG. 16C, a third configuration of the assembly is shown, in which the at least one thermally cured portion of the temporary adhesive layer 110L comprises discrete thermally-cured temporary adhesive portions 111'. In this case, at least one temporary adhesive portion can be formed by patterning temporary adhesive layer 110L using the alignment marks to select the portions to pattern. For example, a photoresist layer (not shown) can be applied over the top surface of the temporary adhesive layer 110L while the first carrier substrate 108 positioned below the temporary adhesive layer 110L. The photoresist layer can be lithographically patterned with the same pattern as the pattern of the vacancy locations within the light emitting device under repair. Portions of the temporary adhesive layer 110L that are not covered by the patterned photoresist layer can be removed by an etch process, which may comprise an anisotropic etch process (such as a reactive ion etch process) or an isotropic etch process (such as a wet etch process). The photoresist layer can be subsequently removed, for example, by dissolving in a solvent. The remaining portions of the temporary adhesive layer 110L constitutes the at least one temporary adhesive portion, which may comprise a plurality of temporary adhesive portions. The first carrier substrate 108 is pressed toward the array of repair LEDs 10W such that the array of repair LEDs 10W is pushed within a bottom portion of a respective temporary adhesive portion.

In one embodiment, top portions of the repair LEDs 10W can be embedded within bottom portions of the temporary adhesive layer 110L. The protrusion depth of the top portions of the first LEDs 10B into the at least one temporary adhesive portion, and thus, into the discrete thermally-cured temporary adhesive portions 111', can be within a range from 10% to 100% of the thickness of each temporary adhesive portion (which can be, for example, in a range from 20 microns to 160 microns). Generally, at least one temporary adhesive portion can be thermally cured in a furnace. Each cured portion of the temporary adhesive layer 110L can be formed by thermally curing a respective temporary adhesive portion. Less than the entirety of the temporary adhesive layer 110L can be cured at the curing temperature, i.e., the bonding temperature. Each cured portion of the temporary adhesive layer 110L comprises a respective discrete thermally-cured temporary adhesive portion 111'.

Figure 17A:
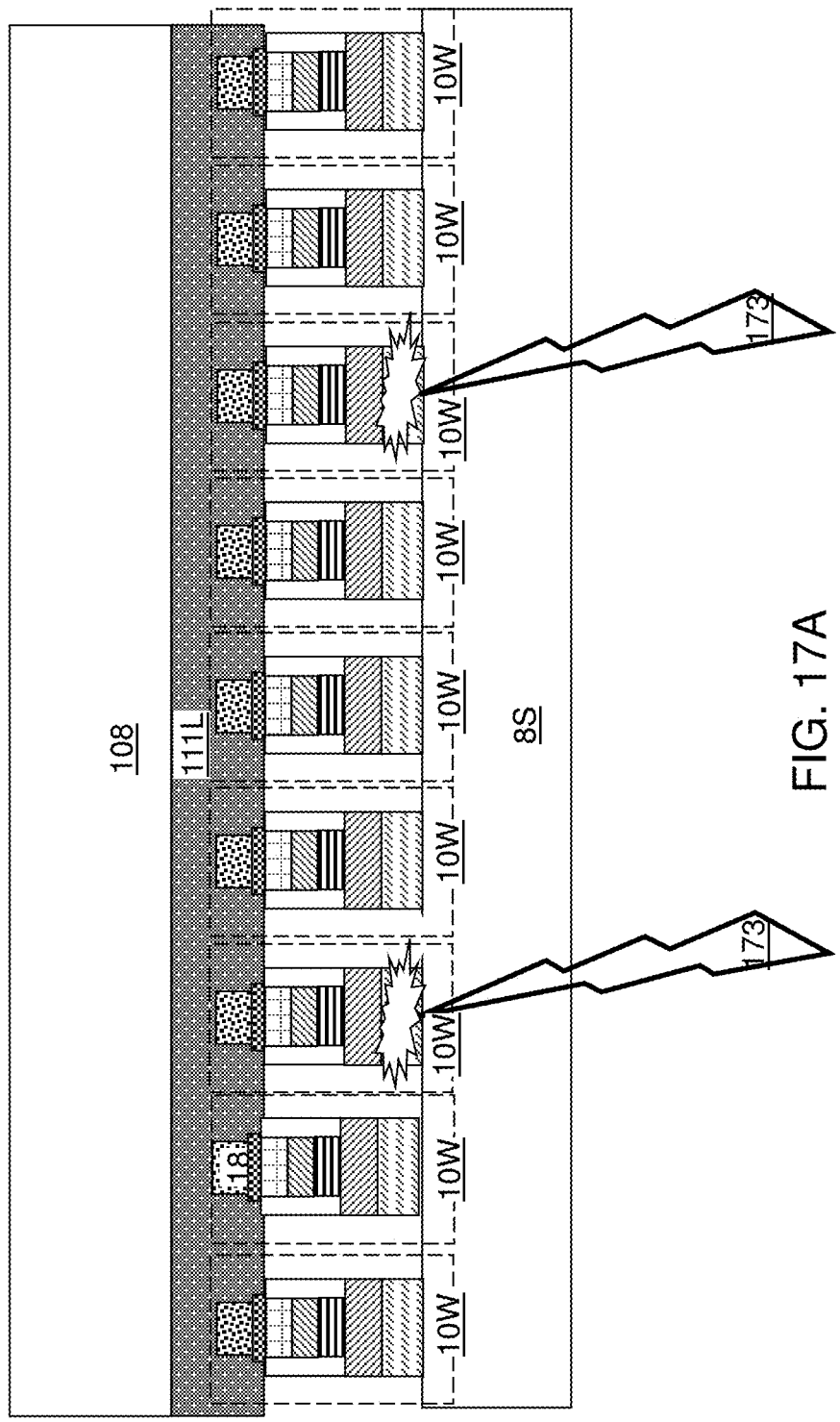
FIG. 17A illustrates the assembly of the first carrier substrate, the thermally-cured temporary adhesive layer, and the array of first LEDs during detachment of repair LEDs from the first repair source substrate according to an embodiment of the present disclosure.
Figure 17B:
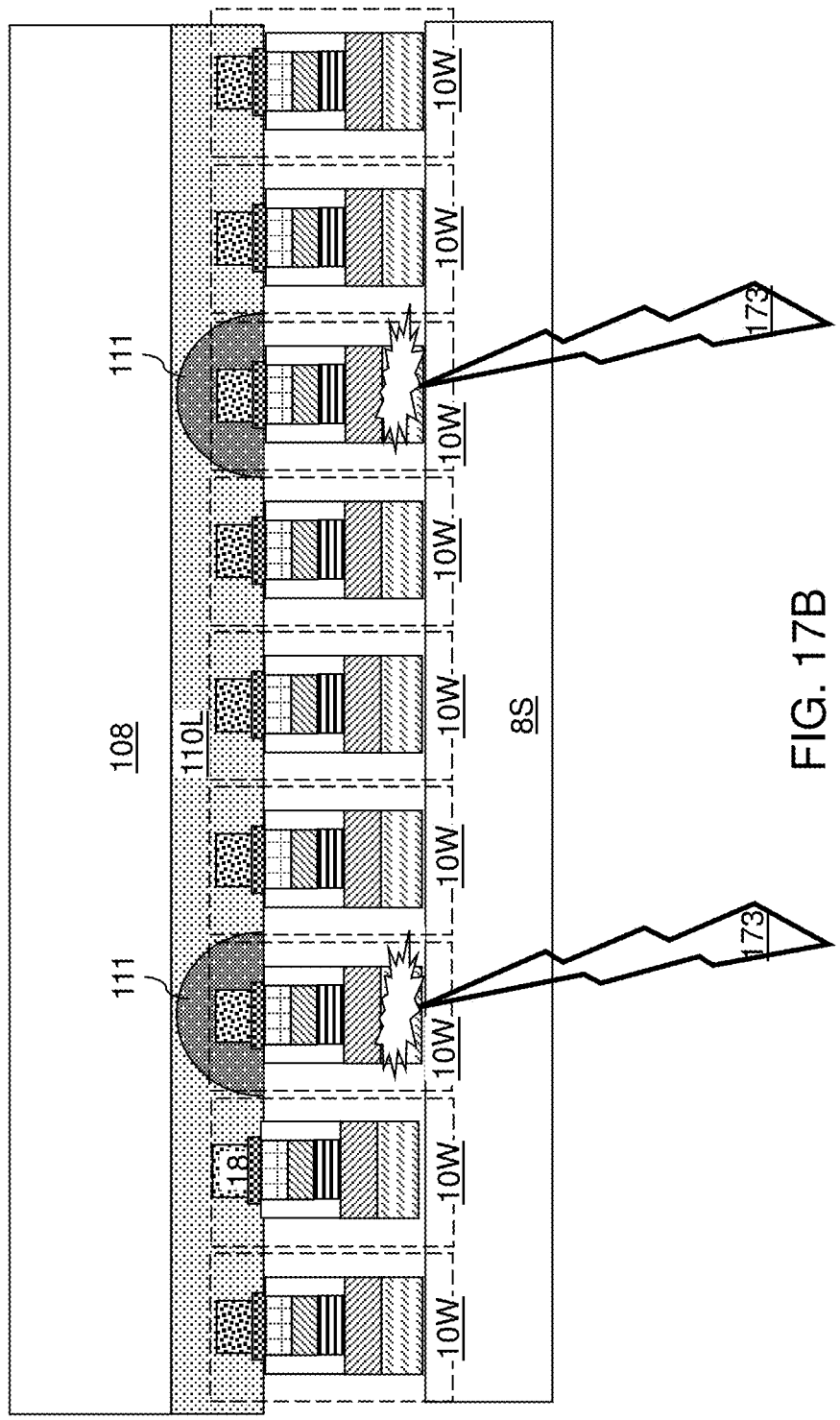
FIG. 17B illustrates the assembly of the first carrier substrate, the selectively laser-bonded temporary adhesive portions embedded in the temporary adhesive layer, and the array of first LEDs during detachment of repair LEDs from the first repair source substrate according to an embodiment of the present disclosure.
Figure 17C:
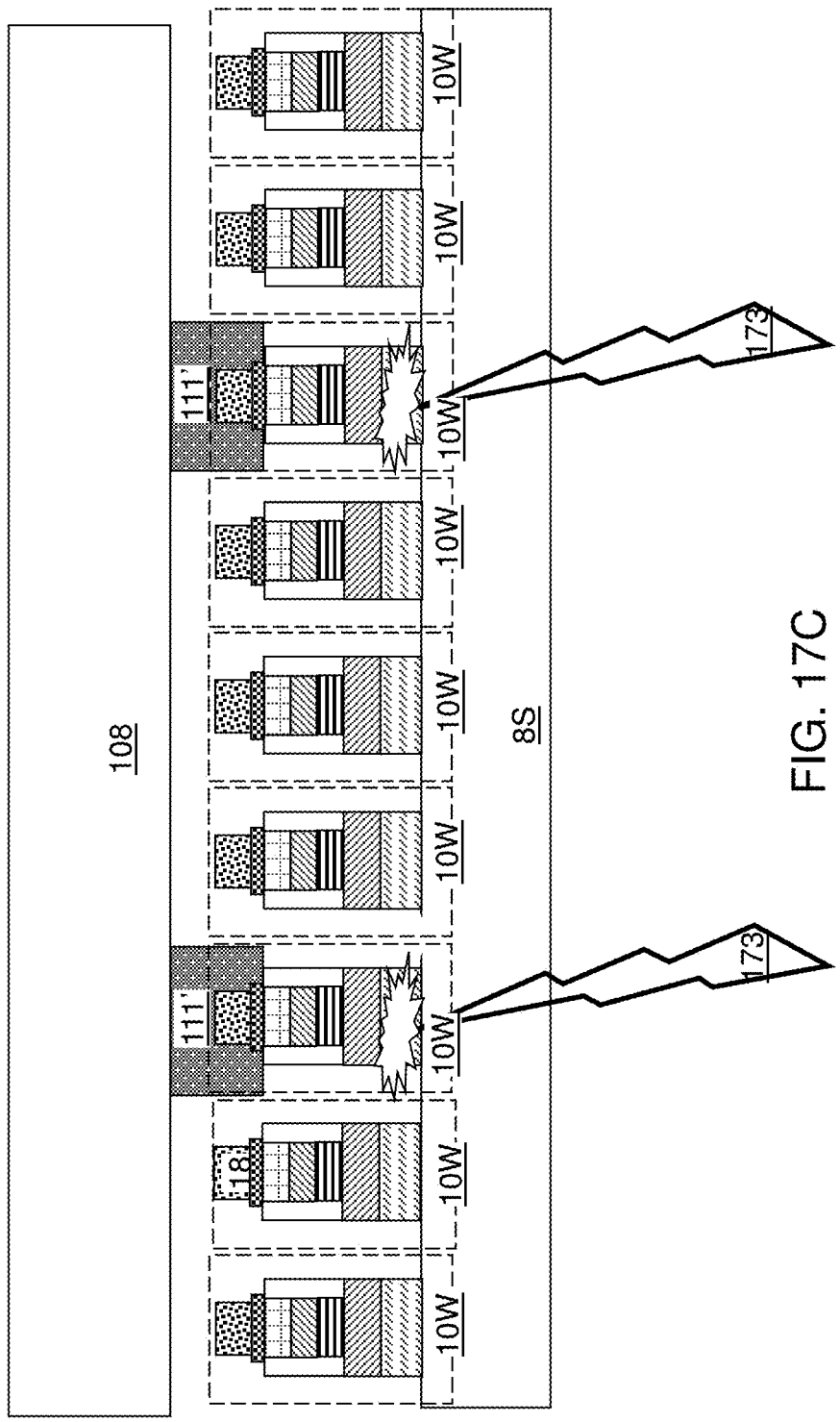
FIG. 17C illustrates the assembly of the first carrier substrate, the discrete thermally-cured temporary adhesive portions, and the array of first LEDs during detachment of repair LEDs from the first repair source substrate according to an embodiment of the present disclosure.

FIGS. 17A-17C illustrate a respective subsequent processing step for the configurations of FIGS. 16A-16C, respectively, in which a laser irradiation process is employed to detach selected repair LEDs 10W that need to be transferred from the first repair source substrate 8S to the first carrier substrate 108. As discussed above, the pattern of the selected repair LEDs 10W may correspond to the pattern of vacancy locations in the light emitting device under repair.

Referring to FIG. 17A, the selected repair LEDs 10W are detached from the first repair source substrate 8S by selectively irradiating a bottom end of each of the selected repair LEDs 10W with a laser beam 173. In one embodiment, the laser beam 173 can pass through the first repair source substrate 8S before impinging on the bottom end of each of the selected repair LEDs 10W. The wavelength of the laser beam 173 can be provided by an ablation laser, and can be different (e.g., shorter) from the wavelength of the heating laser. The wavelength of the ablation laser can be, for example between 0.1 and 0.75 micron, such as 0.25 to 0.5 micron. In one embodiment, the wavelength of the ablation laser can be within an ultraviolet range, i.e., within a range from 10 nm to 400 nm. The laser beam 173 can sequentially dissociate the selected repair LEDs 10W from the first repair source substrate 8S. In one embodiment, the selected repair LEDs 10W are a subset of the repair LEDs 10W that correspond to the vacancy locations, as will be described in more in detail below.

Referring to FIG. 17B, the selected repair LEDs 10W are detached from the repair source substrate 8S by irradiating with a laser beam 173 a bottom end of each of the selected repair LEDs 10B that is bonded to the first carrier substrate 108. In this case, each selected repair LED 10W adjoining a respectively selectively laser-bonded temporary adhesive portion 111 can be detached from the repair source substrate 8S.

Referring to FIG. 17C, repair LEDs 10W are selectively detached from the repair source substrate 8S by selectively irradiating with a laser beam 173 a bottom end of each of the first repair LEDs 10W that is bonded to the first carrier substrate 108. In this case, each first repair LEDs 10W adjoining respective discrete thermally-cured temporary adhesive portion 111' can be detached from the first repair source substrate 8S.

Figure 18A:
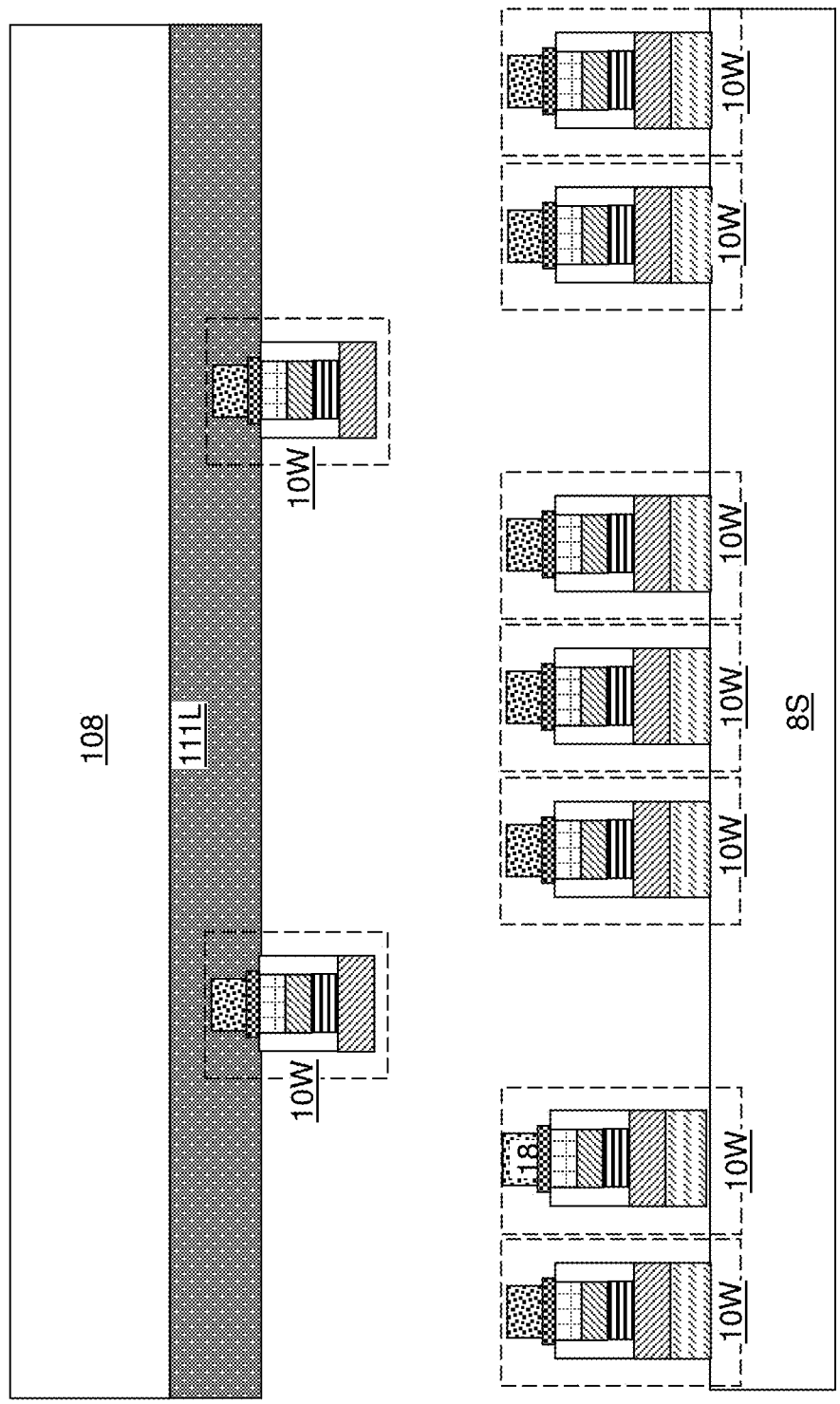
FIG. 18A illustrates the assembly of the first carrier substrate, the thermally-cured temporary adhesive layer, and the repair LEDs after detachment from the first repair source substrate according to an embodiment of the present disclosure.

Referring to FIGS. 18A-18C, the assembly of the first carrier substrate 108, cured temporary adhesive portions (111L, 111, 111'), and one or more repair LEDs 10W can be detached from the repair source substrate 8S by lifting the assembly away from the repair source substrate 8S. The selected repair LEDs 10W comprise a subset of the array of repair LEDs 10W as originally provided on the first repair source substrate 8S. Each of the selected repair LEDs 10W is attached to the first carrier substrate 108 through a respective cured portion of the temporary adhesive layer 110L. The cured portion(s) of the temporary adhesive layer 110L can be the thermally-cured temporary adhesive layer 111L (as illustrated in the first configuration of FIG. 18A), the selectively laser-bonded temporary adhesive portions 111 embedded in the temporary adhesive layer 110L (as illustrated in the second configuration of FIG. 18B), or as the discrete thermally-cured temporary adhesive portions 111' (as illustrated in the third configuration of FIG. 18C). The assembly of the first carrier substrate 108, cured temporary adhesive portions (111L, 111, 111'), and the repair LEDs 10W can have the same pattern as the vacancy pattern of the light emitting device under repair.

Figure 19:
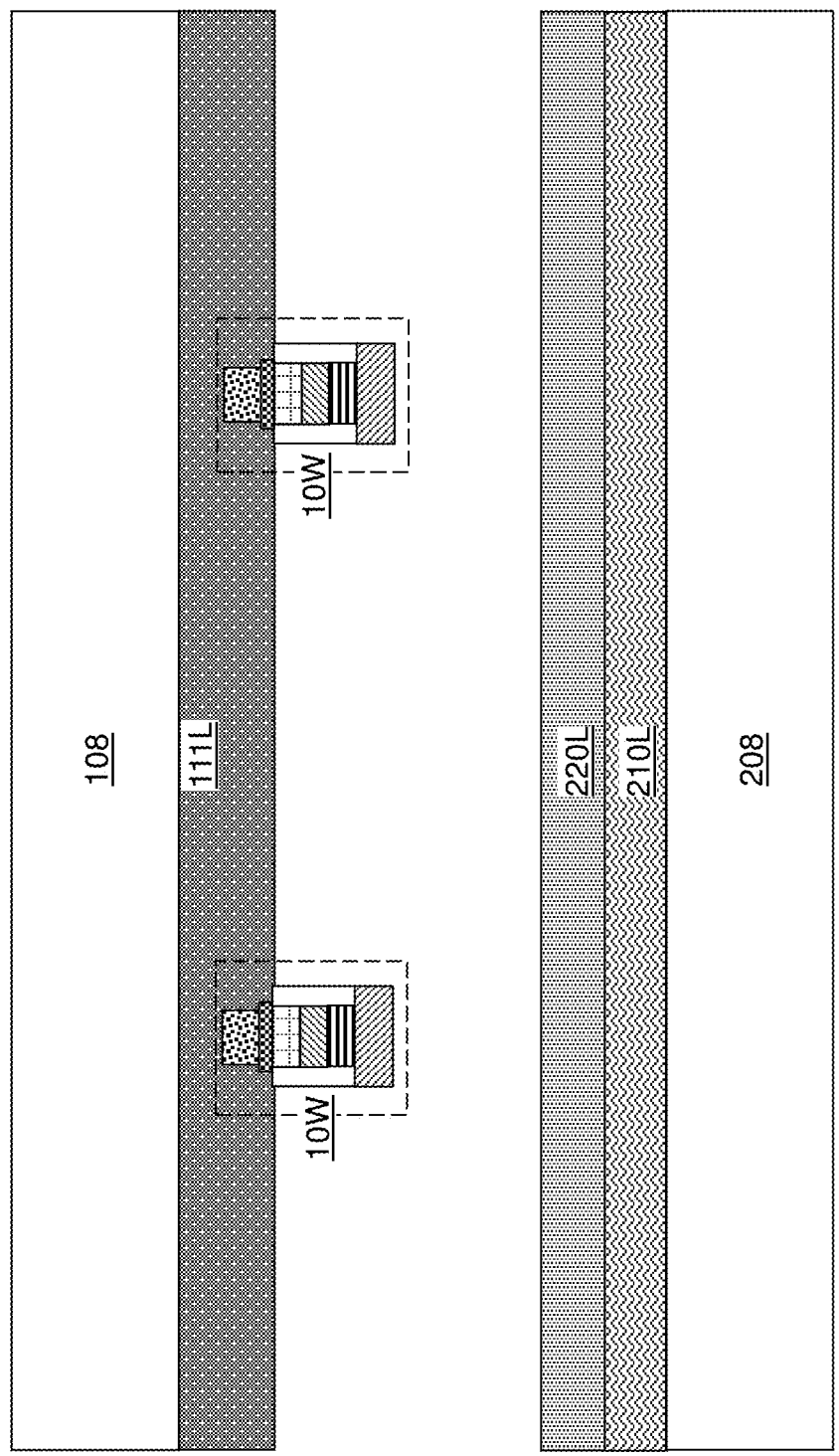
FIG. 19 illustrates the assembly of the first carrier substrate, the thermally-cured temporary adhesive layer, and the repair LEDs after placement over a layer stack including a second carrier substrate, a backside release layer, and a temporary bonding layer according to an embodiment of the present disclosure.
Figure 20:
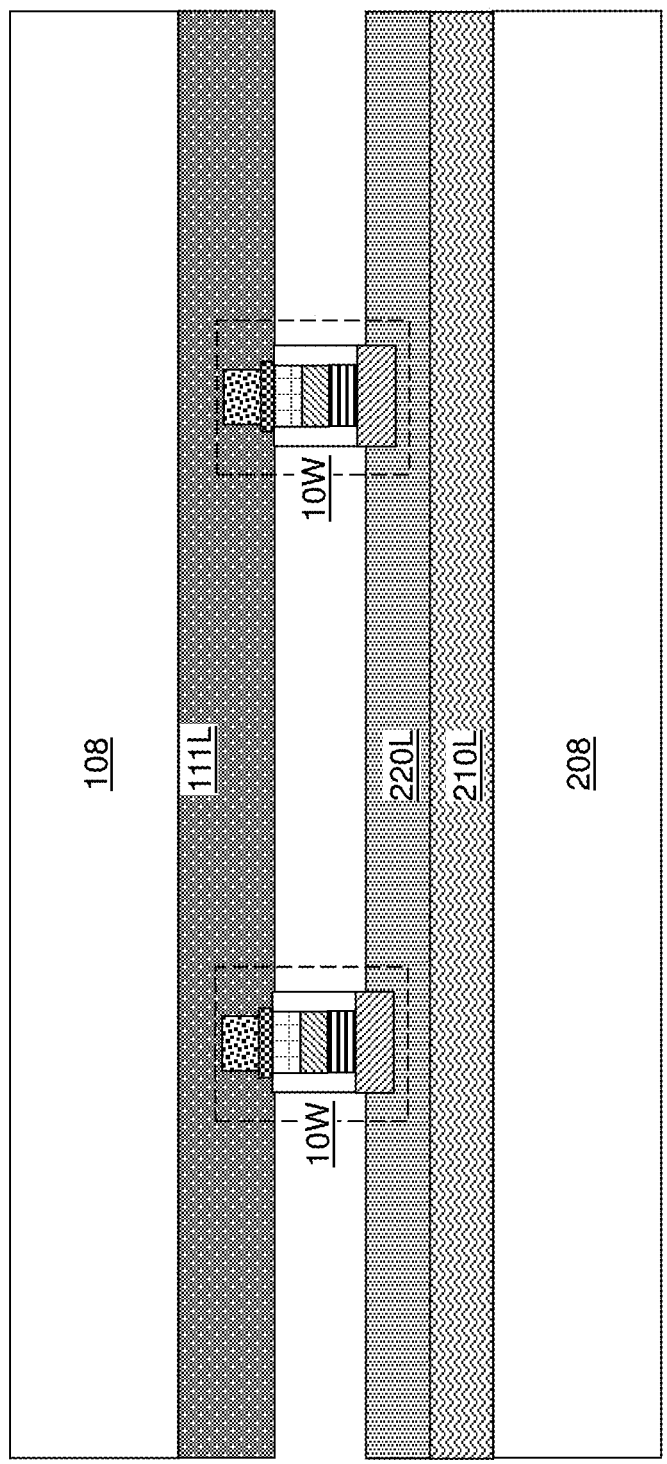
FIG. 20 illustrates the assembly of the first carrier substrate, the thermally-cured temporary adhesive layer, the repair LEDs, and the layer stack of the second carrier substrate, the backside release layer, and the temporary bonding layer according to an embodiment of the present disclosure.

FIGS. 19 and 20 illustrate only the adhesive portion 111L for brevity. However, it should be understood that the steps in FIGS. 19 and 20 also apply to the adhesive portions 111 and 111'. Referring to FIG. 19, a layer stack including a second carrier substrate 208, a backside release layer 210L, and a temporary bonding layer 220L is provided. The layer stack can be formed, for example, by providing a second carrier substrate 208, forming the backside release layer 210L on the second carrier substrate 208, and forming the temporary bonding layer 220L above, and on, the backside release layer 210L. The second carrier substrate 208 can be any substrate with a planar surface, and can include an insulating material, a conductive material, a semiconducting material, or a combination thereof. Preferably, the second carrier substrate 208 is transparent (e.g., at least 80% transparent) to laser radiation, such as infrared, visible or ultraviolet radiation, and can comprise a material such as glass or sapphire The backside release layer 210L can be formed over a planar surface of the second carrier substrate 208 by spin-coating. In one embodiment, the backside release layer 210L comprises an adhesive material that can be released by laser irradiation, such as an excimer laser. For example, the backside release layer 210L comprises a material that is thermally stable, and adheres to the temporary bonding layer, at least up to 350 degrees Celsius. In one embodiment, the backside release layer 210L comprises a material that absorbs at least 80% of light within a wavelength in a range from 240 nm to 360 nm. The backside release layer 210L is thermally stable up to a decomposition temperature, which can be higher than the decomposition temperature of the material of the cured portions of the temporary adhesive layer 110L. The backside release layer 210L can have a thickness in a range from 100 microns to 300 microns, although lesser and greater thicknesses can also be employed. In an illustrative example, the backside release layer 210L can include a commercially available adhesive material, such as BrewerBOND® 701, which is an excimer laser release material that generates a minimal level of stress. BrewerBOND® 701 is thermally stable up to 350° C. BrewerBOND® 701 can be debonded by laser irradiation with a laser beam having a wavelength in a range from 240 nm to 360 nm In one embodiment, the backside release layer 210L may be an organic or inorganic polymer layer that can be dissolved in a solvent. For example, the backside release layer 210L may be a non-photosensitive organic polymer layer that can be dissolved in an organic solvent. In this case, the entirety of the backside release layer 210L may be dissolved in a solvent in a subsequent release process. In another embodiment, the backside release layer 210L may be a photosensitive organic polymer layer that has an enhanced solubility upon irradiation with a radiation beam, such as a laser beam, which may be in an ultraviolet range or in an infrared range. In this case, subsequent irradiation with the radiation (e.g., laser) beam can facilitate dissolution of the backside release layer 210L in a subsequent dissociation process, which can selectively remove laser-irradiated portions of the backside release layer 210L at a higher dissolution rate than unirradiated portions of the backside release layer 210L.

The temporary bonding layer 220L includes an adhesive material, which can be effective upon application and curing at room temperature or at an elevated temperature. The temporary bonding layer 220L is thermally stable throughout the first debonding temperature range, and thermally decomposes only at a decomposition temperature that is above the first debonding temperature range. In one embodiment, the temporary bonding layer 220L can be cured at a second bonding temperature range to provide full adhesion strength, and can have a second debonding temperature range at which debonding occurs. The second debonding temperature range can be higher than the first bonding temperature range of the temporary adhesive layer 110L, and can be lower than the decomposition temperature of the temporary adhesive layer 110L. In one embodiment, the temporary bonding layer 220L is thermally stable at least up to 250 degrees Celsius, and decomposes at, or above, a decomposition temperature that is above 250 degrees Celsius, which may be above 300 degrees Celsius. In one embodiment, the temporary bonding layer 220L can be thermally stable at least up to 300 degrees Celsius, and can decompose at a lower temperature than the backside release layer 210L. In one embodiment, the temporary bonding layer 220L can be thermally stable at least up to the debonding temperature of the temporary adhesive layer 110L, i.e., the upper limit of the first debonding temperature range of the temporary adhesive layer 110L. In one embodiment, the temporary bonding layer 220L can have a thickness in a range from 20 microns to 160 microns.

In an illustrative example, the temporary bonding layer 220L can include a commercially available adhesive material, BrewerBOND® 301. BrewerBOND® 301 material enables backside temperature processing up to 300° C. with minimal device wafer bowing. BrewerBOND® 305 may be debonded by applying a sheer force at room temperature from an underlying material layer, or may be debonded from a backside release layer such as a layer of BrewerBOND® 701 by laser irradiation.

Referring to FIG. 20, the first carrier substrate 108 and the second carrier substrate 208 can be pressed toward each other with one or more repair LEDs 10W therebetween. Each bottom portion of the repair LEDs 10B is pushed within a respective upper portion of the temporary bonding layer 220L. The temporary bonding layer 220L can be subsequently annealed at a bonding temperature within the second temperature range of the temporary bonding layer 220L. In one embodiment, bottom portions of the first repair LEDs 10W can be embedded within upper portions of the temporary bonding layer 220L. The protrusion depth of the bottom portions of the first repair LEDs 10W into the temporary bonding layer 220L can be within a range from 10% to 100% of the thickness of the temporary bonding layer 220L. The entirety of the temporary bonding layer 220L can be cured at a curing temperature, i.e., the bonding temperature. Each of the repair LEDs 10W can be attached to the temporary bonding layer 220L.

Figure 21A:
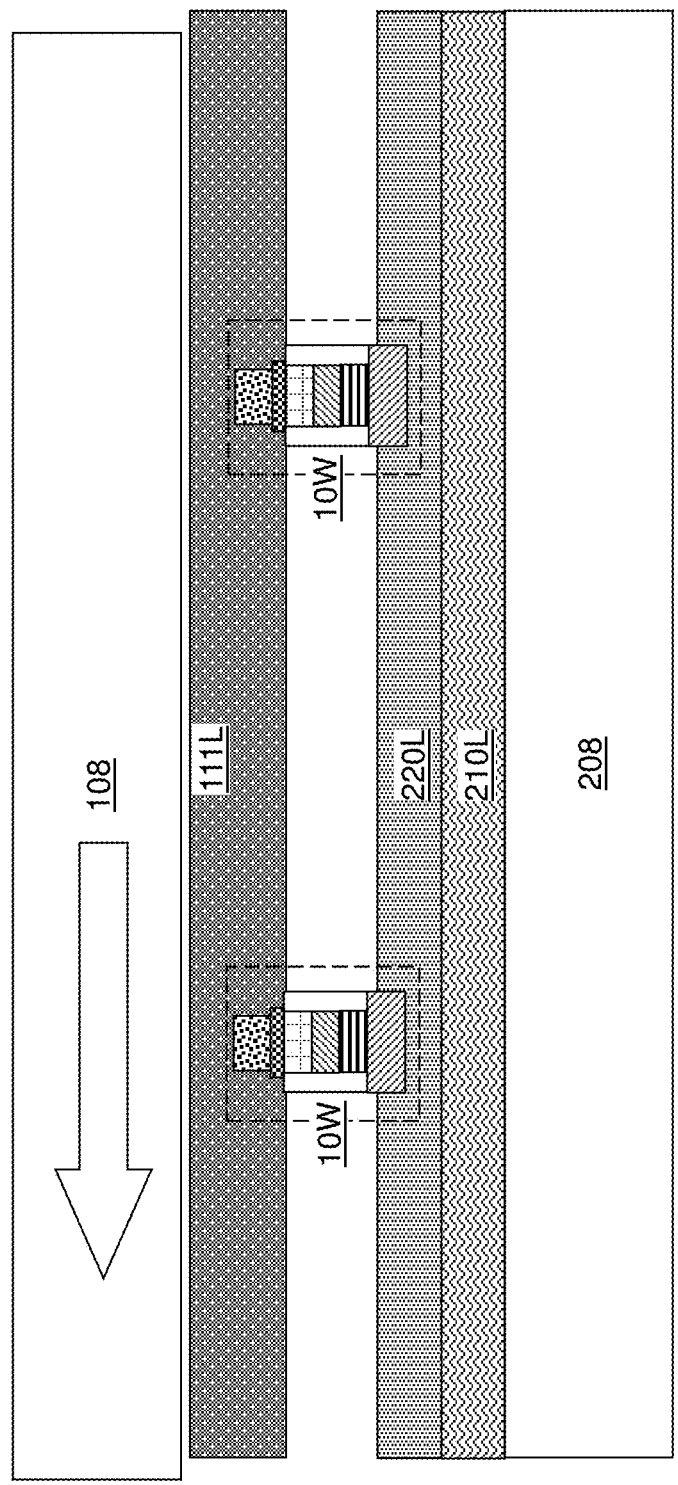
FIG. 21A illustrates the assembly of the thermally-cured temporary adhesive layer, the repair LEDs, and the layer stack of the second carrier substrate, the backside release layer, and the temporary bonding layer after detaching the first carrier substrate according to an embodiment of the present disclosure.
Figure 21B:
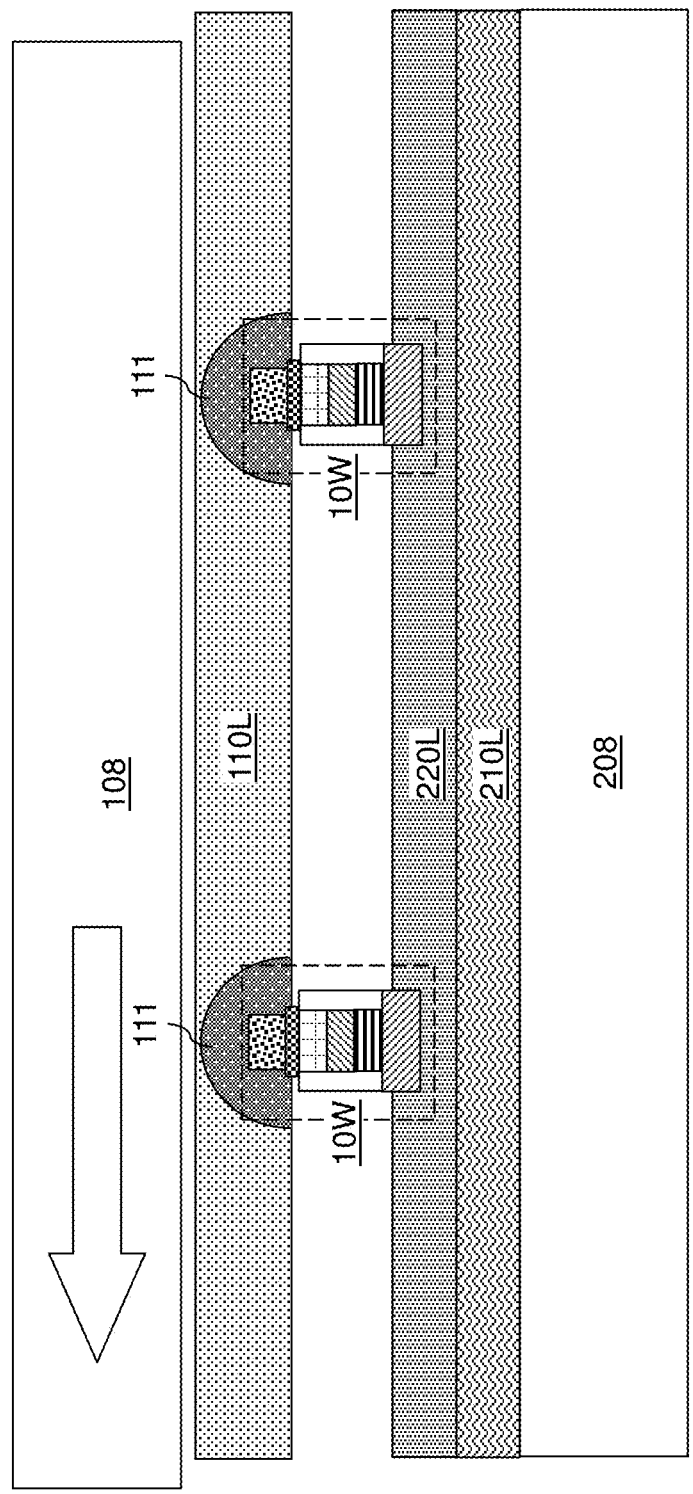
FIG. 21B illustrates the assembly of the selectively laser-bonded temporary adhesive portions embedded in the temporary adhesive layer, the repair LEDs, and the layer stack of the second carrier substrate, the backside release layer, and the temporary bonding layer after detaching the first carrier substrate according to an embodiment of the present disclosure.
Figure 21C:
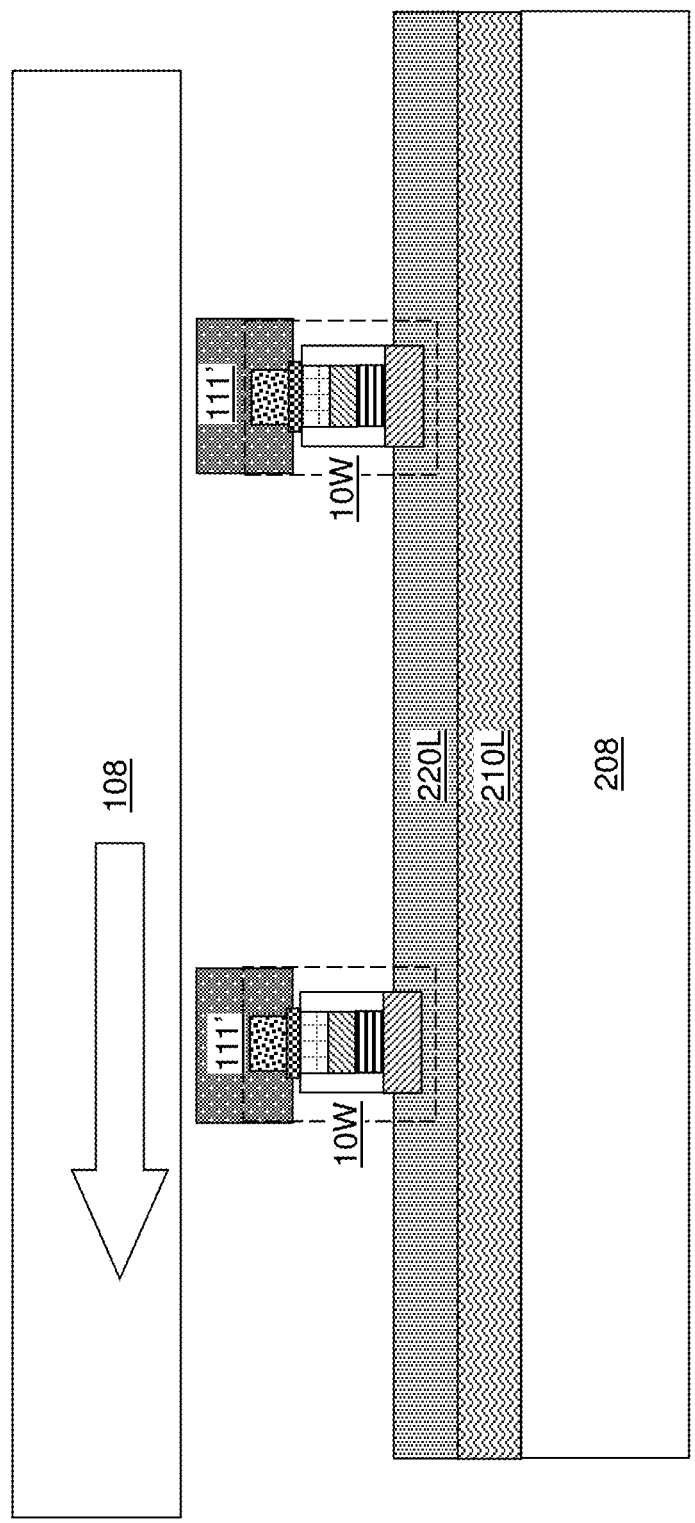
FIG. 21C illustrates the assembly of the thermally-cured temporary adhesive portions, the repair LEDs, and the layer stack of the second carrier substrate, the backside release layer, and the temporary bonding layer after detaching the first carrier substrate according to an embodiment of the present disclosure.

Referring to FIGS. 21A-21C, the first carrier substrate 108 can be detached from each cured portion of the temporary adhesive layer 110L, which may be the thermally-cured temporary adhesive layer 111L (as illustrated in the first configuration of FIG. 21A), the selectively laser-bonded temporary adhesive portions 111 embedded in the temporary adhesive layer 110L (as illustrated in the second configuration of FIG. 21B), or as the discrete thermally-cured temporary adhesive portions 111' (as illustrated in the third configuration of FIG. 21C). In one embodiment, detachment of the first carrier substrate 108 from each cured portion of the temporary adhesive layer 110L can be performed by elevating the temperature of the first carrier substrate 108 and each cured portion of the temporary adhesive layer 110L above the debonding temperature of the temporary adhesive layer 110L, i.e., above the maximum temperature of the second debonding temperature range at which the cured portion(s) (111L, 111, 111') of the temporary adhesive layer 110L thermally decompose(s). In this case, the decomposition temperature of the temporary bonding layer 220L and the decomposition temperature of the backside release layer 210L can be higher than the decomposition temperature of the temporary bonding layer 220L.

For example, the assembly of the cured portion(s) of the temporary adhesive layer (111L, 111, 111'), the first repair LEDs 10W, and the layer stack of the second carrier substrate 208, the backside release layer 210L, and the temporary bonding layer 220L can be detached from the first carrier substrate 108 by pushing the first carrier substrate 108 sideways after subjecting the cured portion(s) of the temporary adhesive layer (111L, 111, 111') to a temperature above the decomposition temperature (i.e., a minimum temperature at which the material of the cured portion(s) of the temporary adhesive layer (111L, 111, 111') decomposes). The pattern of the at least one first repair LEDs 10W on the second carrier substrate 208 can be a mirror image of the pattern of the vacancy locations of the light emitting device under repair.

Figure 22:
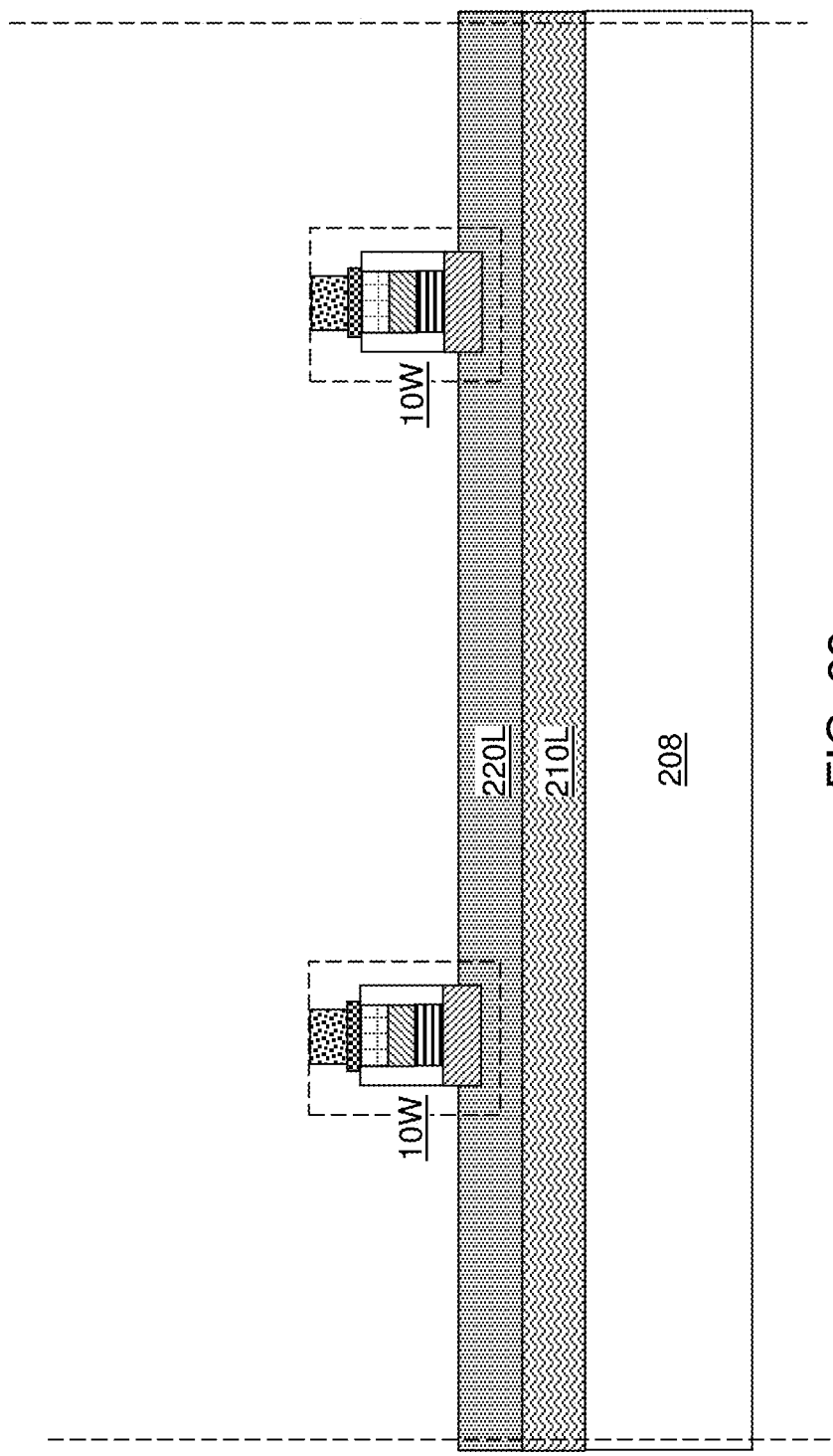
FIG. 22 illustrates the assembly of the repair LEDs, and the layer stack of the second carrier substrate, the backside release layer, and the temporary bonding layer after optional dicing of the assembly into multiple coupons according to an embodiment of the present disclosure.

Referring to FIG. 22, each cured portion of the temporary adhesive layer (111L, 111, 111') can be removed from the repair LEDs 10W. In one embodiment, removal of each cured portion of the temporary adhesive layer (111L, 111, 111') can be performed by dissolution in a solvent that selectively dissolves the material of the cured portion of the temporary adhesive layer (111L, 111, 111') without dissolving the material of the temporary bonding layer 220L. For example, an alpha-olefin-based solvent can be employed to dissolve the material of the cured portion of the temporary adhesive layer (111L, 111, 111') without dissolving the material of the temporary bonding layer 220L. An illustrative example of the alpha-olefin-based solvents is 1-dodecene ($C_{10}H_{21}CH=CH_2$).

Optionally, the assembly of the assembly of the cured portion(s) of the temporary adhesive layer (111L, 111, 111'), the repair LEDs 10W, and the layer stack of the second carrier substrate 208, the backside release layer 210L, and the temporary bonding layer 220L may be singulated, for example, by dicing or laser scribing, In this case, a diced unit that is subsequently employed to transfer the at least one first repair LEDs 10W to the light emitting device under repair is herein referred to as a repair coupon, or a "coupon."

Figure 23:
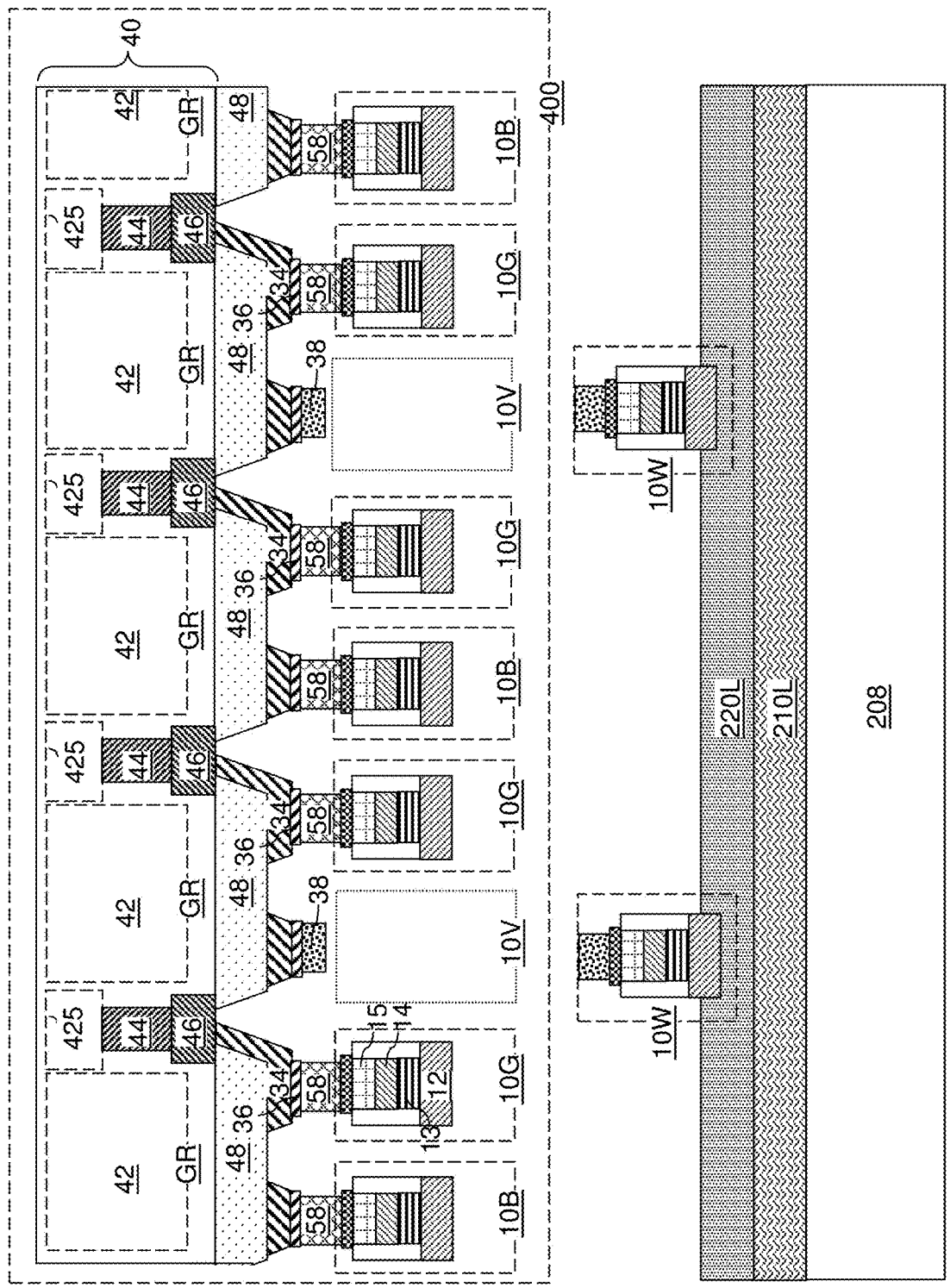
FIG. 23 illustrates a direct view device with missing LEDs and the assembly of the repair LEDs, and the layer stack of the second carrier substrate, the backside release layer, and the temporary bonding layer after alignment according to an embodiment of the present disclosure.

Referring to FIG. 23, a light emitting device under repair can be disposed over the assembly of selected repair LEDs 10W, the temporary bonding layer 220L, the backside release layer 210L, and the second carrier substrate 208 such that vacancy locations 10V in the light emitting device directly overlie a respective first repair LEDs 10W. The pattern of the repair LEDs 10W on the second carrier substrate 208 can be the mirror image of the pattern of the vacancy locations of the light emitting device under repair.

In one embodiment, the light emitting device under repair can be a direct view device 400 with missing LEDs at the vacancy locations. The assembly of the repair LEDs 10W and the layer stack of the second carrier substrate 208, the backside release layer 210L, and the temporary bonding layer 220L can be aligned to the vacancy locations on the direct view device 400 such that each of the repair LEDs 10W directly underlies a respective vacancy location 10V.

Figure 24:
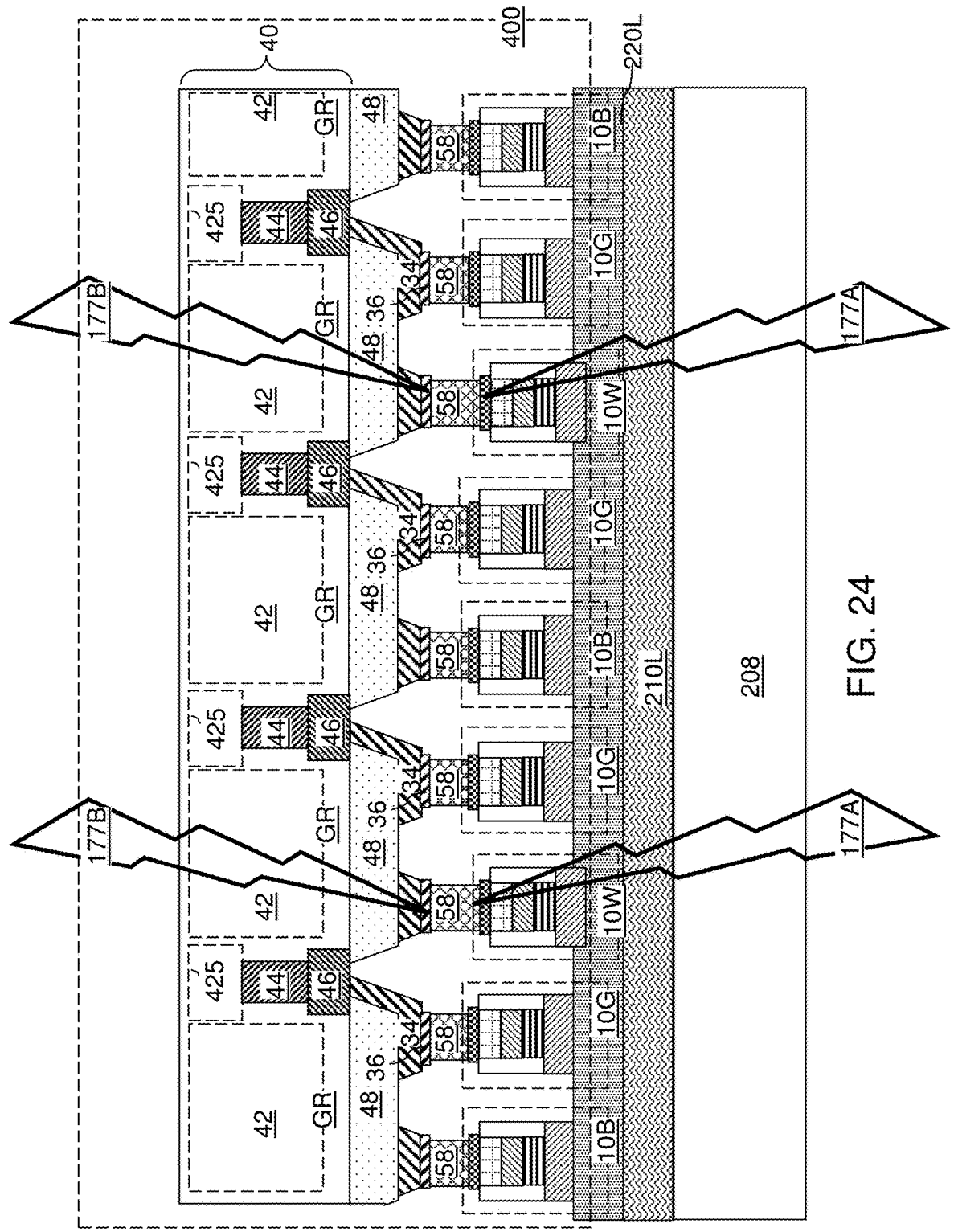
FIG. 24 illustrates the direct view device after bonding the repair LEDs according to an embodiment of the present disclosure.

Referring to FIG. 24, the repair LEDs 10W can be placed into a respective vacancy location 10V such that each source-side solder material portion 18 contacts a respective device-side solder material portion 38. Each repair LED 10W can be bonded to a respective vacancy location within the imperfect array of the direct view device 400. Specifically, a selective laser irradiation process can be performed to bond each repair LED 10W to a backplane-side bonding pad 36 that overlies a respective vacancy location. The selective laser irradiation process induces reflow of a solder material between a backplane-side bonding pad 36 and a respective repair LED 10W.

In one embodiment, a laser beam (177A or 177B) can irradiate at least one solder material portion (18, 38) to reflow the at least one solder material portion (18, 38) and to form a respective bonded solder material portion 58. In one embodiment, the laser beam 177A can pass through the second carrier substrate and through the first repair LEDs 10W to irradiate the at least one solder material portion (18, 38) and to reflow the at least one solder material portion (18, 38). In another embodiment, if the backplane substrate 42 is optically transparent, then the laser beam 177B can pass through the backplane to heat the at least one solder material portion (18, 38). The laser beam 177B of the heating laser can pass through the gap region GR of the substrate 42 to avoid collateral heating of metal interconnect structures (46, 44, 425) other than the irradiated metal plate 34, the irradiated backplane-side bonding pad 36, and the irradiated solder material portions (18, 38). In one embodiment, the heating laser may employ infrared wavelength. For example, the heating laser can be a visible or infra-red laser having a wavelength in a range from 0.4 micron to 20 microns, such as 1 to 2 microns, to avoid heating of the backplane 40, while heating the at least one solder material portion (18, 38). In another embodiment, both laser beams (177A, 177B) can be used to irradiate the at least one solder material portion (18, 38) either simultaneously or sequentially.

Figure 25:
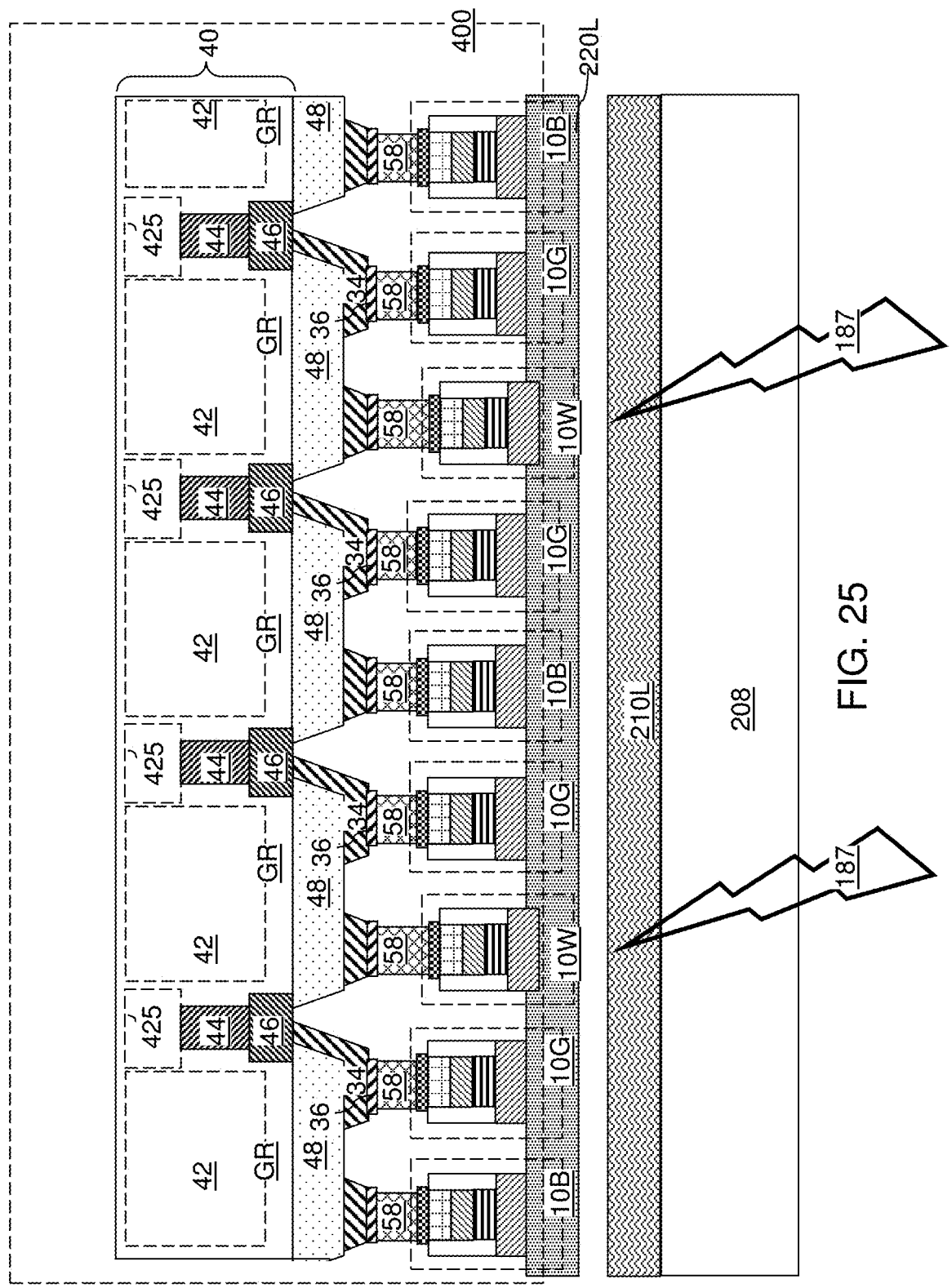
FIG. 25 illustrates the direct view device after detaching the second carrier substrate and the backside release layer according to an embodiment of the present disclosure.

Referring to FIG. 25, the backside release layer 210L can be irradiated through the second carrier substrate 208 by a laser beam 187, which is herein referred to as a release laser beam. The wavelength of the release laser beam can be, for example between 0.1 and 0.75 micron, such as 0.25 to 0.5 micron. In one embodiment, the wavelength of the release laser beam can be within an ultraviolet range, i.e., within a range from 10 nm to 400 nm. In one embodiment, the wavelength of the release laser beam can be in a range from 240 nm to 360 nm. The release laser beam can continuously scan the entire area of the backside release layer 210L. The backside release layer 210L and the second carrier substrate 208 are detached from the temporary bonding layer 220L upon irradiation by the release laser beam.

In another embodiment, the backside release layer 210L may be removed by dissolution in a solvent. The solvent may be an organic solvent such as acetone, isopropyl alcohol, methyl alcohol, ethyl alcohol, benzene, toluene, or chlorinated or fluorinated derivatives thereof, or an organic or inorganic etching compound. For example, the solvent may cause the backside release layer 210L to swell and become mechanically sheared off. In another embodiment, the backside release layer 210L comprises a photosensitive polymer, and removing the at least one LED to form at least one vacancy location within the light emitting device can be performed by a laser beam that passes through, and increases a dissolution rate in a solvent for a portion of the photosensitive polymer. In this case, irradiated portions of the photosensitive polymer can be removed at a higher dissolution rate, thereby accelerating the removal process for the backside release layer 210L.

In yet another embodiment, the backside release layer 210L may be a thermal or mechanical release layer. For example, the backside release layer 210L may be a thermal release layer which is dissolved by heating. The heating may be performed by a laser (as described above), a heat lamp or a furnace. Alternatively, the backside release layer 210L may be a mechanical release layer, such as an organic adhesive layer, which can be detached by applying a mechanical force (e.g., shear force and/or pulling force) thereto.

Figure 26:
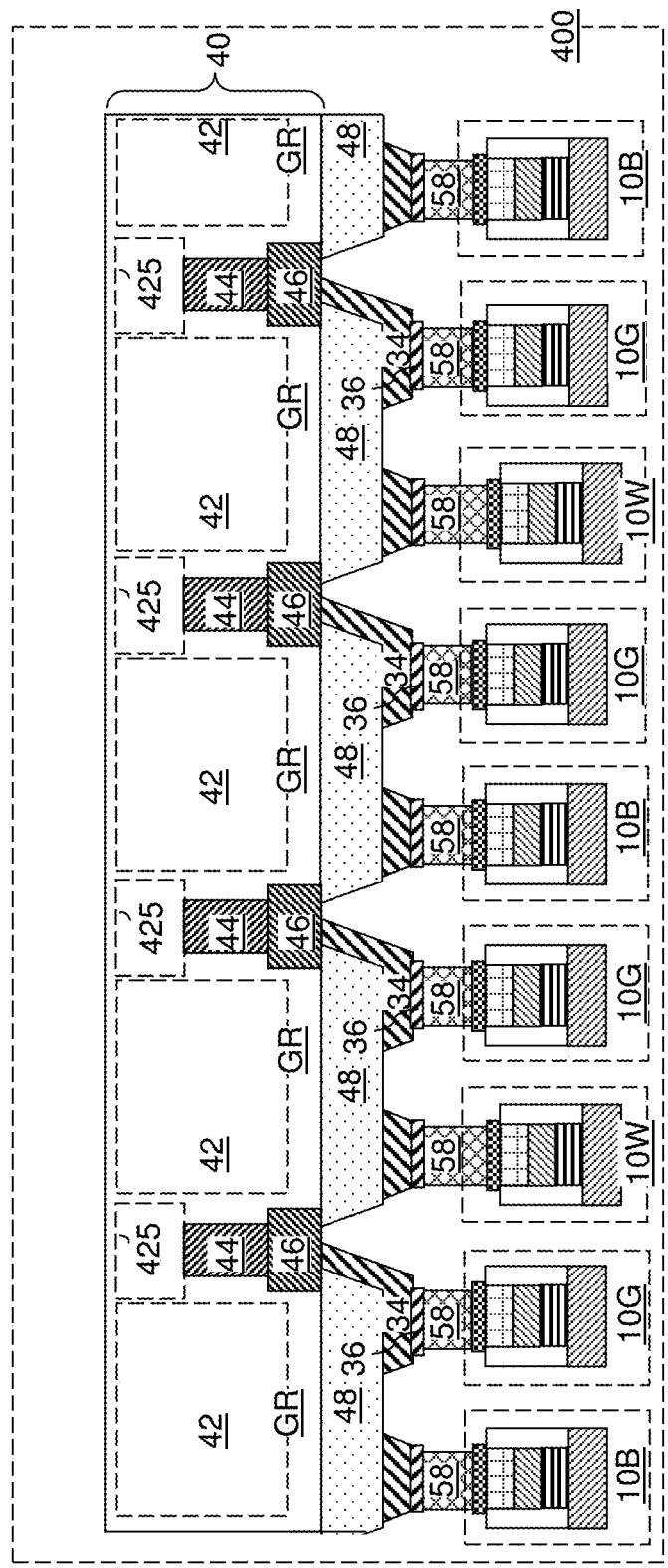
FIG. 26 illustrates the direct view device after removing the temporary bonding layer according to an embodiment of the present disclosure.

Referring to FIG. 26, the temporary bonding layer 220L can be subsequently removed from the repair LEDs 10W. For example, the temporary bonding layer 220L can be removed by dissolution in a solvent, or can be removed by a thermal treatment above the decomposition temperature. A suitable clean in a solvent may be performed to clean residues of the temporary bonding layer 220L. For example, an oxidizing plasma or an oxidizing solvent stripping process such as ozone plasma stripping, Piranha® solution, or RCA cleaning may be employed.

Figure 27:
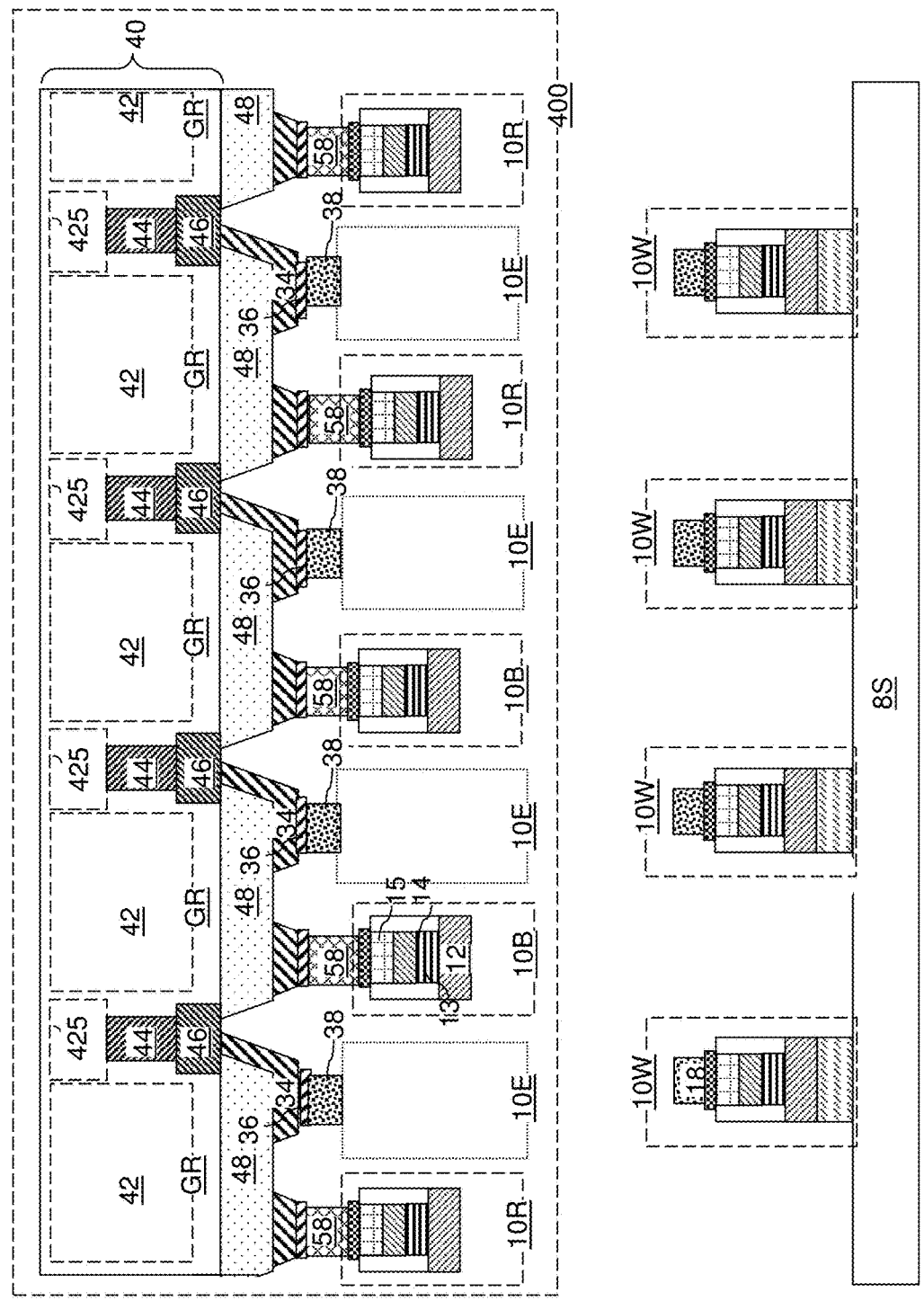
FIG. 27 illustrates an alternative method of repairing a direct view device, according to various embodiments of the present disclosure.

FIG. 27 illustrates an alternative method of repairing a light emitting device, according to various embodiments of the present disclosure. Referring to FIG. 27, a repair substrate 8S including repair LEDs 10W may be disposed adjacent to a light emitting device 400. The device 400 may be a direct view display device including empty sites 10E as shown in FIG. 2E. The repair LEDs 10W may be disposed in an array that mirrors the locations of the empty sites 10E.

The device 400 may be tested to identify defective pixels that include missing or defective LEDs, which may include any of LEDs 10B, 10G, or 10R. The repair substrate 8S may be moved into position with respect to the device, such that the repair LEDs 10W are respectively disposed in the empty sites 10E. The repair LEDs 10W may be attached to the empty sites 10E of the defective pixels of the device 400, using laser irradiation, as discussed with respect to FIG. 24. Accordingly, the repair LEDs 10W may be attached to the defective pixels to repair the defective pixels.

In some embodiments, the repair substrate 8S may be used to repair a second device 400. Accordingly, the repair substrate 8S may include an incomplete array of the repair LEDs 10W, since one or more of the LEDs 10W may have already been removed from the repair substrate 8S and attached to a display device. As such, it may not be possible to align the repair substrate 8S, such that all of the remaining repair LEDs 10W are aligned with the empty sites 10E of the defective pixels. Accordingly, in may be necessary to realign the repair substrate 8S with the device 400 multiple times during the attachment process, in order to position the remaining repair LEDs 10W in the empty sites 10E of all of the defective pixels.

In one embodiment, the light emitting device can comprise an array of LEDs without any vacancy locations upon transfer of the repair LEDs 10W thereto. In one embodiment, the light emitting device comprises an array of pixels that each at least three sub-pixels. The sub-pixels of each pixel include LEDs that emit light at different respective peak wavelengths. For example, at least 90%, at least 95%, at least 98%, or at least 99%, of the pixels may include three LEDs that respectively emit red, green, and blue light. However, in some embodiments, the pixels may each include four LEDs that respectively emit red, green, blue, and yellow light, for example. The remainder of the pixels may be repaired pixels including at least one of the repair LEDs 10W.

The repair LEDs 10W may be configured to emit white light in the device of the embodiment of FIG. 27 or in the device of the embodiment of FIGS. 15-26. In particular, it has been found that display devices that include pixels having missing or defective LEDs may be readily detected by the human eye. For example, pixels that include missing LEDs may appear as dark spots in a generated image. However, without wishing to be bound to a particular theory, it is believed that it is much more difficult for the human eye to detect a dim white light emitted among emission sources of other colors, at least in part because white light includes a combination of different visible wavelengths. Therefore, the repair LEDs 10W may be configured to emit white light (e.g., may be white LEDs) and may be used to repair pixels of a light emitting device having missing or defective LEDs of any color. Preferably, the repair LEDs 10W emit white light which is dimmer (i.e., which has a lower brightness) than the other color light (e.g., red, green and/or blue light)

emitting by the other LEDs 10R, 10G, 10B. The repair LEDs 10W have at least 25% lower brightness, such as 50% to 200% lower brightness than the other LEDs 10R, 10G, 10B.

Accordingly, the repair LEDs 10W are configured to emit white light and can be substituted for missing and/or defective LEDs of any color (LEDs 10R, 10G, 10B), by transferring repair LEDs 10W to a repair substrate at selected locations corresponding to the missing and/or defective LEDS. In the alternative, a substrate including an array of white repair LEDs 10W may be aligned with an array of empty sites (i.e., repair sites) 10E of a device substrate, and selected white repair LEDS 10W may be transferred to pixels that include missing and/or defective LEDs of any color. Therefore, a light emitting device may be repaired in a single process using only white repair LEDs 10W (i.e., without using separate repair processes using different color repair LEDs from separate transfer substrates).

In one embodiment, the repair LEDs 10W generate white light using a short-wavelength LED (e.g., a blue or UV LED) and one or more light conversion materials, such as phosphors, dyes, or the like. For example, a combination of a blue LED and a yellow phosphor configured to convert some of the blue light into yellow light produce a mixture of the remaining blue light and the yellow light which appears as white light. In another example, a UV LED may be used in combination with a white light emitting phosphor to emit white light.

In another embodiment of the present disclosure LEDs, such as repair LEDs 10W are configured to directly emit white light without the use of light conversion materials. The white LEDs that emit white light without using a conversion material may be used as repair LEDs 10W or for any other suitable function (e.g., as a white light source in a lighting fixture, etc.).

Figure 28B:
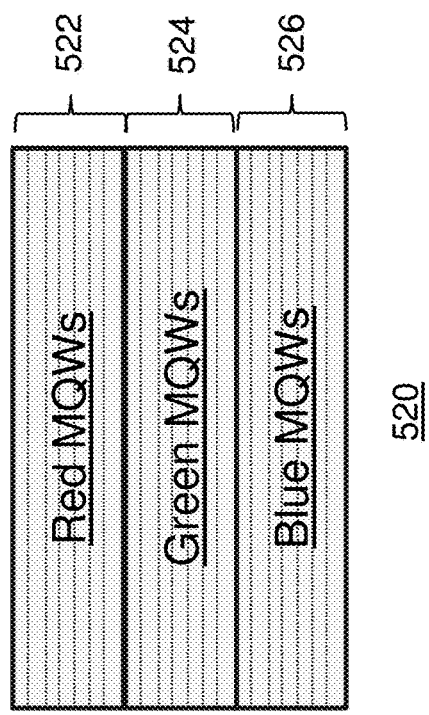
FIG. 28B is a schematic view of an active region that may be included in the repair LED of FIG. 28A.
Figure 28A:
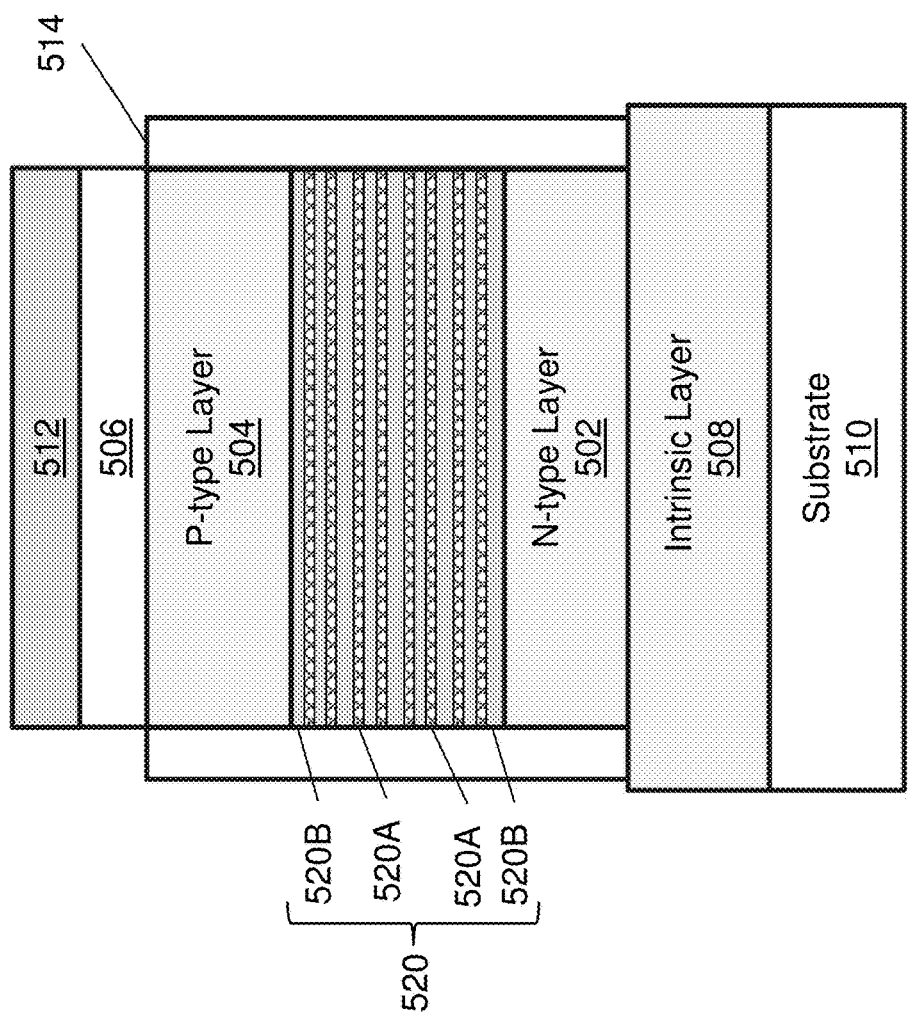
FIG. 28A is a schematic view of a repair LED, according to various embodiments of the present disclosure.

FIG. 28A is a schematic view of a repair LED 10W, according to various embodiments of the present disclosure, and FIG. 28B is a schematic view of an active region that may be included in the repair LED 10W. Referring to FIG. 28, the repair LED 10W may be configured to directly emit white light without the use of color conversion materials. For example, the repair LED 10W may include a vertical stack of an n-doped III-V compound material layer 502 (n-type layer), an active region 520, a p-doped III-V compound semiconductor layer 504 (p-type layer), and a conductive layer 506. The stack may be disposed on an undoped (e.g., intrinsic) III-V compound material layer 508 which may be formed on a substrate 510, such as a sapphire substrate. A conductive reflector layer 512 may optionally be formed over the conductive layer 506, in order to reflect light towards the substrate 510 and improve light extraction. An insulating material 514 may be disposed on sides of the stack.

In a non-limiting illustrative example, the n-type layer 502 may include n-doped gallium nitride (n-GaN) or indium gallium nitride (InGaN), the p-type layer 504 may include p-doped gallium nitride (p-GaN) or aluminum gallium nitride (AlGaN), the conductive layer 506 may include a transparent conductive oxide, such as indium tin oxide (ITO) or zinc oxide, layer 508 may include GaN, and the reflector layer 512 may include Au, Ag and/or Al.

Electrons emitted from N-layer 502 may combine with holes emitted from the P-layer 504 in the active region 520, resulting in light emission. Light may be emitted from the active region 520 in any direction, such as in vertical and/or horizontal directions. The active region 520 may include epitaxial layers having a multiple quantum well (MQW) structure. For example, the active region 520 may include quantum well (QW) layers 520A disposed between barrier layers 520B, with the barrier layers 520 having a higher bandgap than the QW layers 520A. For example, the QW layers 520A may comprise InGaN, such as $In_xGa_{1-x}N$, where $0<x<1$. The barrier layers 520B may comprise GaN or AlGaN, for example.

In some embodiments, the amount of indium included in the QW layers 520A may be controlled to control the emission wavelength of light emitted by the recombination of holes and electrons. For example, higher indium incorporation will yield a smaller band gap and thus longer wavelength of the emitted light. As used herein, the term "wavelength" refers to the peak emission wavelength of the LED. Accordingly, a relatively high indium content in the may result in QW layers 520A that emit red light (i.e., red QWs), a relatively low indium content may result in QW layers 520A that emit blue light (i.e., blue QWs), and an intermediate indium content may result in QW layers 520A that emit green light (i.e., green QWs).

As shown in FIG. 28B, the active region 520 may include a red emission region 522 including one or more red QW layers, a green emission region 524 including one or more green QW layers, and blue emission region 526 including one or more blue QW layers. The green emission region 524 may be disposed between the red and blue emission region 522, 526. The active region 520 may be configured to emit white light due to the combination of the red, green, and blue light emitted from the emission regions 522, 524, 526. The emission regions 522, 524, 526 may completely overlap one another with respect to the substrate 510.

The red emission region 522 may be disposed adjacent to the p-type layer 504, the blue emission region 526 may be disposed adjacent to the n-type layer 502, and the repair LED 10W may be configured to emit light through the substrate 510. However, in other embodiments, the emission regions 522, 524, 526 may be disposed in any arrangement. For example, the blue emission region 526 may be disposed adjacent to the p-type layer 504 and the red emission region 522 may be disposed adjacent to the n-type layer 502 if the blue emission region 526 has a higher efficiency than the red emission region 522 and/or if the reflector layer 512 is omitted and light is emitted through the conductive layer 506.

In other embodiments, the red, green, and blue QW layers may be sequentially or randomly disposed in the active region 520. In other words, the red, green, and blue QW layers may not be segregated into distinct regions in the active region 520.

In other embodiments, the QW layers 520A may be doped with impurities. For example, the QW layers 520A may be InGaN layers doped with deep level or shallow level dopants, such Zn, Mg, transition metals, or the like. The dopants are used to reduce the energy (i.e., increase the wavelength) of the light emitted from the LED 10W to less than the band gap energy of the QW layers 520A. Thus, green or red light may be emitted from QW layers 520A having a relatively low indium content and a band gap energy corresponding to energy of blue light. Thus, the impurity content of each of the QW layers 520A may be controlled such that the active region 520 emits white light, due to a combination of red, green, and blue light emitted from respective QW layers 520A.

In other embodiments, the active region 520 may include quantum dots (QDs) buried in the QW layers 520A. The QDs may be self-formed during a layer deposition process used to form the QW layers 520A. For example, the QDs may comprise indium gallium nitride, and the indium QD content in different QW layers 520A may be varied using an indium segregation process during deposition. Accordingly, the emission color of each of the QW layers 520A may be controlled, such that the active region emits white light, due to a combination of red, green, and blue light emitted from respective QW layer 520A, for example.

In various embodiments, the QDs emitting different color light may be located in the same QW layer or layers 520A. Accordingly, different areas of a single QW layer 520A may emit different colors of light. For example, one or more QW layers 520A may emit white light, due to mixing of the different colors emitted from different QDs in a single QW layer.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A light emitting diode (LED) array, comprising:
a carrier substrate;
an array of the red, green and blue LEDs positioned on the carrier substrate;
a plurality of white repair LEDs positioned on the carrier substrate in vacancy sites in the array of the red, green and blue LEDs,
wherein each of the white repair LEDs comprises:
a substrate;
n-doped compound semiconductor material layer disposed on the substrate,
a p-doped compound semiconductor material layer disposed on the substrate; and
an active region disposed between the n-doped and p-doped compound semiconductor layers, the active region comprising quantum wells configured to respectively emit at least one of red, green, or blue light,
wherein the white repair LED does not comprise a color conversion material.

2. A direct view display device comprising the carrier substrate and the white repair LED of claim 1, wherein the white repair LED is located in a vacancy site on the carrier substrate which comprises a backplane of the direct view display device.

3. The LED array of claim 1, wherein the active region comprises:
a red emission region comprising at least one quantum well configured to emit red light;
a blue emission region comprising at least one quantum well configured to emit blue light; and
a green emission region comprising at least one quantum well configured to emit green light.

4. The LED array of claim 3, wherein the red, green, and blue emission regions completely overlap one another with respect to a direction perpendicular to a plane of the substrate.

5. The LED array of claim 3, wherein the green emission region is disposed on the substrate between the red emission region and the blue emission region.

6. The LED array of claim 3, wherein:
the at least one quantum well of the red emission region comprises indium gallium nitride containing a first amount of indium;
the at least one quantum well of the green emission region comprises indium gallium nitride containing a second amount of indium;
the at least one quantum well of the blue emission region comprises indium gallium nitride containing a third amount of indium;
the first amount of indium is greater than the second amount of indium; and
the second amount of indium is greater than the third amount of indium.

7. The LED array of claim 6, wherein the indium is in the form of quantum dots.

8. The LED array of claim 7, wherein the quantum dots are formed by indium segregation.

9. The LED array of claim 5, wherein the at least one quantum well configured to emit red light contains a dopant.

* * * * *